US005679960A

United States Patent [19]

Akama

[11] Patent Number: 5,679,960

[45] Date of Patent: Oct. 21, 1997

[54] COMPACT DISPLAY DEVICE

[75] Inventor: Yoshiaki Akama, Yokohama, Japan

[73] Assignee: Kabushiki Kaisha Toshiba, Kawasaki, Japan

[21] Appl. No.: 296,927

[22] Filed: Aug. 31, 1994

[30] Foreign Application Priority Data

| | | | |
|---|---|---|---|
| Jan. 28, 1994 | [JP] | Japan | 6-008376 |
| Jul. 6, 1994 | [JP] | Japan | 6-154798 |

[51] Int. Cl.$^{6}$ .............................. H01L 29/80; H01J 1/46

[52] U.S. Cl. .............................. 257/10; 257/11; 257/618; 257/622; 257/773; 313/302; 313/303; 313/306; 313/307; 313/309

[58] Field of Search .............................. 257/10, 11, 618, 257/622, 773; 313/302, 303, 306, 307, 309, 310, 373, 336, 444, 446, 390

[56] References Cited

U.S. PATENT DOCUMENTS

| | | | |
|---|---|---|---|
| 4,574,216 | 3/1986 | Hoeberechts et al. | 257/10 |
| 5,389,796 | 2/1995 | Kang et al. | 313/306 |

FOREIGN PATENT DOCUMENTS

| | | |
|---|---|---|
| 0 332 469 | 9/1989 | European Pat. Off. . |
| 60-180040 | 9/1985 | Japan . |
| 63-13247 | 1/1988 | Japan . |
| 63 -237340 | 10/1988 | Japan . |
| 3 -196492 | 8/1991 | Japan . |
| 3-252025 | 11/1991 | Japan . |
| 4 -109539 | 4/1992 | Japan . |
| 4 -212236 | 8/1992 | Japan . |
| 4-355027 | 12/1992 | Japan . |
| 5-41152 | 2/1993 | Japan . |
| 5-94762 | 4/1993 | Japan . |
| 2 236 613 | 4/1991 | United Kingdom . |

OTHER PUBLICATIONS

Patent Abstracts of Japan, vol. 13, No. 534 (E-852), Nov. 29, 1989, JP-A-01 220341, Sep. 4, 1989.

Patent Abstracts of Japan, vol. 17, No. 257 (E-1368), May 20, 1993, JP-A-05 002999, Jan. 8, 1993.

Funji Itoh and Seigo Kanemaru, "Industrial Application of Charged Particle Beam", 111th Laboratory Material for 132nd Committee of Japan Society for the Promotion of Science (1990), pp. 7–13.

Optronics No. 109 (1991), pp. 193–198 by Junji Itoh and Seigo Kanemaru.

J. IEE Japan, vol. 112, No. 4 (1992), pp. 257–262 by Kuniyoshi Yokoh in Electrical Communication Laboratory of Tohoku University.

*Primary Examiner*—Carl W. Whitehead

*Attorney, Agent, or Firm*—Oblon, Spivak, McClelland, Maier & Neustadt, P.C.

[57] ABSTRACT

A device for emitting electrons, comprising a substrate, an insulating film formed on a surface of the substrate and having a recess, an emitter electrode formed on the insulating film and having an edge portion located at the recess, the edge portion of the emitter electrode being formed in the form of an arch within a plane perpendicular to the surface of the substrate so as to be sharpened toward a distal end of the emitter electrode, the edge portion of the emitter electrode being sharpened also in a planar direction parallel to the surface of the substrate toward the distal end of the emitter electrode so as to have a linear portion at the distal end, and the edge portion of the emitter electrode being adapted to emit electrons from the linear portion when an electric field is applied to the edge portion of the emitter electrode, and a gate electrode formed on the insulating structure and having an edge portion located at the recess and opposing the edge portion of the emitter electrode via a gap, the edge portion of the gate electrode being adapted to apply an electric field to the linear portion of the emitter electrode via the gap when a potential difference is given between the gate electrode and the emitter electrode.

32 Claims, 38 Drawing Sheets

COMPACT DISPLAY DEVICE

BACKGROUND OF THE INVENTION

1. Field of the Invention

The present invention relates to a microelectronic device for emitting electrons which uses a vacuum microelectronic technique and a method of manufacturing the same.

2. Description of the Related Art

Recently, the semiconductor micropatterning techniques have advanced remarkably. Patterning can be performed on the 0.5-μm level.

With such advances in semiconductor micropatterning techniques, very small vacuum tubes of micron sizes have recently been developed. The purpose of this development is to reconsider a vacuum as an electron transportation medium so as to develop an ultra-high-speed, environment-resistant electronic device (vacuum device for emitting electrons) which overcomes the drawbacks of vacuum tubes replaced by solid-state devices.

That is, the purpose is to integrate micron-sized electronic devices for emitting electrons on a substrate by freely using the micropatterning techniques.

Development of a cold cathode capable of efficiently and stably emitting electrons from a solid without thermal excitation is indispensable for realizing such an electronic device for emitting electrons.

Devices for emitting electrons, based on various principles, have been studied. Typical devices for emitting electrons include a device having an emitter electrode (field emitter) extending vertically from a substrate in the form of a quadrangular prism or cone (to be referred to as a Spint type device hereinafter) and a device having an emitter electrode extending in the planar direction of an electrode in the form of a triangular diving platform, i.e., a wedge (to be referred to as a plane type device hereinafter).

As disclosed in, for example, J. IEE Japan, Vol. 112, No. 4 (1992), pp. 257–262 (reference 1) by Kuniyoshi Yokoh in Electrical Communication Laboratory of Tohoku University, a Spint type device for emitting electrons is manufactured on the basis of a technique of obliquely depositing a cathode chip while rotating a substrate, which was developed by C. A. Spint et al. in Stanford Laboratory, or a technique of performing selective anisotropic etching of an Si single crystal, which was developed by H. F. Gray et al. in U.S. Navy Laboratory.

As disclosed in, for example, OPTRONICS No. 109 (1991), pp. 193–198 (reference 2) by Junji Itoh and Seigo Kanemaru, a plane type device for emitting electrons is manufactured in the following manner. First of all, a thin film (thickness: about 0.3 μm) consisting of tungsten (W) is deposited on an Si substrate by sputtering. A wedge-like emitter electrode and two other electrodes (gate and anode electrodes) are then formed by one exposure process and an RIE (Reactive Ion Etching) process. Finally, the Si substrate is etched by using buffer hydrofluoric acid (BHF).

Whether the development of such a device is significant depends on how much the operating voltage of the device can be decreased, as described in the above papers.

In order to decrease the operating voltage, it is required that the tip of an emitter electrode be sharpened, and the tip of the emitter electrode be brought as close to a gate electrode (extraction electrode) for extracting electrons from the emitter electrode as possible.

That is, in a device for emitting electrons, a larger emission current can be obtained with a lower driving voltage as the tip of an emitter electrode is sharpened and the distance between the emitter electrode and a gate electrode is reduced.

In the above plane type device, the precision of the shape of the tip of an emitter electrode depends on, for example, the resolution of a stepper for performing mask sputtering. Therefore, in order to increase the precision of the shape of the tip of the emitter electrode, the resolution of the stepper for performing mask patterning of the shape of the tip of the emitter electrode must be increased. However, such an increase in resolution is limited.

Recently, however, even in a plane type device, an emitter electrode can be sharpened in the direction of thickness of the electrode by performing selective isotropic etching of a conductive film. This technique is described in more detail in Junji Itoh and Seigo Kanemaru, "Industrial Application of Charged Particle Beam", 111th Laboratory Reference for 132nd Committee of Japan Society for the Promotion of Science (1990), pp. 7–13 (reference 3).

According to this method, first of all, a resist is coated on a 1-μm thick W thin film deposited on an $SiO_2$ substrate. One exposure process and an isotropic etching process using RIE are then performed to process an emitter electrode into a knife-edge shape in the direction of thickness of the electrode to be sharpened.

Various problems, however, are posed in the devices disclosed in the above references.

A Spint type device for emitting electrons, which is manufactured by the method typically disclosed in reference 1, has a quadrangular prism-like shape or conical shape. For this reason, the space between the devices for emitting electrons is limited by the size of a bottom surface, and it is difficult to increase the density of devices for emitting electrons. Since the magnitude of an emission current is affected by the number of emitters, it is difficult to increase the emission current per unit area.

In a device for emitting electrons, the tip of an emitter electrode must be sharpened to the highest degree to allow emission of a high emission current with a low driving voltage. In a plane type device, in order to emit a large emission current, an emitter electrode must be sharpened not only in the planar direction but also in the direction of thickness of the electrode.

According to the methods disclosed in references 2 and 3, however, in a device for emitting electrons, which includes a plane type emitter electrode and a gate electrode opposing the emitter electrode via a gap, the emitter electrode cannot be satisfactorily sharpened because the electrode is sharpened by an isotropic etching process (especially in the method disclosed in reference 3), although the thickness of the emitter electrode can be decreased in the direction of thickness of the electrode as the emitter electrode protrudes toward the gate electrode. Therefore, a large emission current cannot be obtained by the same driving voltage.

Furthermore, in the methods disclosed in references 2 and 3, the thickness of the emitter electrode can be reduced only in one of two directions substantially perpendicular to the protruding direction of the emitter electrode as the emitter electrode protrudes toward the gate electrode. With such a limited process, an increase in current density cannot be achieved.

SUMMARY OF THE INVENTION

It is an object of the present invention to provide a device for emitting electrons, in which an emitter electrode can be sharpened, and the gap between the emitter electrode and a gate electrode is reduced, thereby achieving a reduction in driving voltage.

According to the invention of the present application, there is provided a device for emitting electrons, comprising a substrate, an insulating structure formed on a surface of the substrate and having a recess, an emitter electrode insulated by the insulating structure from the surface of the substrate and having an edge portion located at the recess, the edge portion of the emitter electrode being formed in the form of an arch within a plane perpendicular to the surface of the substrate so as to be sharpened toward a distal end of the emitter electrode, the edge portion of the emitter electrode being sharpened also in a planar direction parallel to the surface of the substrate toward the distal end of the emitter electrode so as to have a linear portion at the distal end, and the edge portion of the emitter electrode being adapted to emit electrons from the linear portion when an electric field is applied to the edge portion of the emitter electrode, and a gate electrode insulated by the insulating structure from the one surface of the substrate and having an edge portion located at the recess and opposing the edge portion of the emitter electrode via a gap, the edge portion of the gate electrode being formed to surround the linear portion via a gap within a plane parallel to the surface of the substrate, and the edge of the gate electrode being adapted to apply an electric field to the linear portion of the emitter electrode via the gap when a potential difference is given between the gate electrode and the emitter electrode.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE PREFERRED EMBODIMENTS

The first to thirty-third embodiments of the present invention will be described below with reference to the accompanying drawings.

Figure 1A:
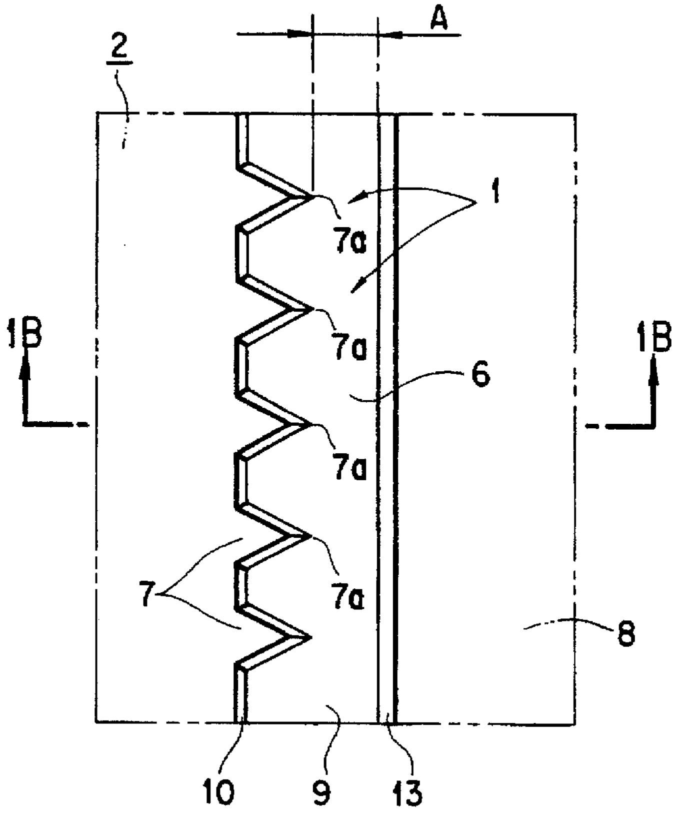
FIG. 1A is a plan view showing a device for emitting electrons according to the first embodiment of the present invention.

The first embodiment of the present invention will be described first with reference to FIGS. 1A to 5D, FIG. 1A is a plan view of an array 2 of devices for emitting electrons according to the first embodiment of the present invention. The array 2 is constituted by a plurality of devices 1 for emitting electrons, which are continuously formed in the planar direction. As shown in FIG. 1A, each device 1 includes an emitter electrode 7 having an edge portion 10 and a gate electrode 8 having an edge portion 13 opposing the emitter electrode 7. The edge portion 10 of the emitter electrode 7 is formed into a substantially wedge-like shape (substantially triangular shape) when viewed from above.

Figure 1B:
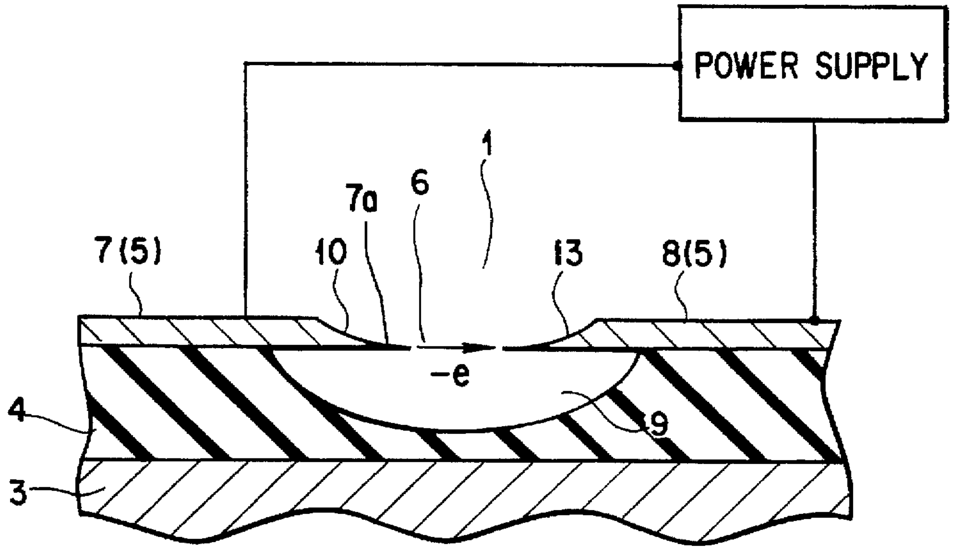
FIG. 1B is a sectional view taken along a line 1B—1B in FIG. 1A.

FIG. 1B is a longitudinal sectional view taken along a line 1B—1B of each device for emitting electrons in FIG. 1A. As shown in FIG. 1B, each device 1 has a three-layered structure. More specifically, an insulating film 4 (an insulating structure) consisting of an insulating material and a conductive film 5 consisting of a conductive material are sequentially stacked on the upper flat surface of a substrate 3. The conductive film 5 constitutes the emitter and gate electrodes 7 and 8 as indicated by the annotation 7 (5) and 8 (5) appearing in FIG. 1B and other figures of the drawings.

In general, Si, glass, or the like is used as a material for the substrate 3; $SiO_2$ or the like, for the insulating film 4; and a metal material such as tungsten, for the conductive film 5.

The conductive film 5 is separated into the emitter electrode 7 and the gate electrode 8 via a gap 6. As shown in FIG. 1B, the opposing edge portions 10 and 13 of the emitter and gate electrodes 7 and 8 have upper surface formed in the form of an arch to taper in the opposite directions. These formed surfaces will be referred to as arcuated surfaces hereinafter.

Figures 5A, 5B, 5C, 5D:
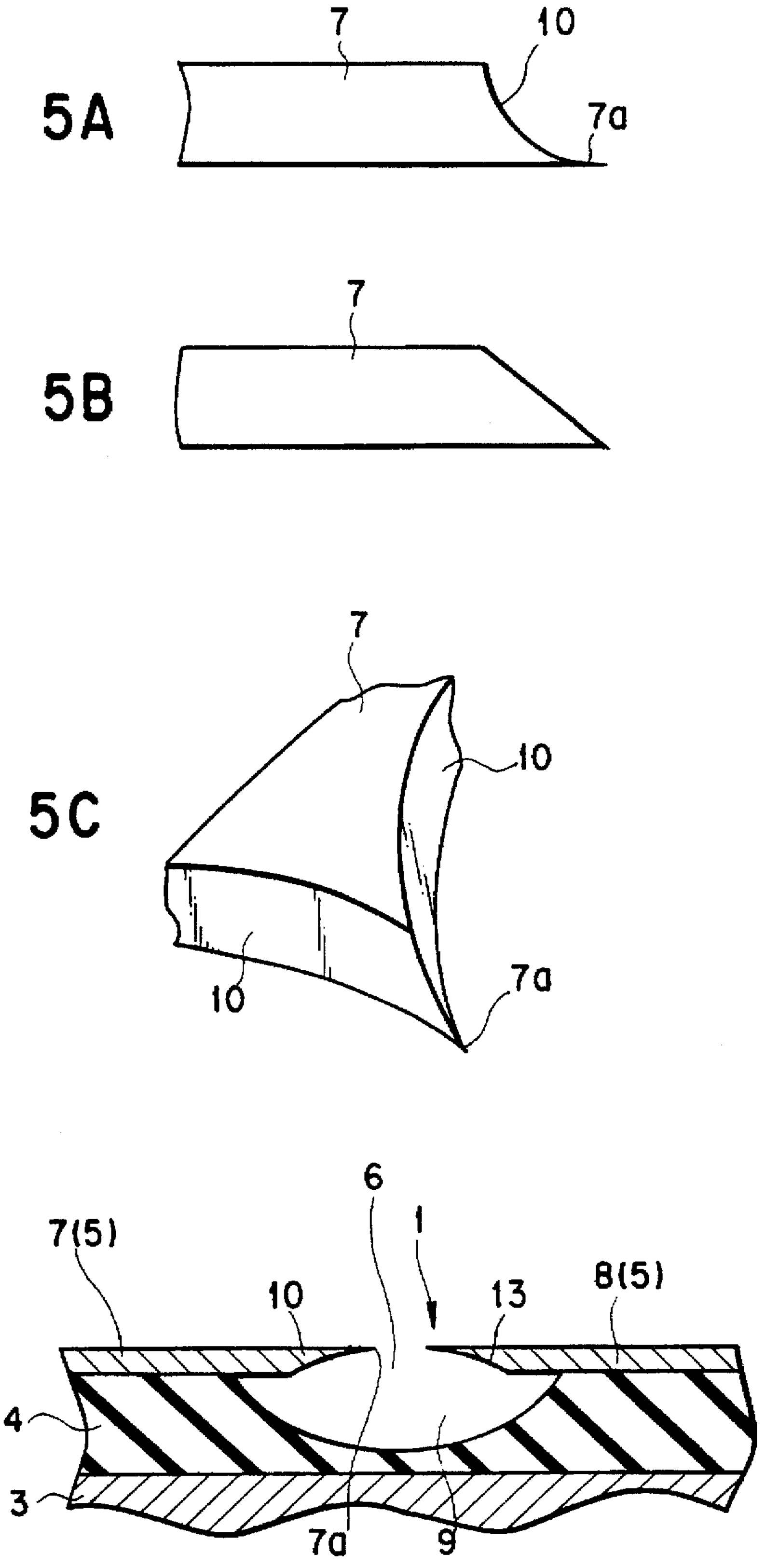
FIGS. 5A and 5B are enlarged views for explaining the sharpness of the edge of an emitter electrode.
FIG. 5C is an enlarged perspective view of an electron-emitting portion formed on the edge of the emitter electrode.
FIG. 5D is a longitudinal sectional view showing a modification of the first embodiment.

The edge portion 10 of the emitter electrode 7 is formed into a wedge-like portion to be sharped within a plane parallel to the upper surface of the substrate 3, as described above, and is also sharped in the direction of thickness owing to the arcuated surface. Therefore, as shown in FIG. 5C, the tip of the edge portion 10 of emitter electrode 7 is three-dimensionally sharped to become a fine needle-like (line-like) shape.

The sharpest needle-like portion (linear portion) of the edge portion 10 of the emitter electrode 7 will be referred to as an electron-emitting portion *7a* hereinafter.

As shown in FIG. 1B, a portion of the insulating film 4 is removed in the form of an arch in the direction of thickness to form a recess 9. The edge portions 10 and 13 of the emitter and gate electrodes 7 and 8 horizontally protrude into the recess 9.

The operation of this device 1 will be described next.

When negative and positive voltages are respectively applied to the emitter and gate electrodes 7 and 8 of the device 1 from a power supply indicated in FIG. 1B, an electric field is applied to the electron-emitting portion *7a* (the edge portion 10) of the emitter electrode 7. As a result, electrons (-e) are emitted from the electron-emitting portion *7a*.

As described in "Description of the Related Art", the current density based on electrons emitted from the emitter electrode 7 increases as the sharpness of the electron-emitting portion *7a* increases and a value A (indicated in FIG. 1A) of the gap 6 (distance) between the emitter electrode 7 and the gate electrode 8 decreases.

FIG. 1A shows the array 2 constituted by only one row of devices for emitting electrons to avoid a complicated illustration. In practice, however, such an array is constituted by a large number of rows of devices for emitting electrons.

A method of manufacturing the above devices 1 (the array of devices for emitting electrons) will be described next with reference to FIGS. 2A to 2H.

In the manufacturing method of this embodiment, a chemically amplified resist is used as a resist. As this chemically amplified for example, a chemically amplified resist disclosed in Proc. SPIE, Vol. 1262 (1990) by Maltabes, J. G, et at. (a combination of a chemical substance as poly[4-((tertbutyloxycarbonyl)oxy) styrene] and a substance as triphenylsulfonium hexafluoroantimonate) is used. When this resist is used, an insoluble layer is formed in the resist. The manufacturing method uses this phenomenon.

Figure 2A:
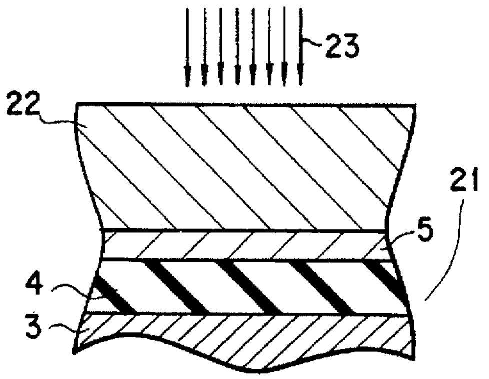
FIGS. 2A to 2H are sectional views showing a method of manufacturing the device of the first embodiment.

First of all, as shown in FIG. 2A, the insulating film 4 and the conductive film 5 are stacked on the upper flat surface of the substrate 3 to form an underlayer 21 (first step). A chemically amplified positive excimer resist 22 (chemically amplified resist) is coated on the underlayer 21 (third step).

Subsequently, an excimer laser beam (exposure beam) is radiated on the excimer resist 22 within a range denoted by reference numeral 22 in FIG. 2B to expose the excimer resist 22, thereby forming a pattern corresponding to the emitter electrode 7 and the gate electrode 8. In this case, a portion, of the excimer resist 22, which corresponds to the edge portion 10 of the emitter electrode 7 is exposed in the form of a wedge (fourth step).

When an excimer laser beam 23 is radiated on the excimer resist 22, an insoluble layer is formed in the resist 22. This embodiment uses this phenomenon. Note that this exposure operation is performed in an atmosphere containing an amine compound (e.g., $NH_3$). As an apparatus for performing an exposure operation, a stepper, a large-area exposure apparatus, an electron beam drawing apparatus, or the like is used. These conditions also apply to the following cases wherein similar exposure operations are performed in the second and subsequent embodiments.

The process of forming an insoluble layer by using this chemically amplified resist will be described next.

Figure 2B:
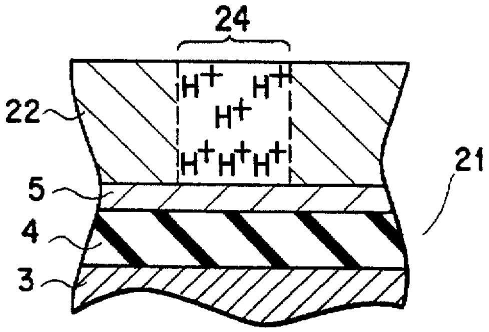

As shown in FIG. 2B, in the area 24, of the resist 22, which is irradiated with the excimer laser beam 23 (exposure step), acids ($H^+$, protons, and the like) are produced upon exposure.

When the area 24 in which the acids (protons and the like) are produced is left to stand for a while, the acids are deactivated by the amine compounds in the atmosphere. As a result, an insoluble layer which is hard to dissolve in a resist developing solution is produced.

Figure 2C:
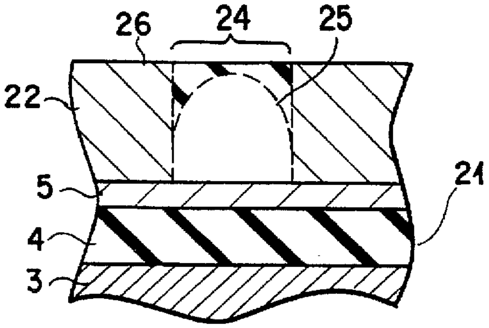

For this reason, as shown in FIG. 2C, a region (intermingling region) 25 in which a substance which is hard to dissolve in the resist developing solution and a soluble substance are intermingled with each other is formed in the area 24 irradiated with the excimer laser beam 23. This intermingling region 25 is mostly formed near an upper surface of the resist 22 and a marginal portion of the area 24.

Figure 2D:
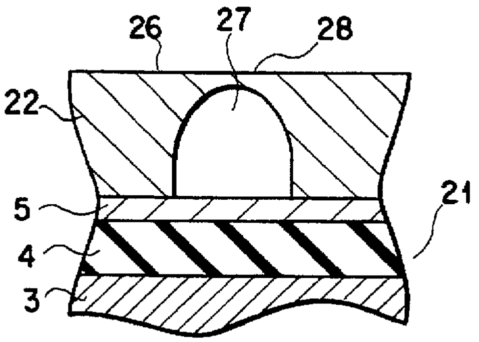

When the resist 22 is developed after this operation, most of the area 24 irradiated with the excimer laser beam 23 is removed. As a result, a groove denoted by reference numeral 27 in FIG. 2D is formed. The upper surface of the conductive film 5 is exposed to the groove 27.

Figure 2E:
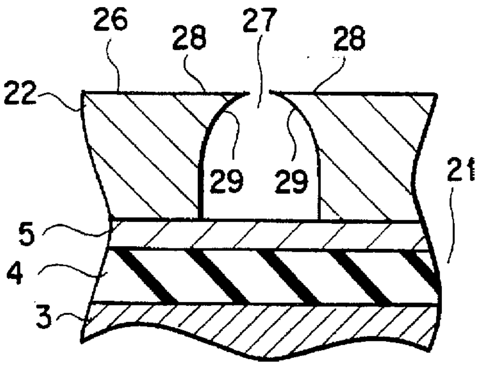

The intermingling region 25 influences the shape (side wall shape) of the resist 22 after development. As a result, as shown in FIGS. 2D and 2E, the irradiated area 24 is not completely removed from the resist 22, and an unexposed portion 28 is left in the resist 22.

The unexposed portion 28 protrudes in the direction of width of the groove 27 to cover the conductive film 5. The thickness of the unexposed portion 28 decreases as the unexposed portion 28 protrudes into the groove 27. That is, resist (groove 27) side wall angle decrease toward the upper surface of the resist 22, as shown in FIG. 2E, by reference numeral 29.

Figure 2F:
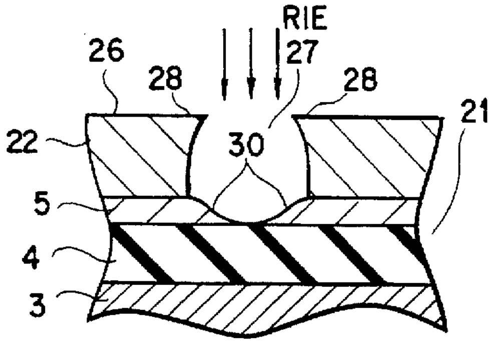
Figure 2G:
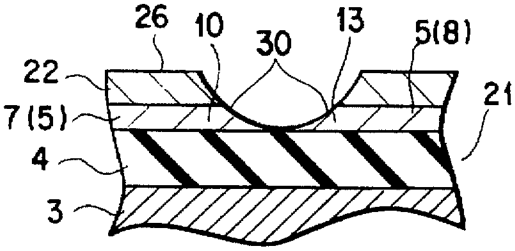

When anisotropic etching (e.g, RIE (Reactive Ion Etching)) is performed by using the resist 22 including the unexposed portion 28 as a mask, the conductive film 5 is influenced by the side wall shape of the above resist 22 to be etched in the manner shown in FIGS. 2F and 2G.

That is, the number of radicals supplied to the conductive film 5 is controlled by the unexposed portion 28 of the resist 22. For this reason, when the etching process is completed, an arcuated surface denoted by reference numeral 30 in FIG. 2G is formed on the conductive film 5.

Figure 2H:
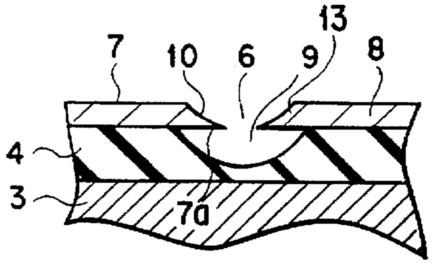

With this process the conductive film 5 is divided into the emitter electrode 7 having an edge portion 10 and the gate electrode 8 having an edge portion 15. As shown in FIG. 2H.

After the resist 22 is cleaned and removed, selective isotropic etching of the insulating film 4 is performed. As a result, the recess 9 is formed in the insulating film 4. As shown in FIG. 2H.

With above process, the edge portions 10 and 13 located at the recess 9 and sharped toward distal ends of emitter and gate electrodes 7 and 8 are formed on the emitter and gate electrodes 7 and 8. Note that the sharpest portion of the edge portion 10 of the emitter electrode 7 becomes the needle-like electron-emitting portion *7a*.

Note that the distance (the size of the gap 6) between the emitter electrode 7 and the gate electrode 8 is not dependent on the resolution in the exposure operation but is determined by the period of time during which the resist 22 is exposed to an atmosphere containing an amine compound and the time taken to perform anisotropic etching.

Figures 3A, 3B, 3C, 3D, 3E:
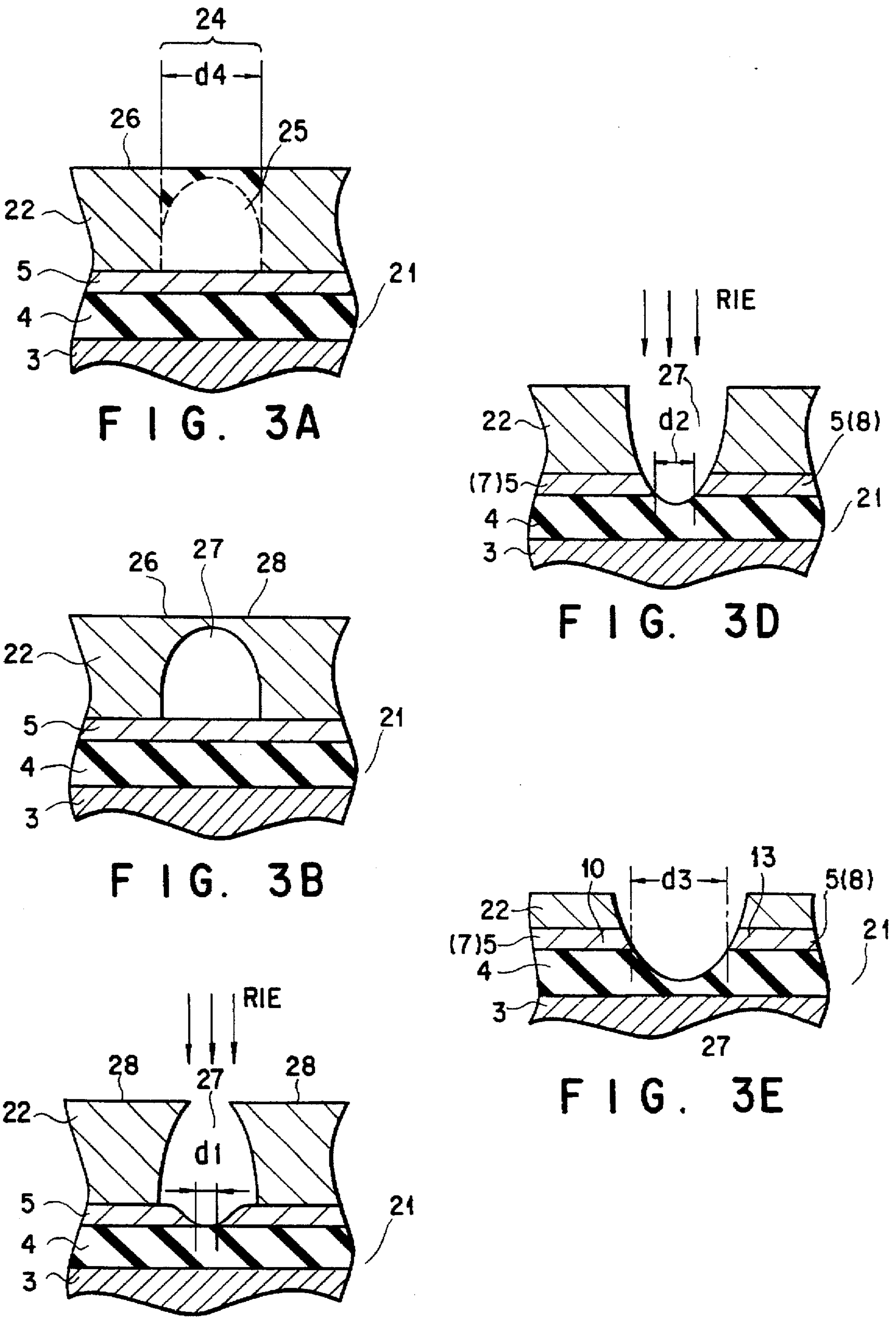
FIGS. 3A to 3E are sectional views showing a method of controlling the gap between an emitter electrode and a gate electrode.
Figure 4:
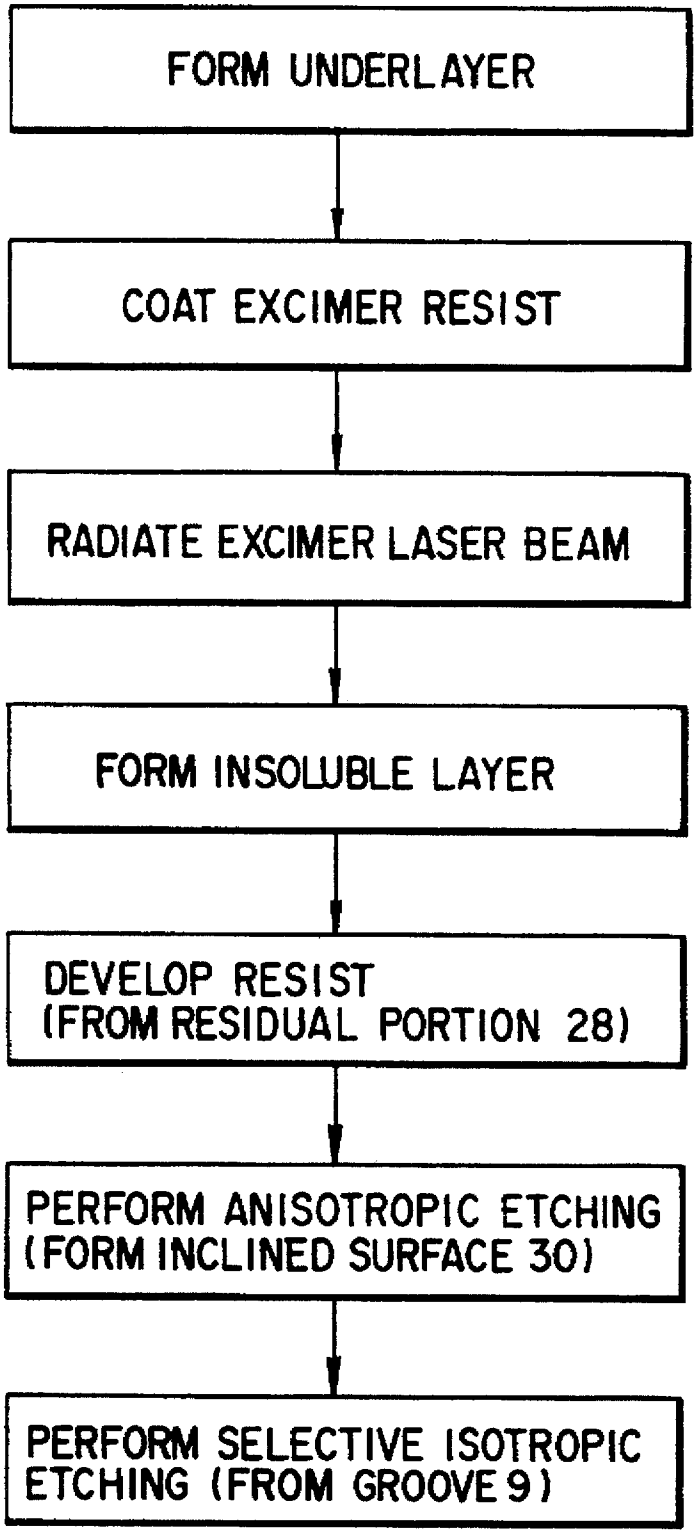
FIG. 4 is a flow chart showing the method of manufacturing the device of the first embodiment.

More specifically, even if the size (resolution of exposure) of an area 24 irradiated with the laser beam 23 (exposure beam) is set to be $d_4$, as shown in FIG. 3A, the shape (and volume) of the intermingling region 25 varies depending on the period of time during which the resist 22 is exposed to an atmosphere containing an amine compound. In addition, the shape of the intermingling region 25 determines the shape of the unexposed portion 28 of the resist 22 after development.

The shape of the unexposed portion 28 influences the etching rate of the conductive film 5, and the size of the gap 6 ($d_1$ to $d_3$) formed in the conductive film 5 gradually increases ($d_1<d_2<d_3$) with the progress of etching, as shown in FIGS. 3A to 3E. Therefore, the distances (gap size) $d_2$ and $d_3$ between the emitter electrode 7 and the gate electrode 8 can be controlled by controlling the overetching time. Furthermore, the distances $d_2$ and $d_3$ can be set to be smaller than a resolution $d_4$ of exposure.

In this embodiment, the excimer resist 22 is used and hence the excimer laser beam (to be referred to as a laser beam hereinafter) 23 is used. However, the present invention may use other types of lasers, if other types of resists corresponding to different wavelength bands are used, as long as the present invention uses the process of forming an insoluble layer by using a chemically amplified resist.

According to the above-described device for emitting electrons, the following effects can be obtained.

As described in the above description of the operation and in "Description of the Related Art", the current density based on electrons emitted from the emitter electrode 7 increases as the electron-emitting portion 7*a* formed on the edge portion 10 of the emitter electrode 7 is sharpened, and the value A of the gap 6 between the edge portion 10 (the electron-emitting portion 7*a*) of the emitter electrode 7 and edge portion 13 of the gate electrode 8 decreases, even if the voltages applied to the electrodes remain the same.

That is, as the electron-emitting portion 7*a* (edge portion 10) of the emitter electrode 7 is sharpened, and the size of the gap 6 decreases, the operating power to the device for emitting electrons can be reduced.

The sharpness of the electron-emitting portion 7*a* (edge portion 10) of the emitter electrode 7 will be described first. In the above device 1 of the present invention, the edge portion 10 of the emitter electrode 7 was sharpened into a wedge-like (triangular) shape within a plane parallel to a surface of the substrate 3, and the wedge-like edge portion 10 was formed in the form of an arch in a direction perpendicular to the surface of the substrate 3 so as to be sharpened, thereby successfully forming the fine, needle-like portion 7*a* (linear portion) on the distal end of the emitter electrode 7.

If the edge portion 10 of the emitter electrode 7 is formed in the form of an arch as shown in FIG. 5A, the thickness of the tip of the edge portion can be made very small as compared with a case wherein the edge portion is simply formed obliquely as shown in FIG. 5B. In addition, since the arcuated surface extends along the wedge-like edge portion 10 of the emitter electrode 7, the tip of the emitter electrode 7 can be made thin in both the direction of thickness and the planar direction to become a fine, needle-like shape, as shown in FIG. 5C.

Furthermore, this device 1 is manufactured by coating the excimer resist 22 on the conductive film 5, and using the process of forming an insoluble layer by using a chemically amplified positive excimer resist. With this manufacturing method, relatively easy formation of the arcuated surface can be realized without any complicated process.

According to such an arrangement, therefore, as compared with the prior art, an electric field can be easily concentrated on the electron-emitting portion 7*a* of the emitter electrode 7, and electrons can be emitted at a high density even with a low voltage. That is, the operating power can be reduced.

The distance (the size of the gap 6) between the electron-emitting portion 7*a* (edge portion 10) of the emitter electrode 7 and the edge portion 13 of the gate electrode 8 will be described next.

The distance (denoted by reference symbols $d_2$ and $d_3$ in FIGS. 3D and 3E) between the electron-emitting portion 7*a* of the emitter electrode 7 and the gate electrode 8 is dependent on the shape of the unexposed portion 28 of the resist 22 and the etching time. The shape of the unexposed portion 28 is determined by the period of time during which the resist 22 is exposed to an atmosphere containing an amine compound. Therefore, the distance between the emitter electrode 7 and the gate electrode 8 can be easily controlled by only controlling this period of time and the etching time.

The distance $d_2$ and $d_3$ (FIGS. 3D and 3E) between the emitter electrode 7 and the gate electrode 8 can be decreased regardless of whether the patterning resolution of a stepper is equal to the distance $d_4$ in FIG. 3A ($d_4>d_3>d_2$ in FIGS. 3A, 3C, and 3E).

According to this arrangement, the electron-emitting portion 7*a* (edge portion 10) of the emitter electrode 7 can be sharpened more, and the electron-emitting portion 7*a* can be brought closer to the edge portion 13 of the gate electrode 8. Therefore, a microelectronic, low-operating-power device for emitting electrons can be obtained.

In the first embodiment, the upper surface of the edge portion 10 of the emitter electrode 7 is formed to form the arcuated surface 10 and obtain the sharpened portion 7*a*. However, as shown in FIG. 5D, the lower surface of the edge portion 10 may be formed in the form of an arch to form a sharpened electron-emitting portion 7*a*.

A method of manufacturing a device for emitting electrons according to the second embodiment will be described next with reference to FIGS. 6A to 9C. Note that the shape of a device for emitting electrons which is manufactured by this manufacturing method is substantially the same as that of each of the devices for emitting electrons 1 (the array 2 of the devices for emitting electrons) of the first embodiment (FIGS. 1A and 1B). The same reference numerals in the second embodiment denote the same parts as in the first embodiment, and a description thereof will be omitted.

FIGS. 6A to 6F show the method of manufacturing a device 1 for emitting electrons.

Figure 6A:
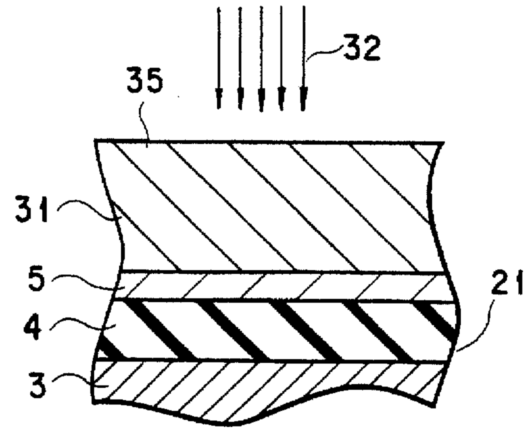
FIGS. 6A to 6F are sectional views showing a method of manufacturing a device for emitting electrons according to the second embodiment.

In this embodiment, first of all, an insulating film 4 and a conductive film 5 are stacked on the upper surface of a substrate 3 to form an underlayer 21. After a resist 31 is coated on the underlayer 21, the resist 31 is exposed by using a stepper to be patterned into a wedge-like shape corresponding to the shape of an emitter electrode 7, as shown in FIG. 6A.

Figure 6B:
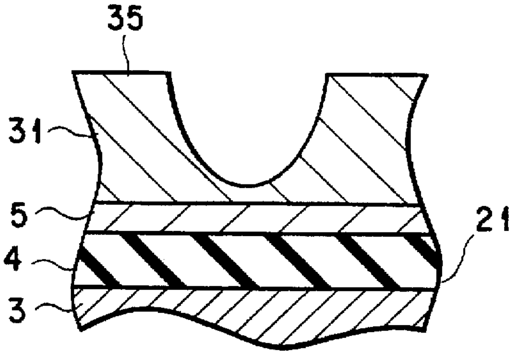
Figure 6C:
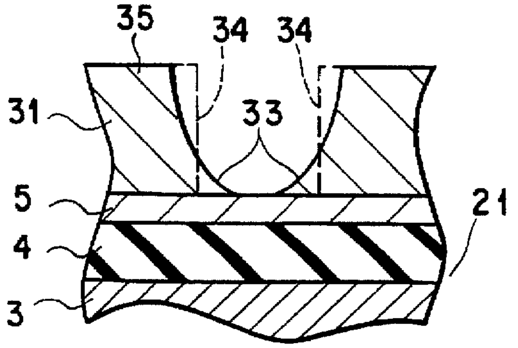

In this case, the focal point of an exposure laser beam 32 is not on the resist 31 (i.e, an in-focus state is not set), but is shifted above the resist 31. For this reason, unexposed portions 33 are formed in the resist 31, as shown in FIGS. 6B and 6C.

If the laser beam 32 is radiated on the resist 31 in an in-focus state, etching progresses in the radiating direction of the laser beam 32. As a result, as indicated by the dotted lines in FIG. 6C, side wall surfaces 34 which are almost perpendicular to the underlayer 21 are obtained.

If, as described above, the focal point of the laser beam 32 is shifted above the underlayer 21, the irradiated region of the resist 31 is partly left to form the unexposed portions 33. The unexposed portions 33 are inclined from an upper surface 35 to the underlayer 21 such that the distance between the side walls of resist 31 is gradually decreased.

Figure 9A:
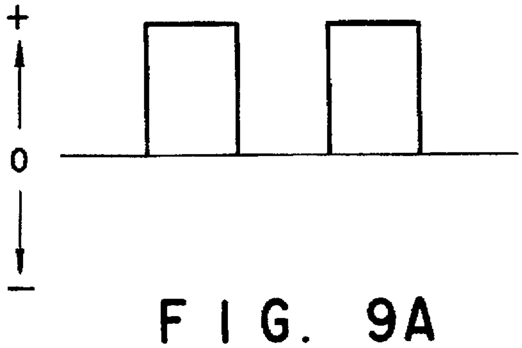
FIGS. 9A to 9C are graphs for explaining the relationship between the focal position of a laser beam and the shape of a resist.
Figure 9B:
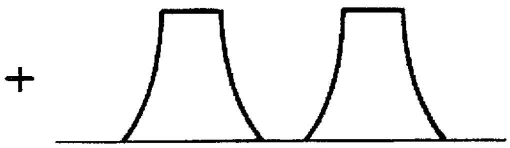
Figure 9C:
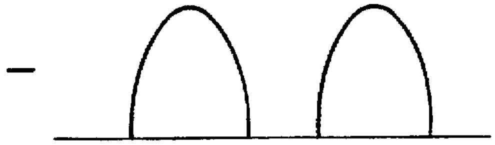

FIGS. 9A to 9C show the relationship between the focal point in an exposure operation and the shape of the resist 31. If exposure is performed in an in-focus state, the walls 34 of the resist 31 become flat, as shown in FIGS. 9A and 6C. If the focal point is shifted upward (to the positive side) in FIG. 6A, the wall surfaces of the resist 31 are recessed (FIG. 9B). If the focal point is shifted downward (to the negative side), the wall surfaces of the resist 31 expand (FIG. 9C).

In this embodiment, since the focal point is shifted to the positive side, the unexposed portions 33 having the above-described shape can be formed on the resist 31.

Figure 6D:
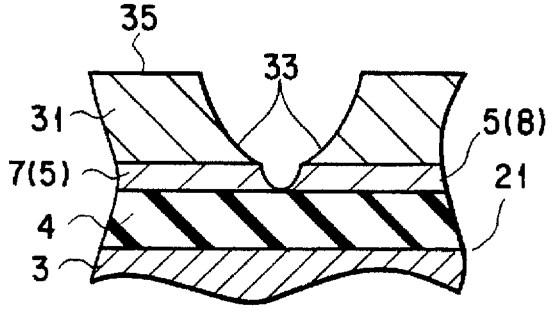
Figure 6E:
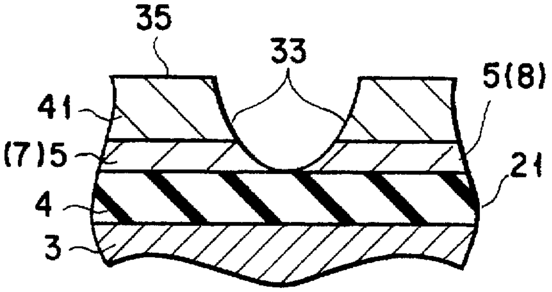

Subsequently, as shown in FIGS. 6D and 6E, anisotropic etching (e.g., RIE (Reactive Ion Etching)) of the conductive film 5 and the insulating film 4 is performed by using the resist 31 as an etching mask, similar to the first embodiment.

Figure 6F:
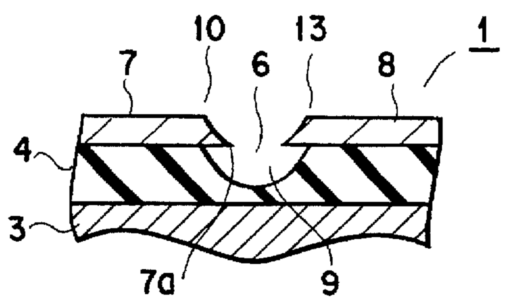

In this case, since the number of radicals in an etching gas supplied to the conductive film 5 is controlled, the upper surfaces of the edge portions 10 and 13 of the emitter and gate electrodes 7 and 8 is formed in the form of an arch to obtain the emitter electrode 7 and a gate electrode 8 which are sharpened in the direction of thickness, as shown in FIGS. 6E and 6F.

Figure 7A:
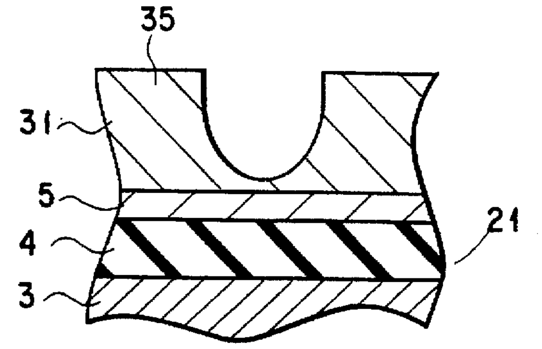
FIGS. 7A to 7C are sectional views showing a method of controlling the gap between-an emitter electrode and a gate electrode in the second embodiment.
Figure 7B:
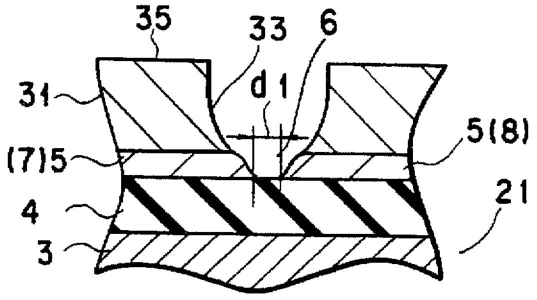
Figure 7C:
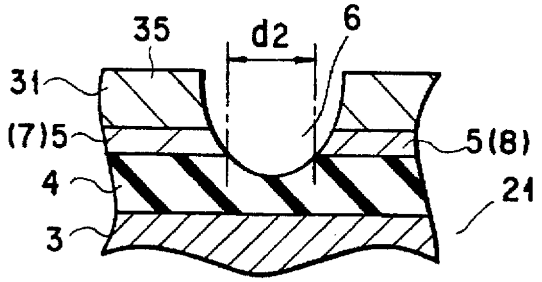
Figure 8:
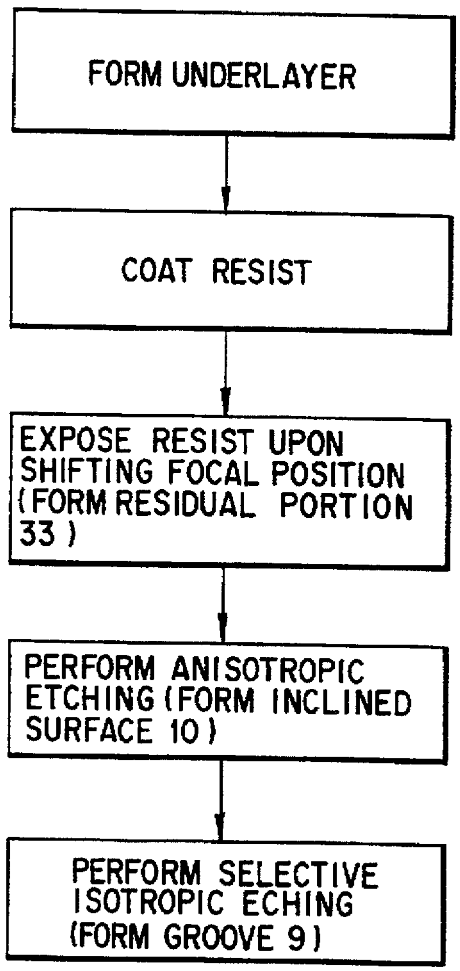
FIG. 8 is a flow chart showing the method of manufacturing the device of the second embodiment.

Similar to the first embodiment, the size of the gap 6 is controlled by the shape of the patterned resist 31 and the etching time. That is, the shape of the unexposed portions 33 of the resist 31 influences the etching rate of the conductive film 5. As shown in FIGS. 7A to 7C, the conductive film 5 is also etched gradually with the progress of etching of the resist 31. As a result, the size of the gap 6 gradually increases ($d_1<d_2$). The size of the gap 6 can be determined by controlling the anisotropic etching time.

According to the second embodiment, the following effects can be obtained.

According to the manufacturing method described above, similar to the first embodiment, the edge portion 10 of the emitter electrode 7 can be sharpened in both the direction (direction of thickness) perpendicular to the upper surface of the substrate 3 and the direction (planar direction) parallel to the upper surface of the substrate 3, thereby obtaining a low-operating-power device for emitting electrons.

In addition, the emitter electrode 7 (and the gate electrode 8) can be sharpened without using the process of forming an insoluble layer.

Furthermore, similar to the first embodiment, the gap between the edge portion 10 of the emitter electrode 7 and the edge portion 13 of the gate electrode 8 can be easily controlled, and the edge portion 10 of the emitter electrode 7 can be brought close to the edge portion 13 of the gate electrode 8 regardless of the patterning resolution of the stepper.

The third embodiment will be described next with reference to FIGS. 10A to 12. The same reference numerals in the third embodiment denote the same parts as in the above embodiments, and a description thereof will be omitted.

Figure 10A:
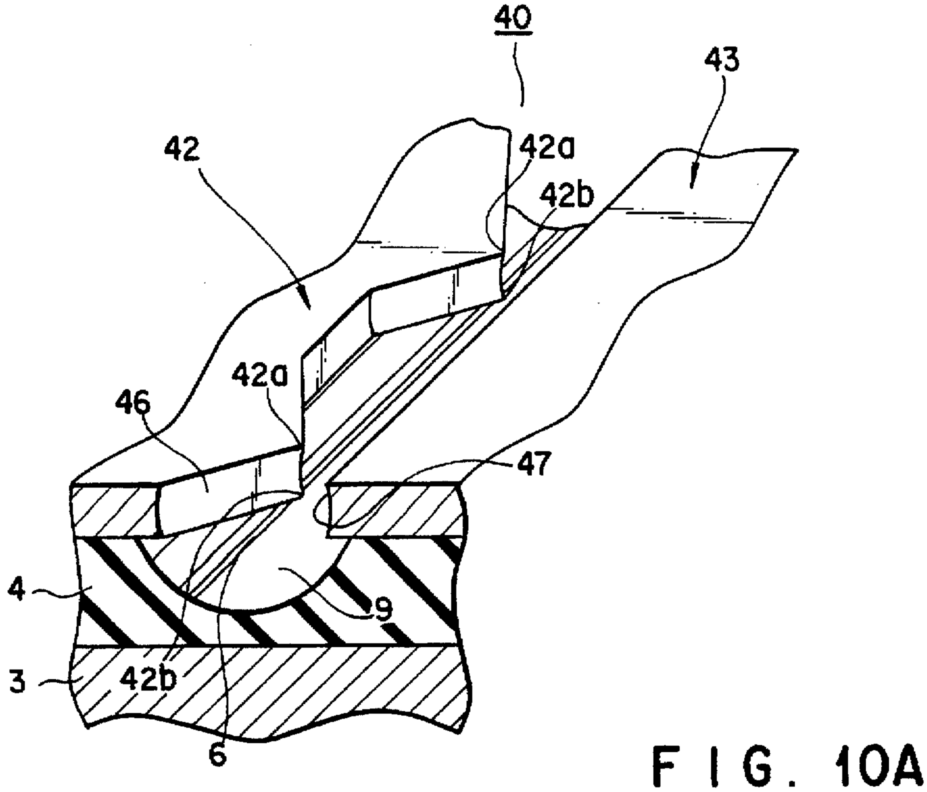
FIG. 10A is a perspective view showing a device for emitting electrons according to the third embodiment.
Figure 10B:
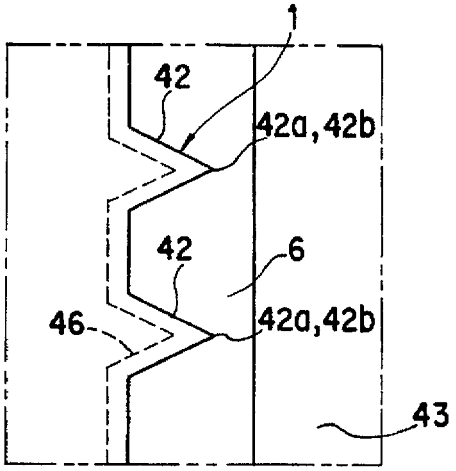
FIG. 10B is a plan view showing the device of the third embodiment.

FIG. 10A shows a device 40 for emitting electrons according to this embodiment. The edge portions 46 and 47 of emitter and gate electrodes 42 and 43 of the device 40 which locate at the recess are formed in the form of an arch, carving away from the distal ends of the emitter and gate electrodes 42 and 43, thereby forming arcuated surfaces.

As shown in FIG. 10A, the edge portion 46 of the emitter electrode 42 is also sharpened within a plane parallel to the upper surface of the substrate 3. That is, needle-like electron-emitting portions 42*a* and 42*b* are respectively formed on the upper and lower surface sides of each emitter electrode 42.

This device 40 is manufactured in a manner shown in FIGS. 11A to 11D and 12.

Figure 11A:
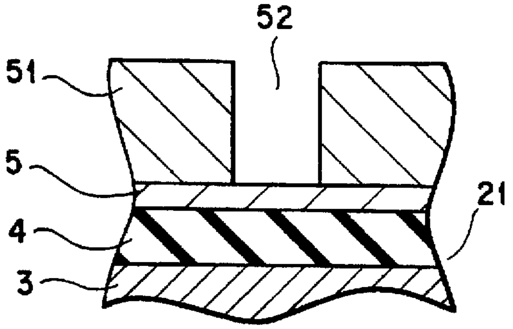
FIGS. 11A to 11D are sectional views showing a method of manufacturing the device of the third embodiment.

First of all, as shown in FIG. 11A, an insulating film 4 and a conductive film 5 are stacked on the upper surface of a substrate 3 to form an underlayer 21. After a resist 51 is coated on the conductive film 5, the resist 51 is exposed by using a stepper, thereby patterning the resist 51. With this process, a groove 52 is formed.

Figure 11C:
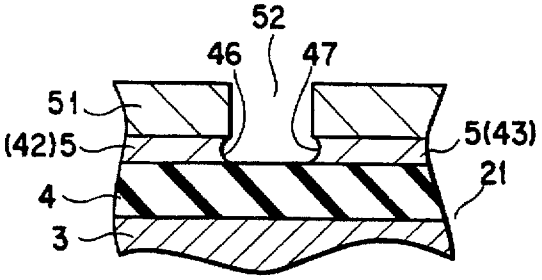
Figure 11B:
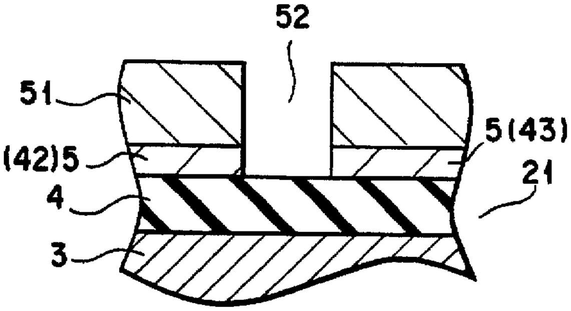

After anisotropic etching (e.g., RIE) of the conductive film 5 is performed via the groove 52, as shown in FIG. 11B, isotropic etching (e.g., chemical dry etching or wet etching) is performed, as shown in FIG. 11C, thereby forming the edge portions 46 and 47 having the arcuated surfaces respectively.

Figure 11D:
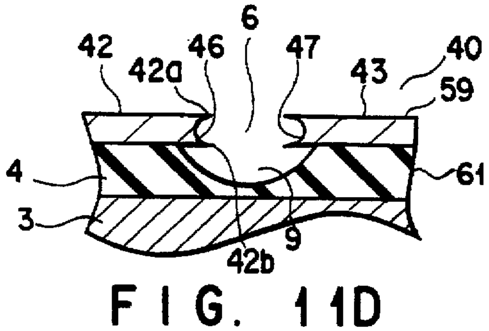
Figure 12:
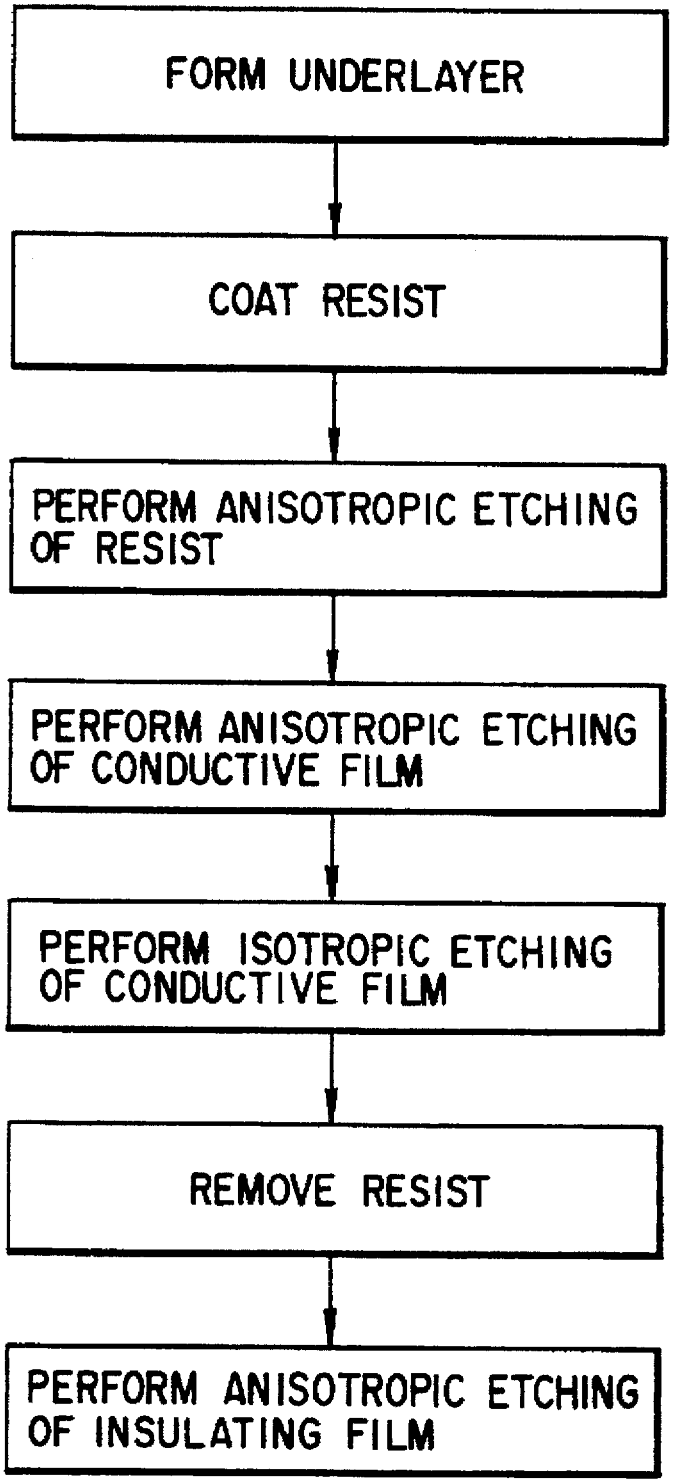
FIG. 12 is a flow chart showing the method of manufacturing the device of the third embodiment.

After resist 51 is removed, isotropic etching (e.g., chemical dry etching or wet etching) of the insulating film 4 is performed to form a recess 9, as shown in FIG. 11D.

According to the third embodiment, the following effects can be obtained.

According to the above device 40, substantially the same effects as those of the first embodiment can be obtained.

Furthermore, in this embodiment, the sharpened electron-emitting portions 42*a* and 42*b* are formed on the edge portion 46 of the emitter electrode 42 on both the upper and lower surface sides. That is, the electron-emitting portions 42*a* and 42*b* are formed at a higher density than the corresponding portions in the first embodiment.

If the same potentials as those in the first embodiment are applied to the emitter and gage electrodes 42 and 43, each of the electron-emitting portions 42*a* and 42*b* emits electrons at the same density as that of electrons emitted from the equivalent portion (7*a*) of the first embodiment. If, therefore, the size of the device of this embodiment is the same as that of the first embodiment, a current value (emission current value) substantially twice that obtained by the device of the first embodiment can be obtained.

In addition, according to this arrangement, the emitter electrode 42 (and the gate electrode 43) can be sharpened without using the process of forming an insoluble layer and the exposure method of shifting the focal point of an exposure beam. Therefore, electrodes can be easily formed.

The fourth embodiment of the present invention will be described next.

Figure 13:
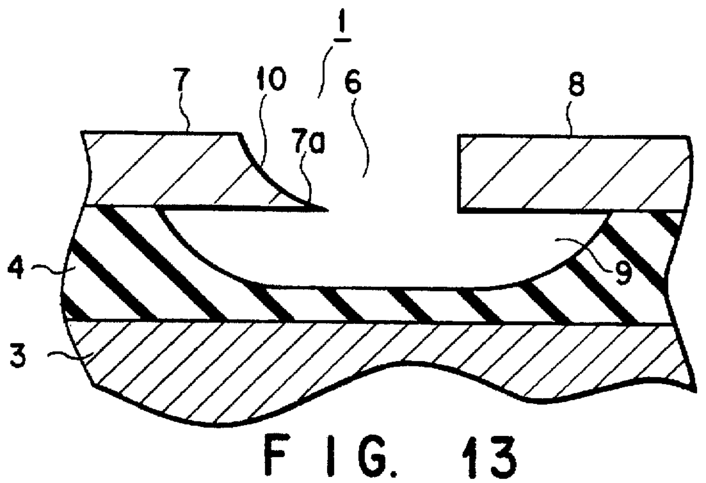
FIG. 13 is a longitudinal sectional view showing a device for emitting electrons according to the fourth embodiment.

FIG. 13 shows a device for emitting electrons according to this embodiment. Similar to the first embodiment, the edge portion 10 of an emitter electrode 7 of this device for emitting electrons is sharpened to form an electron-emitting portion 7*a*. However, the distal end face of the edge portion of a gate electrode 8 is not sharpened but is a flat face almost perpendicular to the upper surface of the substrate 3.

A device having such a shape may be formed by either the method shown in FIGS. 14A to 14I or the method shown in FIGS. 15A to 15I, both of which are based on combinations of the manufacturing methods of the first to third embodiments.

These methods will be described in detail below. In this case, the method shown in FIGS. 14A to 14I is considered as a method of manufacturing a device for emitting electrons according to the fourth embodiment, whereas the method shown in FIGS. 15A to 15I is considered as a manufacturing method according to the fifth embodiment. The same reference numerals in these embodiments denote the same parts as in the previous embodiments, and a detailed description thereof will be omitted.

Figure 14A:
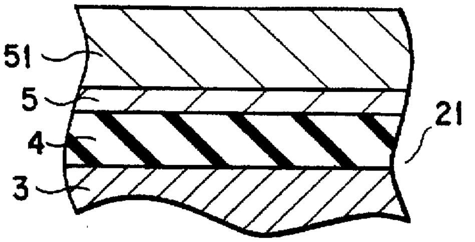
FIGS. 14A to 14I are sectional views showing a method of manufacturing the device of the fourth embodiment.
Figure 14D:
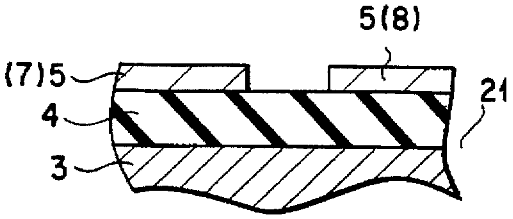
Figure 14B:
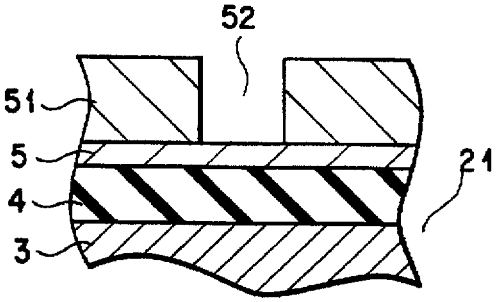

In the fourth embodiment, as shown in FIG. 14A, first of all, an insulating film 4 and a conductive film 5 are stacked on the upper surface of a substrate 3 to form an underlayer 21. As shown in FIG. 14B, after a resist 51 is coated on the conductive film 5, the resist 51 is patterned into a wedge-like shape (shown in FIG. 1A) corresponding to the emitter electrode 7, thereby forming a groove 52.

Figure 14E:
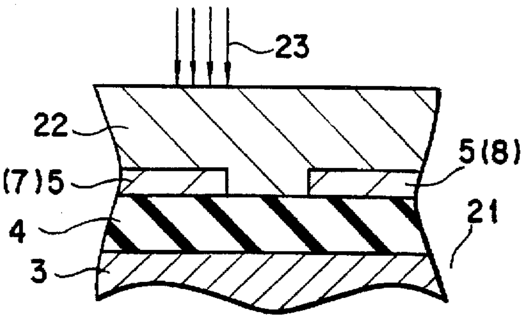
Figure 14C:
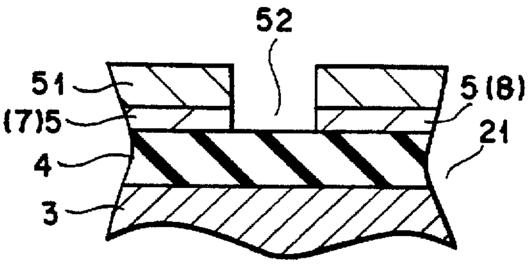

Anisotropic etching is performed by using the resist 51 as a mask to etch the conductive film 5 according to the same pattern as that of the groove 52, as shown in FIG. 14C. As a result, the conductive film 5 is separated in a direction parallel to the upper surface of the substrate 3 to form the emitter electrode 7 and the gate electrode 8. At this time, both the distal end faces of the edge portions of the emitter and gate electrodes 7 and 8 are flat faces perpendicular to the upper surface of the substrate 3.

The steps shown in FIGS. 14E to 14I are performed to sharpen only the edge portion of the emitter electrode 7 without sharpening the edge portion of the gate electrode 8.

Figure 14F:
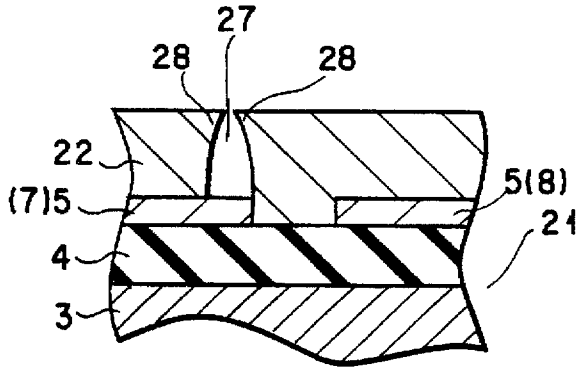

As shown in FIG. 14E, an excimer chemically amplified resist denoted by reference numeral 22 is coated on the conductive film 5 emitter and gate electrodes 7 and 8. Thereafter, an excimer laser beam denoted by reference numeral 23 in FIG. 14E is radiated on the excimer resist 22 with the radiating position of the beam being shifted to the emitter electrode 7 side. With this operation, as shown in FIG. 14F, the process of forming an insoluble layer by using a chemically amplified positive excimer resist, which is described in the first embodiment, is performed.

Figure 14G:
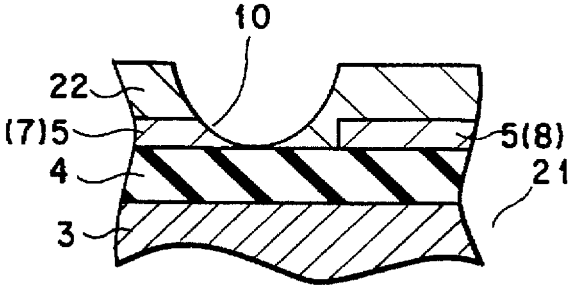

As shown in FIG. 14G, isotropic etching is performed by using the excimer resist 22 as a mask. In this step, the progress of etching is limited by unexposed portions 28 shown in FIG. 14F, and the edge portion 10 of the emitter electrode 7 is cut, from the upper surface side, in the form of an arch to form an arcuated surface, thereby forming a sharpened electron-emitting portion 7*a*. Note that in this step, the edge portion of the gate electrode 8 is not etched.

Figure 14H:
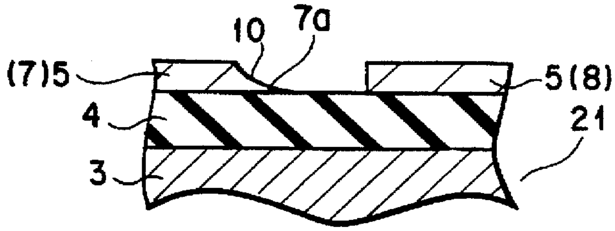
Figure 14I:
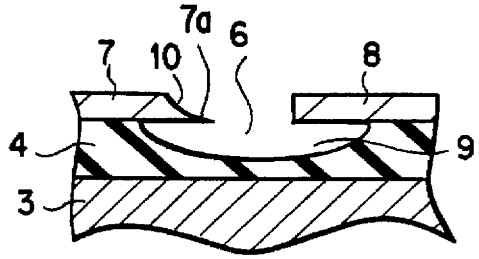

Finally, the resist 22 is removed, as shown in FIG. 14H, and the insulating film 4 is etched selectively by isotropic etching, thereby forming a recess 9. With this process, a device for emitting electrons is manufactured, in which the sharpened edge portion 10 of the emitter electrode 7 and the edge portion of the gate electrode 8 locate at the recess 9. Note that the distal end face of the edge portion of the gate electrode 8 is a flat face almost perpendicular to the upper surface of the substrate 3.

Figure 15A:
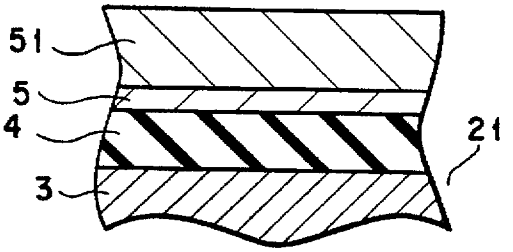
FIGS. 15A to 15I are sectional views showing the method of manufacturing the device of the fourth embodiment.
Figure 15B:
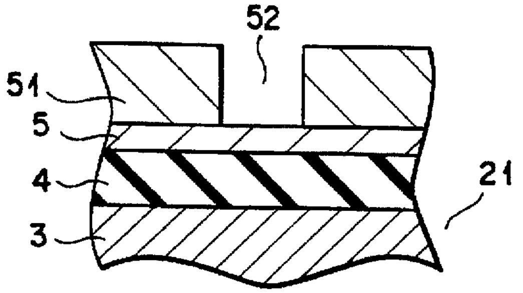
Figure 15C:
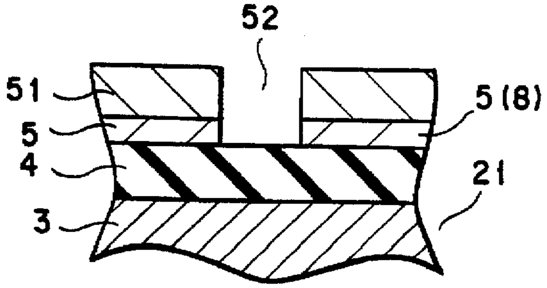
Figure 15D:
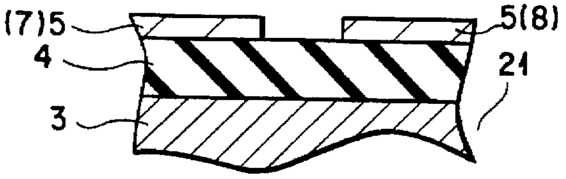

The fifth embodiment shown in FIGS. 15A to 15I will be described next. As shown in FIGS. 15A to 15D, first of all, a resist 51 is coated on an underlayer 21 formed by stacking an insulating film 4 and a conductive film 5 on the upper surface of a substrate 3. After the resist 51 is patterned into a wedge-like shape corresponding to an emitter electrode 7 to form a groove 52. With this process, as shown in FIG. 15D, the distal end faces of a gate electrode 8 and the emitter electrode 7 become flat faces perpendicular to the substrate 3.

Figure 15E:
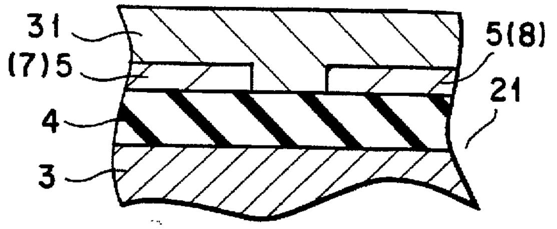
Figure 15F:
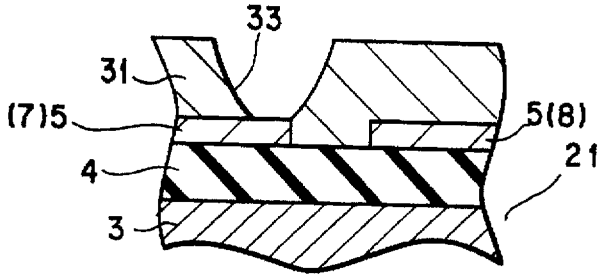
Figure 15G:
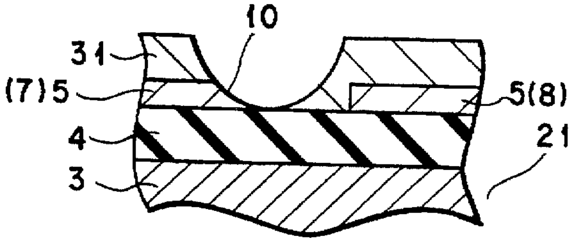

After a resist 31 is coated on the conductive film 5 (the gate electrode 8 and the emitter electrode 7), as shown in FIG. 15E, etching is performed in a manner shown in FIGS. 15F and 15G. In this case, the radiating position in an exposure operation using a stepper or the like is shifted to the emitter electrode 7 side (the left side in FIGS. 15A to 15I) so as not to etch the edge portion of the gate electrode 8.

Overlap exposure (FIG. 15F) is performed by using the method of adjusting the focal point in an exposure operation (to the positive side in this case), which is described in the second embodiment, so as to form unexposed portions 33 in the resist 31. In addition, as shown in FIG. 15G, anisotropic etching is performed by using the resist 31 as an etching mask. With this process, the number of radicals in an etching gas supplied is controlled by the unexposed portions 33 of the resist 31. As a result, only the edge portion 10 of the emitter electrode 7 is sharpened toward the distal end of this electrode 7.

Figure 15H:
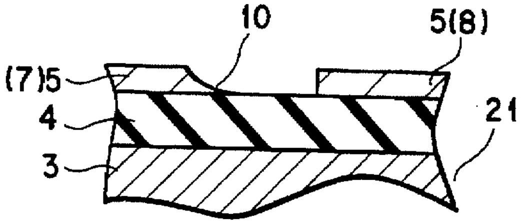
Figure 15I:
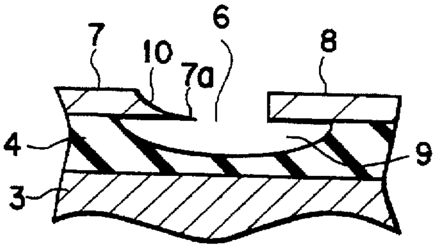

Finally, the resist 31 is removed, as shown in FIG. 15H, and the insulating film 4 is selectively etched by isotropic etching, as shown in FIG. 15I, thereby forming the recess 9. With this process, a device for emitting electrons is manufactured, which includes the emitter electrode 7 having the electron-emitting portion 7*a* (edge) caused to protrude into the recess 9, and the gate electrode 8 opposing the emitter electrode 7.

According to the fourth and fifth embodiments, the following effects can be obtained.

In the fourth and fifth embodiments, the distal end face of the edge portion of the gate electrode 8 can be formed into a surface substantially perpendicular to the substrate 3. Since the area of the gate electrode 8 which opposes the electron-emitting portion 7*a* of the emitter electrode 7 can be made larger than that in each of the first to third embodiments, a larger electric field can be applied to the emitter electrode 7. Therefore, a large emission current can be obtained with a lower driving voltage.

The sixth embodiment will be described next.

Figure 16:
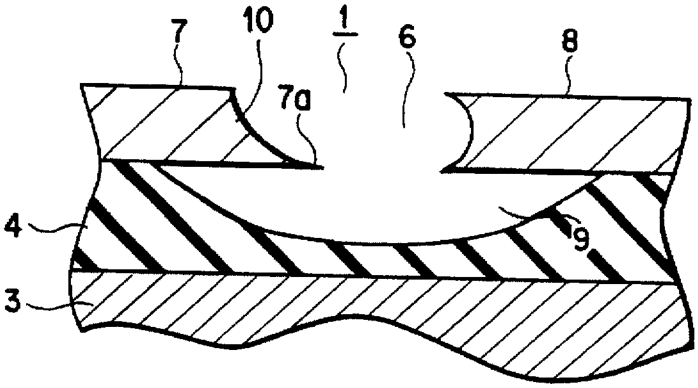
FIG. 16 is a longitudinal sectional view showing a device for emitting electrons according to the sixth embodiment.

FIG. 16 shows a device for emitting electrons according to the sixth embodiment.

Similar to the first embodiment, the edge portion 10 of an emitter electrode 7 has an electron-emitting portion 7*a* which is formed by cutting (etching) the edge portion 10 of the emitter electrode 7, from the upper surface side, in the form of an arch. The edge portion of a gate electrode 8 is cut, away from the distal end face, in the form of an arch, thereby sharpening upper and lower surface portions of the edge portion of the gate electrode 8.

A device having such a shape may be formed by one of the method shown in FIGS. 17A to 17I and the method shown in FIGS. 18A to 18I, both of which are based on combinations of the manufacturing methods of the first to third embodiments.

These methods will be described in detail below. In this case, the method shown in FIGS. 17A to 17I is considered as a method of manufacturing a device for emitting electrons according to the sixth embodiment, whereas the method shown in FIGS. 18A to 18I is considered as a manufacturing method according to the seventh embodiment. The same reference numerals in these embodiments denote the same parts as in the previous embodiments to substitute for a description of the arrangement of each part.

Figure 17A:
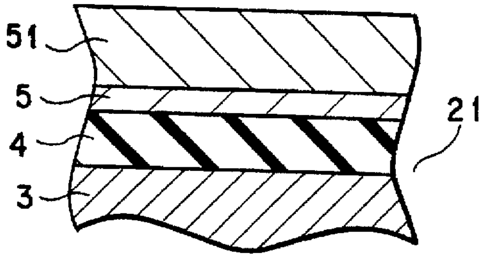
FIGS. 17A to 17J are sectional views showing a method of manufacturing the device of the sixth embodiment.
Figure 17D:
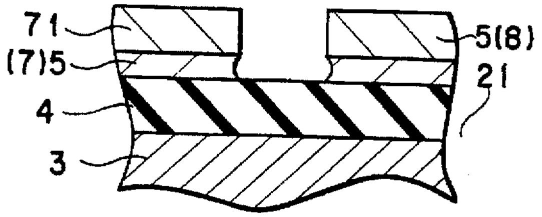
Figure 17B:
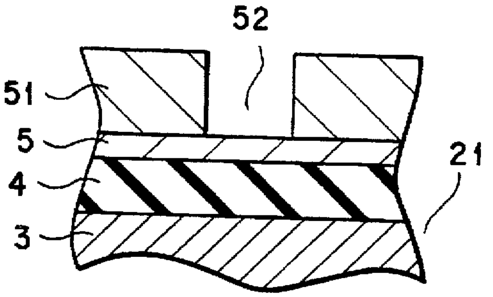
Figure 17E:
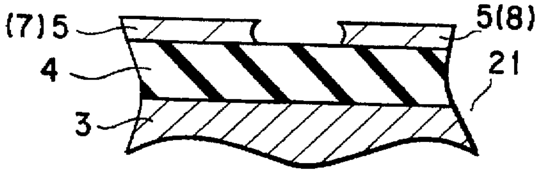
Figure 17C:
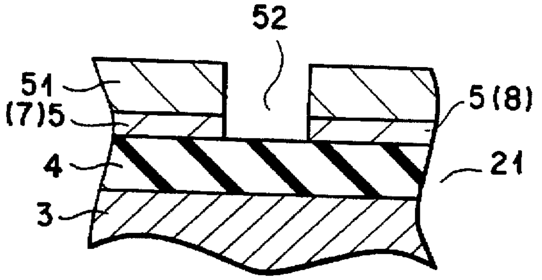

As shown in FIGS. 17A to 17E, first of all, the sixth embodiment uses the method of third embodiment of the present invention. More specifically, a resist 51 is coated on an underlayer 21 formed by stacking an insulating film 4 and a conductive film 5 on the upper surface of a substrate 3, and is patterned to form an emitter electrode 7 into a wedge-like shape as shown in FIG. 17C, thereby forming a groove 52.

Anisotropic etching is performed to etch the conductive film 5. With this process, as shown in FIGS. 17D and 17E, the opposing surfaces of the emitter and gate electrodes 7 and 8 are cut in the form of an arch.

Figure 17F:
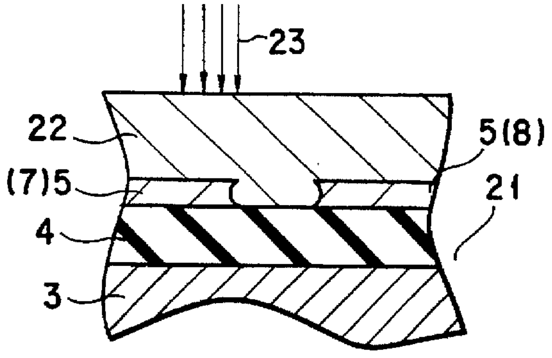
Figure 17I:
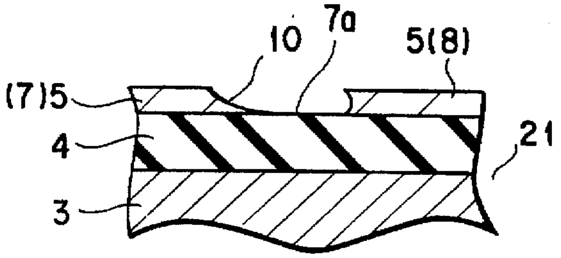
Figure 17G:
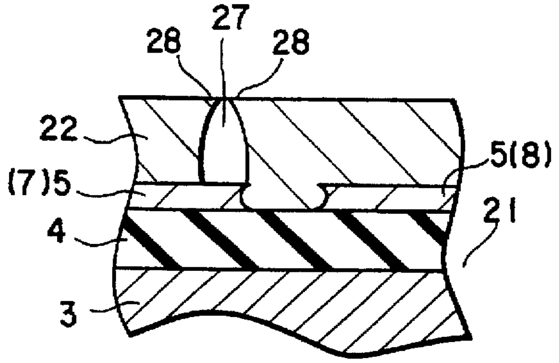

The overlap exposure operation shown in FIG. 17F is performed so as not to etch the edge portion of the gate electrode 8, and unexposed portions 28 which are not exposed are formed by the process of forming an insoluble layer by using a chemically amplified positive excimer resist 22, which is described in the fourth embodiment, as shown in FIG. 17G.

As shown in 17H, isotropic etching is performed by using the resist 22 as a mask to cut only the edge portion 10 of the emitter electrode 7, from the upper surface side, in the form of an arch, thereby forming a sharpened electron-emitting portion 7*a*.

Figure 17J:
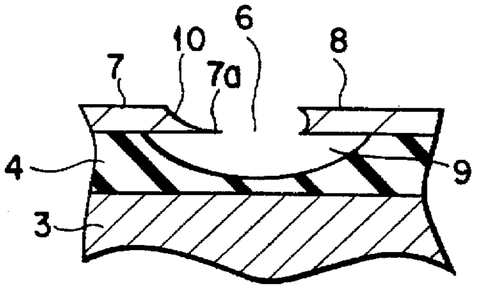
Figure 17H:
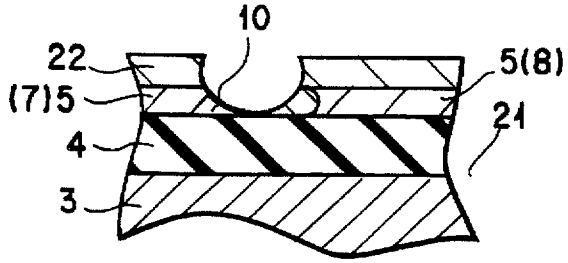

Finally, a resist 22 is removed, as shown in FIG. 17I, and the insulating film 4 is selectively etched by isotropic etching to form a recess 9, as shown in FIG. 17J.

With this process, a device for emitting electrons is manufactured, which includes the emitter and gate electrodes 7 and 8 having edge portions located at the recess 9.

Figure 18A:
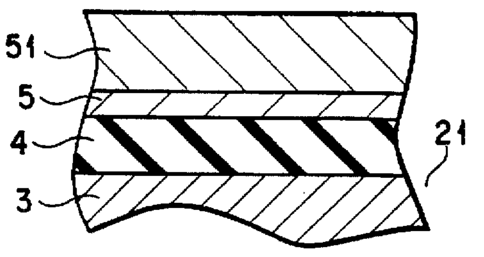
FIGS. 18A to 18J are sectional views showing a method of manufacturing a device for emitting electrons according to the seventh embodiment.
Figure 18D:
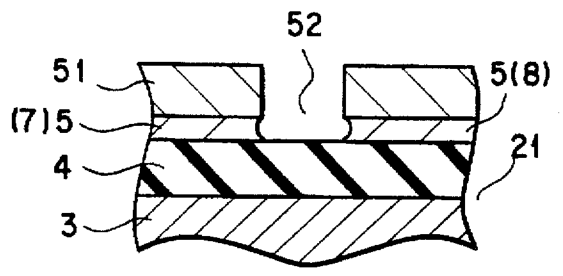
Figure 18B:
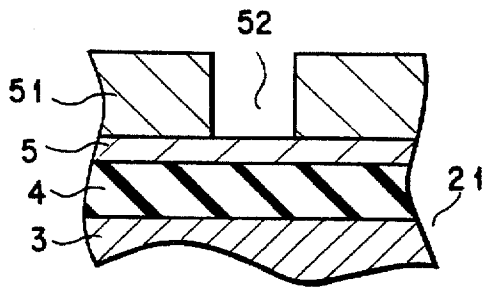
Figure 18E:
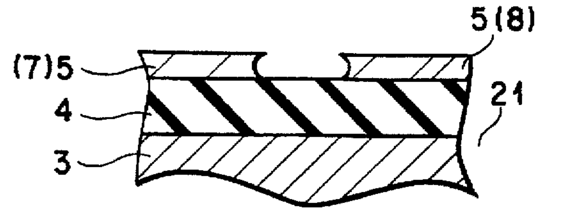
Figure 18C:
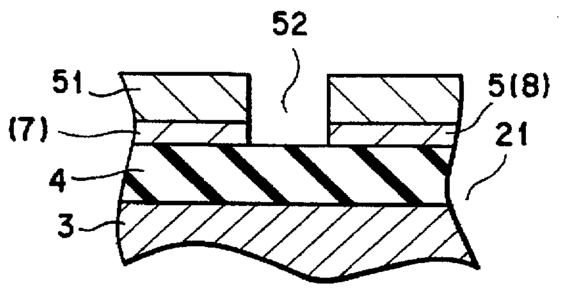
Figure 18F:
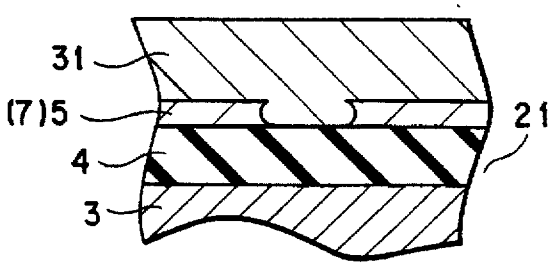

The seventh embodiment will be described next. Since the steps shown in FIGS. 18A to 18E are the same as those shown in FIGS. 17A to 17E, a description thereof will be omitted. After these steps, as shown in FIGS. 18F and 18G, overlap exposure is performed by using the method of adjusting the focal point in a stepper exposure operation (to the positive side in this case), which is described in the second embodiment, so as to form unexposed portions 33 in a resist 31.

Figure 18I:
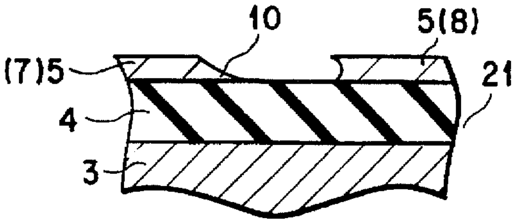
Figure 18G:
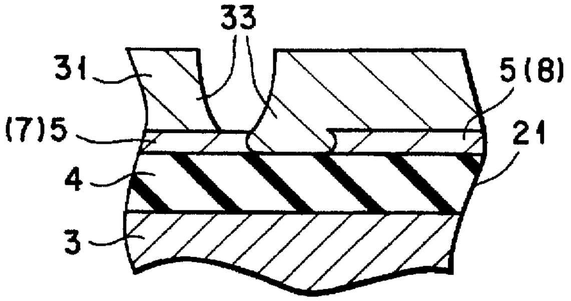
Figure 18J:
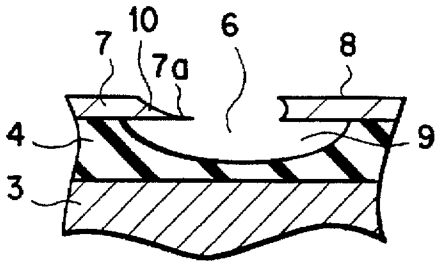
Figure 18H:
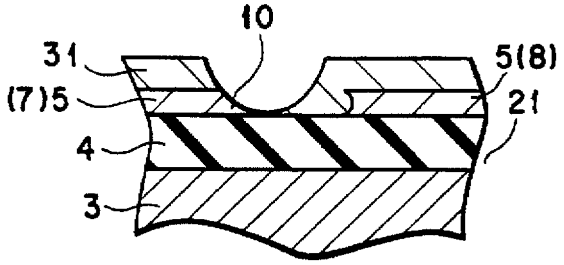

As shown in FIG. 18H, anisotropic etching is performed by using the resist 31 as a mask. With this process, the number of radicals in an etching gas supplied is controlled by the unexposed portions 33 of the resist 31. As a result, similar to the fifth embodiment, only the edge portion 10 of an emitter electrode 7 is sharpened to form an electron-emitting portion 7*a*.

Finally, the resist 31 is removed, as shown in FIG. 18I, and an insulating film 4 is selectively etched by isotropic etching to form a recess 9, as shown in FIG. 18J. With this process, the device shown in FIG. 16 is manufactured.

According to the sixth and seventh embodiments, the following effects can be obtained.

In the sixth and seventh embodiments, two sharpened portions are formed on the edge portion of the gate electrode 8. Since the sharpen portions of the gate electrode 8 which opposes the electron-emitting portion 7*a* of the emitter electrode 7 can be made larger in number than that in each of the first and second embodiments, a larger electric field can be applied to the electron-emitting portion 7*a* of the emitter electrode 7. Therefore, a large emission current can be obtained with a lower driving voltage.

The eighth and ninth embodiments will be described next.

Figure 19:
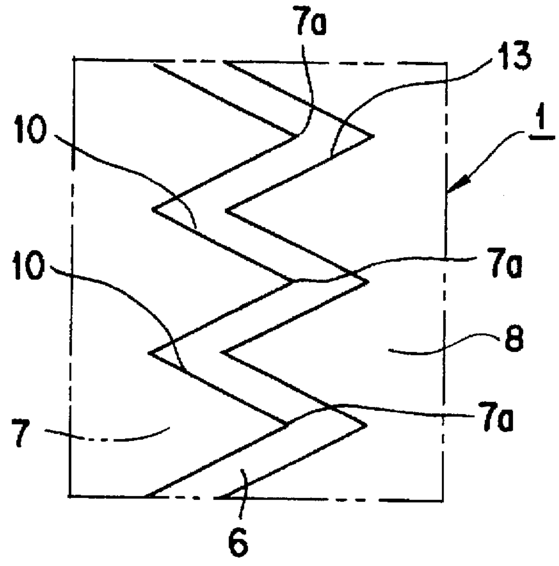
FIG. 19 is a plan view showing a device for emitting electrons according to the eighth embodiment.
Figure 20:
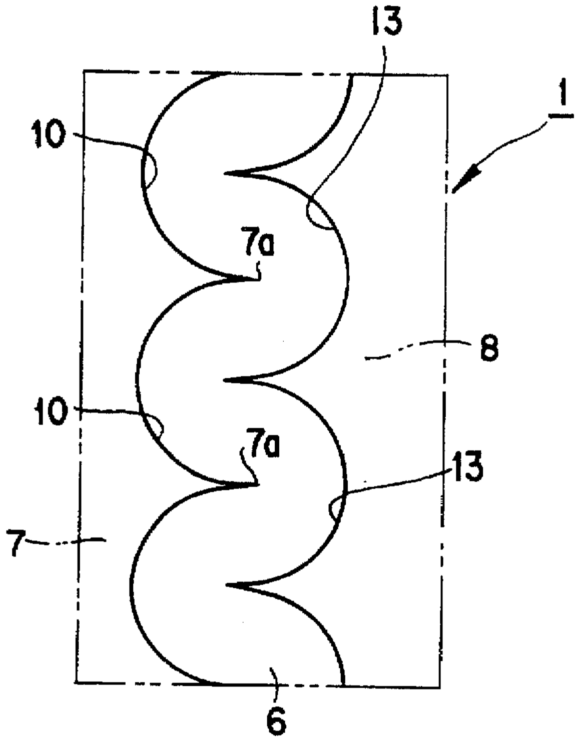
FIG. 20 is a plan view showing a device for emitting electrons according to the ninth embodiment.

FIG. 19 is a plan view showing the eighth embodiment. FIG. 20 is a plan view showing the ninth embodiment. Referring to both FIGS. 19 and 20, reference numeral 7 denotes an emitter electrode; and 8, a gate electrode. The tip of the sharpened, wedge-like edge portion 10 of the emitter electrode 7 is an electron-emitting portion 7*a*. The edge portion 13 of the gate electrode 8 is formed into a shape surrounding the electron-emitting portion 7*a* of the emitter electrode 7 via a predetermined gap 6.

The emitter and gate electrodes 7 and 8 having these shapes may be formed by exposing the above resist in accordance with patterns corresponding to the shapes of the emitter and gate electrodes 7 and 8 described above (FIGS. 19 and 20).

The shapes of the emitter and gate electrodes 7 and 8 described in the first to seventh embodiments can be applied to formation of the above-described shapes of the edge portions 10 and 13 of the emitter and gate electrodes 7 and 8 which are perpendicular to the substrate 13.

According to the devices of the eight and ninth embodiments, since the electron-emitting portion 7*a* of the emitter electrode 7 is surrounded by the edge portion 13 of the gate electrode 8, an electric field can be concentrated more efficiently than in the first to seventh embodiments.

A large current value, therefore, can be obtained with a lower driving voltage.

Note that the devices for emitting electrons and the methods of manufacturing devices for emitting electrons according to the above embodiments may be 5 applied to an electron gun, an SEM (scanning electron microscope), a vacuum IC, a flat display, an electron beam drawing apparatus, and the like.

The tenth embodiment of the present invention will be described next.

In each of the first to ninth embodiments, the emitter electrode 7 and the gate electrode 8 are formed on the same level. However, a device for emitting electrons in each of the tenth and subsequent embodiments has two emitter electrodes and two gate electrodes respectively denoted by reference numerals 67 and 68, and 69 and 70, and these emitter electrodes 67 and 68 are formed on a level different from that of these gate electrodes 69 and 70. That is, the basic arrangement of each of these embodiments is different from that of each embodiment described above. The tenth and subsequent embodiments will be described below.

Figure 21A:
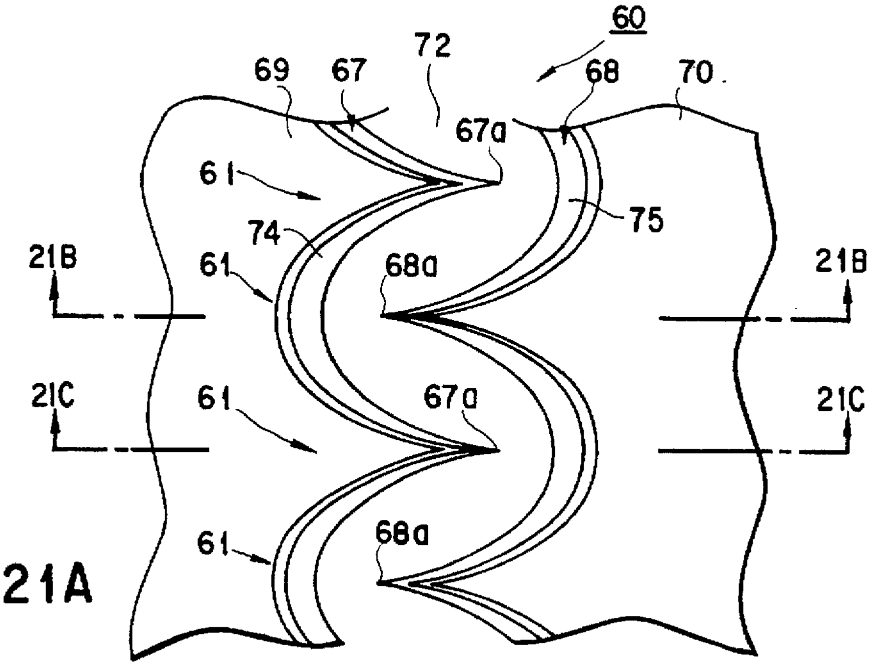
FIG. 21A is a plan view showing a device for emitting electrons according to the tenth embodiment.

FIG. 21A is a plan view of an array 60 of devices for emitting electrons according to the tenth embodiment. This array 60 is constituted by a plurality of devices 61 for emitting electrons, which devices are continuously formed in a direction parallel to the upper surface of a substrate 62 shown in FIGS. 21B and 21C. FIG. 21A shows only four devices 61 to avoid complicated illustration.

Figure 21B:
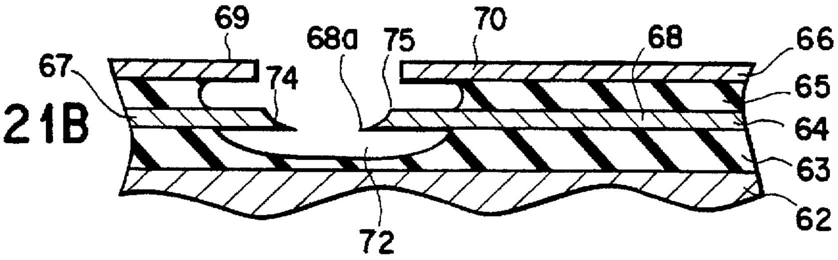
FIG. 21B is a longitudinal sectional view taken along a line 21B—21B in FIG. 21A.
Figure 21C:
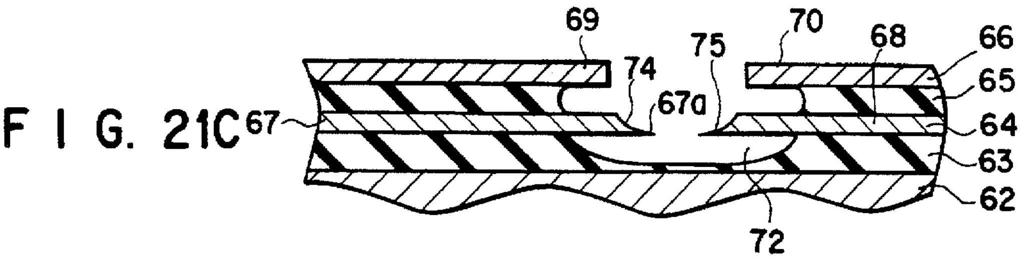
FIG. 21C is a longitudinal sectional view taken along a line 21C—21C in FIG. 21A.

FIGS. 21B and 21C are longitudinal sectional views respectively taken along a line 21B—21B and a line 21C—21C of each device 61 in FIG. 21A. This device 61 has a five-layered structure. More specifically, a first insulating film 63, a first conductive film 64 constituting the emitter electrodes 67 and 68, a second insulating film 65, and a second conductive film 66 constituting the gate electrodes 69 and 70 are sequentially stacked on the flat upper surface of the substrate 62.

The upper surface of the substrate 62 is insulated from the first conductive film 64 (emitter electrodes 667 and 68) by the first insulating film 63. The first conductive film 64 and the second conductive film 66 (gate electrodes 69 and 70) are insulated from each other by the second insulating film 65 while a predetermined gap is formed between the first and second conductive films 64 and 66 in a direction perpendicular to the upper surface of the substrate 62.

In general, Si, glass, or the like is used as a material for the substrate 62; $SiO_2$ or the like, for the first and second insulating films 63 and 65; and a metal material such as tungsten, for the first ad second conductive films 64 and 66.

A recess denoted by reference numeral 72 in FIG. 21A is formed in a central portion of the first insulating film 63. The recess 72 is open to the upper surface of the device 61 via the three layers 64 to 66.

In the recess 72, the first conductive film 64 is divided into the first and second emitter electrodes 67 and 68, and the second conductive film 66 is divided into the first and second gate electrodes 69 and 70.

The recess 72 expands below the lower surfaces of the emitter electrodes 67 and 68, and portions, of the second insulating film 65, located between the emitter electrodes 67 and 68 and between the gate electrodes 69 and 70 are removed.

Consequently, the edge portions 74 and 75 of the emitter electrodes 67 and 68 locate at the recess 72 and oppose each other via a gap, so do the edge portions of the gate electrodes 69 and 70.

Note that the recess 72 is formed to meander along a direction parallel to the upper surface of the substrate 62, as shown in FIG. 21A. With this structure, as indicated by reference numerals 67*a* and 68*a* in FIG. 21A, the tips of the edge portions 74 and 75 of the first and second emitter electrodes 67 and 68 are formed into the wedge-like shapes to alternately protrude along a direction parallel to the upper surface of the substrate 62. In addition, the edge portions of the first and second gate electrodes 69 and 70 are shaped (into arches) to surround the protruding end portions 67*a* and 68*a* of the first and second emitter electrodes 67 and 68 when viewed from above.

As shown in FIGS. 21B and 21C, the opposing edge portions 74, 75 of the first and second emitter electrodes 67 and 68 are cut, from the upper surface side in the direction of thickness of the emitter electrodes 67 and 68, in the form of an arch (arcuated surfaces) to be sharpened as the edges protrude into the recess 72.

In addition, the wedge-like protruding end portions 67*a* and 68*a* of the first and second emitter electrodes 67 and 68 are also sharpened in the direction of thickness, owing to the arcuated surfaces, as described above. Therefore, similar to the protruding end portion 7*a* of the emitter electrode 7 in the first embodiment shown in FIG. 5C, the protruding end portions 67*a* and 68*a* have fine needle-like shapes. These protruding end portions 67*a* and 68*a* serve as the electron-emitting portions of the first and second emitter electrodes 67 and 68.

Note that since the first and second electron-emitting portions 67*a* and 68*a* are alternately arranged in a direction parallel to the upper surface of the substrate 62, as shown in FIG. 21A, only one of the electron-emitting portions (67*a* or 68*a*) is located at one device 61.

The operation of this device for emitting electrons will be described next with reference to FIG. 22 which is a longitudinal sectional view of the device. Note that FIG. 22 corresponds to the longitudinal sectional view taken along the line 21C—21C in FIG. 21A.

Figure 22:
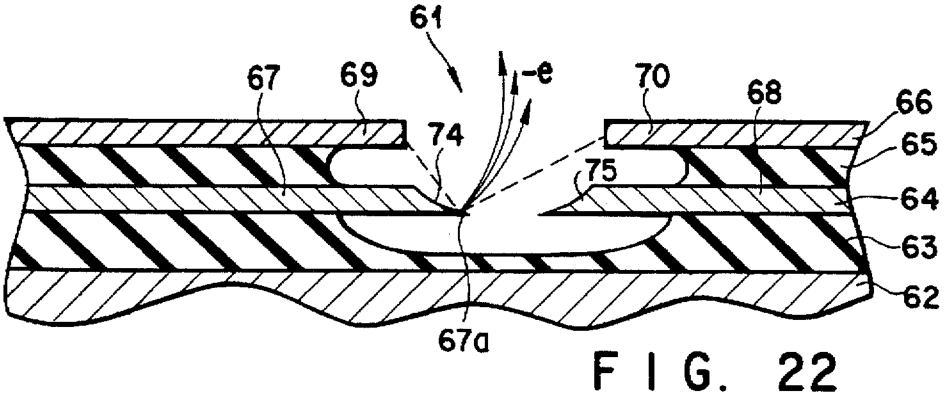
FIG. 22 is a sectional view showing the operation of the device of the tenth embodiment.

When negative and positive voltages are respectively applied to the first conductive film 64 (first and second emitter electrodes 67 and 68) and second conductive film 66 (first and second gate electrodes 69 and 70) of the device, electric fields are applied from the edge portion of the first and second gate electrodes 69 and 70 to the electron-emitting portion 67*a* of the edge portion 74 of the first emitter electrode 67, as indicated by the dotted line in FIG. 22. As a result, electrons (-e) are emitted from the electron-emitting portion 67*a* of the first emitter electrode 67.

Note that electrons are emitted upward from the electron-emitting portion 67*a*, unlike in the first to ninth embodiments. This is because electric fields are applied from both the first and second gate electrode 69 and 70, and electrons are introduced to substantially the center of the gap between the first and second gate electrode 69 and 70 owing to the balance between the electric fields.

Note that the current density based on electrons emitted from the first emitter electrode 67 increases as the tip of the electron-emitting portion 67*a* of the first emitter electrode 67 becomes sharper, and the gaps between the electron-emitting portion 67*a* and the edge portions of the first and second gate electrodes 69 and 70 decrease.

A method of manufacturing this device for emitting electrons 61 will be described next with reference to FIGS. 23A to 23E.

The manufacturing process for the device 61 is roughly constituted by film formation, patterning, and etching.

Figure 23A:
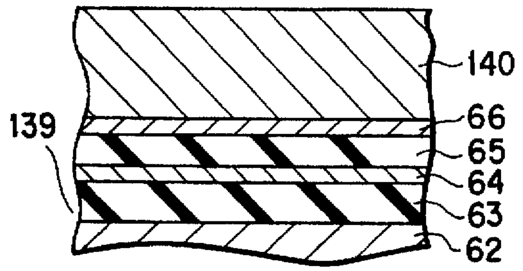
FIGS. 23A to 23E are sectional views showing a method of manufacturing the device of the tenth embodiment.

In this embodiment, first of all, as shown in FIG. 23A, the first insulating film 63, the first conductive film 64, the second insulating film 65, and the second conductive film 66 are sequentially formed on the upper surface of the substrate 62, thereby forming an underlayer 139.

Figure 23B:
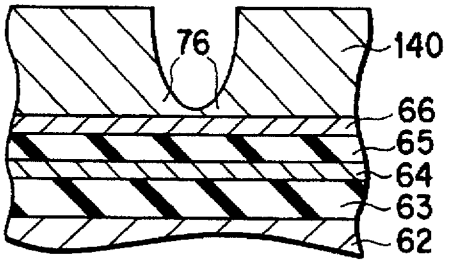

A resist 140 is then coated on the second conductive film 66, and patterning is performed by an exposure operation using a stepper, a large-area exposure apparatus, or the like, as shown in FIG. 23B.

The focal point in this exposure operation is not on the resist 140 (i.e., an in-focus state is not set), but is shifted upward (to the resist 140 side). For this reason, as shown in FIG. 23B, an unexposed portion 76 is formed in the resist 140 such that the cross-sectional shape of the resist 140 becomes gradually narrow toward the lower end.

Since the relationship between the focal point in an exposure operation and the shape of the resist 140 has been described above in the second embodiment with reference to FIGS. 9A to 9C, a description thereof will be omitted.

Figure 23C:
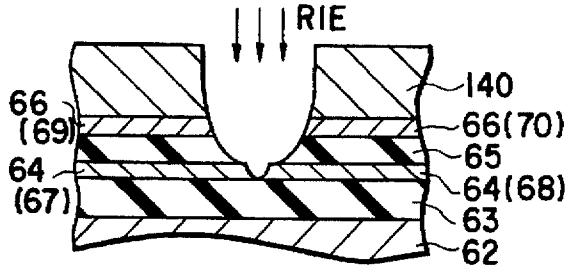
Figure 23D:
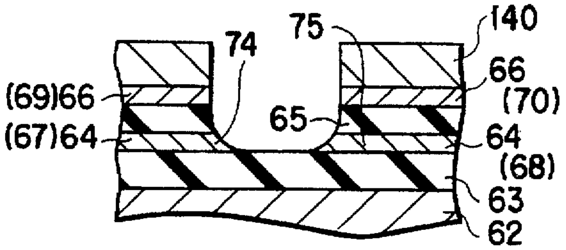

After this process, similar to the first embodiment, anisotropic etching (e.g., RIE (Reactive Ion Etching)) is performed by using the resist 140 as a mask, as shown in FIGS. 23C and 23D.

With this etching, the first and second conductive films 64 and 66 are separated into the first and second emitter electrodes 67 and 68 and the first and second gate electrodes 69 and 70. The edge portions 74 and 75 of the two emitter electrodes 67 and 68 oppose each other via a gap in a direction parallel to the upper surface of the substrate 62, and so do the edge portions of the two gate electrodes 69 and 70.

When viewed from above, as shown in FIG. 21A, the edge portions 74 and 75 of the first and second emitter electrodes 67 and 68 and the edge portions of the first and second gate electrodes 69 and 70 are alternately formed into wedge-like portions and arcuated portions along the planar direction of the substrate 62.

As shown in FIGS. 23C and 23D, the number of radicals in an etching gas supplied to the conductive film 5 is controlled by the unexposed portions of the resist 140 in a direction perpendicular to the upper surface of the substrate 62. For this reason, as shown in FIGS. 23C and 23D, etching progresses to obtain the first and second emitter electrodes 67 and 68 whose edge portions are cut, from the upper surface side, in the form of an arch so as to be sharpened toward the protruding ends.

Similar to the first and second embodiments, the sharpness of the edge portions 74 and 75 of the first and second emitter electrodes 67 and 68 and the gap between the edge portions 74 and 75 are controlled by the shape of the residual portion of the resist 140 and the etching time of RIE to be performed afterward. Since this control has been described in the first and second embodiments, a description thereof will be omitted.

When RIE is to be employed as anisotropic etching, for example, $SiO_2$ is used for the first and second insulating films 63 and 65. In addition, if WSi is used for the first and second conductive films 64 and 65, $CF_4$ and $O_2$ may be fed as RIE gases.

Figure 23E:
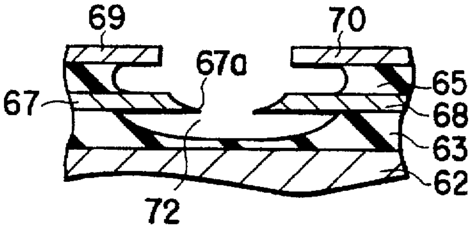

When etching of the first and second conductive films 64 and 66 is completed, an isotropic wet etching method using, e.g., HF is performed, thereby selectively etching $SiO_2$ (first and second insulating layers 63 and 65), as shown in FIG. 23E.

More specifically, portions, of the first and second insulating films 63 and 65, located around edge portions of the first and second emitter electrodes 67 and 68 and the first and second gate electrodes 69 and 70 are removed. As a result, the edge portions 74*a* and 75 of the emitter electrodes 67 and 68 and the edge portions of the gate electrodes 69 and 70 locate at the recess 72.

In this process, the edge portions 74 and 75 of the first and second emitter electrodes 67 and 68 and the edge portions of the gate electrodes 69 and 70 protrude into the recess 72. The process is required to cause the electron-emitting portions 67*a* and 68*a* of the emitter electrodes 67 and 68 to efficiently emit electrons in a vacuum.

According to the device 61 (60) of the tenth embodiment, which is manufactured by the above-described process, the following effects can be obtained.

As described above (FIG. 22), the current density based on electrons emitted from the electron-emitting portion 67*a* of the first emitter electrode 67 increases as the electron-emitting portion 67*a* is sharpened and gaps (as indicated by the dotted line) between the electron-emitting portion 67*a* and the edge portions of the first and second gate electrodes 69 and 70 decrease, even if the voltages applied to the device remain the same. This also applies to the electron-emitting portion 68*a* of the second emitter electrode 68 shown in FIG. 21B.

That is, as the electron-emitting portion 67*a* (68*a*) is sharpened, and the gaps are decreased, the operating power to the device for emitting electrons can be reduced. Note that since the electron-emitting portion 7*a* of the first emitter electrode 67 has the same shape as that of the electron-emitting portion 68*a* of the second emitter electrode 68, only the electron-emitting portion 67*a* of the first emitter electrode 67 will be described below.

The sharpness of the electron-emitting portion 67*a* of the first emitter electrode 67 will be described first. The edge portions 74 and 75 of the first and second emitter electrodes 67 and 68 are formed in the form of an arch by anisotropic etching according to the above method. Therefore, the protruding end portions 67*a* and 68*a* (electron-emitting portions) the edge portions can be made very thin similar to the second embodiment.

That is, when the edge portions of the emitter electrodes 67 and 68 are cut in the form of an arch, as shown in FIG. 5A, the tip of the edge portions can be made very thin as compared with a case wherein the edge portions are simply processed obliquely, as shown in FIG. 5B.

In addition, the tip (electron-emitting portion 67*a*) of the edge portion of the first emitter electrode 67 is made thin in both the direction of thickness and the planar direction. As a result, the fine, needle-like (line-like) electron-emitting portion 67*a* shown in FIG. 5C can be formed.

As compared with the prior art, an electric field can be easily concentrated on the electron-emitting portion 67*a* of the first emitter electrode 67, and hence electrons can be emitted at a high density even with a low voltage. That is, the operating power can be reduced.

This electron-emitting portion 67*a* (edge portion 74) can be easily manufactured by shifting the focal length in an exposure operation. Note that the electron-emitting portion 67*a* can also be sharpened by using the insoluble layer formation process using a chemically amplified resist, similar to the first embodiment.

The gaps between the electron-emitting portion 67*a* of the first emitter electrode 67 and the edge portions of the first and second gate electrodes 69 and 70 in FIG. 22 will be described next. Note that since the second emitter electrode 68 is identical to the first emitter electrode 67, a description thereof will be omitted.

The gap between the edge portion 74 of the first emitter electrode 67 and the edge portion of the first gate electrode 69 located immediately thereabove is determined by the thickness of the second insulating film 65. In this case, since the second insulating film 65 is formed not by a patterning technique but by a film formation technique, the formation process is easy to perform, and the gap between the first emitter electrode 67 and the first gate electrode 69 can be easily reduced and adjusted.

The gap between the edge portion 74 (electrons-emitting portion 67*a*) of the first emitter electrode 67 and the second gate electrode 70 located on a diagonal line extending from the electrons-emitting portion 67*a* of the first emitter electrode 67 is dependent on the shape of the unexposed portion 76 of the resist 140.

Since the shape of the unexposed portion 76 can be determined with high precision by controlling the shifting amount of the focal point in an exposure operation, the distance between the first emitter electrode 67 and the second gate electrode 70 can be easily controlled.

That is, even if a decrease in the distance between the first and second gate electrodes 69 and 70 is limited by the patterning resolution in an exposure operation using a stepper, the distance between the tips (edges) of the first and second emitter electrodes 67 and 68 can be deceased to be smaller than the limit.

Therefore, the electrons-emitting portion 67*a* of the first emitter electrode 67 and the edge portion of the second gate electrode 70 can be brought close to each other by the distance by which the edge portions 74 and 75, of the first and second emitter electrodes 67 and 68 are brought close to each other. That is, the first emitter electrode 67 and the second gate electrode 70 can be brought close to each other without being limited by the patterning resolution of the stepper.

This equally applies to a case wherein the insoluble layer formation process using a chemically amplified resist (first embodiment) is used.

Since the gaps between the electron-emitting portion 67*a* of the first emitter electrode 67 and the edge portions of the first and second gate electrodes 69 and 70 can be reduced in this manner, the following effects can be obtained.

A case wherein this device for emitting electrons is used as a triode will be described below. When the device is to be used as a triode, an anode electrode (not shown) is arranged above the device.

Figure 24A:
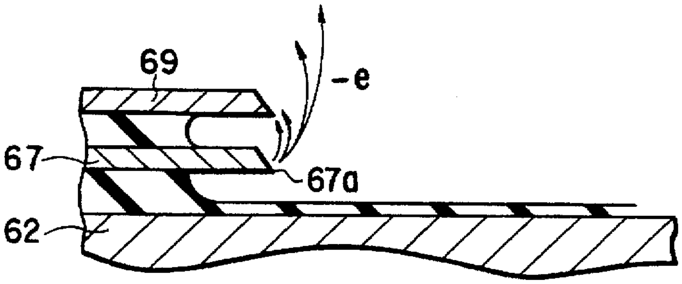
FIGS. 24A and 24B are longitudinal sectional views for explaining the difference in electron emission efficiency between devices for emitting electrons, in which electrodes are differently arranged.
Figure 24B:
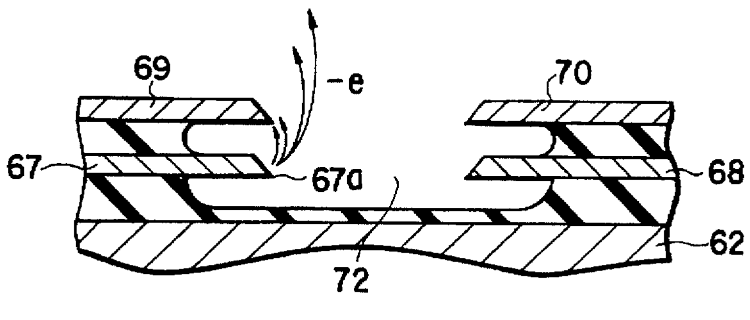

Assume that only the first gate electrode 69 is present with respect to the first emitter electrode 67, as shown in FIG. 24A. In this case, almost half of electrons emitted from the first emitter electrode 67 is trapped by the first gate electrode 69, and the amount of current flowing between the first emitter electrode 67 and the anode electrode (not shown) decreases.

In addition, if only the first gate electrode 69 is present, since the tip of the sharpened electron-emitting portion 67*a* of the first emitter electrode 67 does not face the first gate electrode 69, the emission ratio of electrons may be low.

Assume that the second gate electrode 70 is present, but the distance between the second gate electrode 70 and the electron-emitting portion 67*a* is large, i.e., the above-described gap is not actively reduced unlike the above case. In this case, an electric field from the edge portion of the second gate electrode 70 cannot be concentrated on the electron-emitting portion 67*a*, resulting in the same situation as that described above.

If the first and second gate electrodes 69 and 70 are actively brought close to the electron-emitting portion 67*a* of the first emitter electrode 67 by, for example, controlling the over-etching time of anisotropic etching, like the device 61 of the present invention shown in FIG. 22, an electric field from the second gate electrode 70 can be effectively concentrated on the electron-emitting portion 67*a* of the first emitter electrode 67.

Since the edge portion of the second gate electrode 70 is located in the protruding direction of the electron-emitting portion 67*a*, the electron emission ratio can be increased. In addition, almost 100% of emitted electrons can be deflected upward owing to the balance between electric fields from the first and second gate electrodes 69 and 70.

Even if, therefore, the same voltages are applied to the device, the above electrons are not so trapped by the first gate electrode 69, and a large current can be supplied to the anode electrode.

In this embodiment, when viewed from above, as shown in FIG. 21A, the edge portion of the second gate electrode 70 is shaped into an arch surrounding the electron-emitting portion 67*a* of the first emitter electrode 67. For this reason, the electric field concentration coefficient can be increased, and the electron emission ratio of the first emitter electrode 67 can also be increased.

The reason for such advantages will be described below with reference to FIGS. 25A to 28C.

Figure 25A:
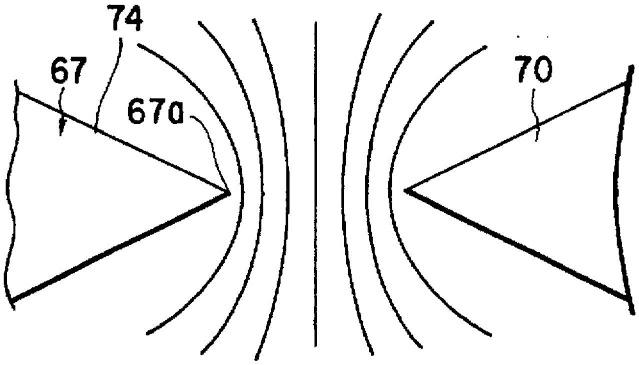
FIGS. 25A to 25C are plan views for explaining the differences in electron emission efficiency among devices for emitting electrons, which respectively include electrodes having different shapes.
Figure 25B:
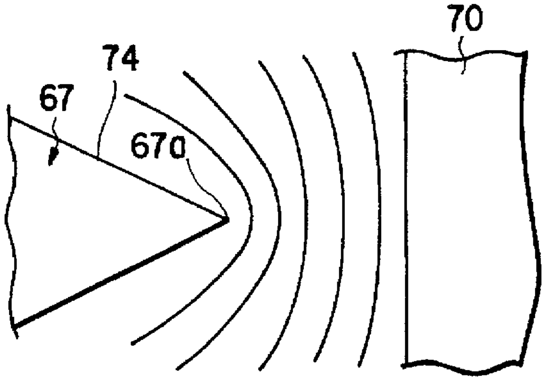
Figure 25C:
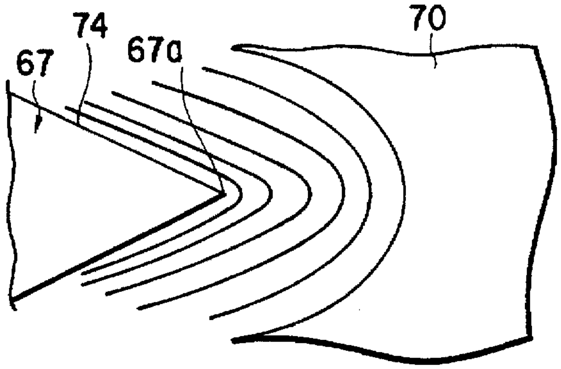

The shape of the edge portion of the second gate electrode 70 with respect to the electron-emitting portion 67*a* of the first emitter electrode 67 is changed into the three types shown in FIGS. 25A to 25C, and the resultant electric field coefficients are compared with each other.

Consider equipotential distributions for the respective types. In this case, the distributions can be expressed by contour lines, as shown in FIGS. 25A to 25C. The electron emission ratio increases with an increase in concentration coefficient of an electric field applied to the electron-emitting portion 67*a* of the first emitter electrode 67. This electric field concentration coefficient increases as potential distribution lines near the electron-emitting portion 67*a* become steep.

Even if, therefore, the voltages applied to the counter-electrodes and the gap between the electrodes remain the same, the density of electrons emitted from the electron-emitting portion 67*a*, i.e., the current amount, increases in the following order: FIG. 25A<FIG. 25B<FIG. 25C.

The relationship between the electron-emitting portion 67*a* of the first emitter electrode 67 and the edge portion of the second gate electrode 70 in this embodiment is equivalent to that shown in FIG. 25C. For this reason, the operating voltage can be decreased.

As described above, according to the device of this embodiment and the method of manufacturing the device, the electron-emitting portion 67*a* of the first emitter electrode 67 can be sharpened more, and the edge portion of the second gate electrode 70 can be brought close to the electron-emitting portion 67*a*. Therefore, a low-operating-power device for emitting electrons can be obtained.

The eleventh embodiment will be described below.

Note that the same reference numerals in the eleventh embodiment denote the same parts as in the tenth embodiment, and a description thereof will be omitted.

Figure 26:
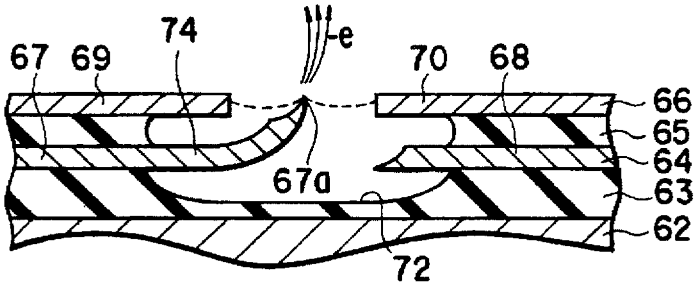
FIG. 26 is a longitudinal sectional view showing a device for emitting electrons according to the eleventh embodiment.

FIG. 26 is a longitudinal sectional view showing a device for emitting electrons according to this embodiment. The shape of the device, when viewed from above, is identical to that of the tenth embodiment shown in FIG. 21A. FIG. 26 corresponds to the longitudinal sectional view taken along the line 21C—21C in FIG. 21A.

As shown in this longitudinal sectional view, an edge portion 74 of a first emitter electrode 67 is bent upward, and a electron-emitting portion 67*a* is located on substantially the same level or higher than that of edge portions of first and second gate electrodes 69 and 70.

A method of forming the device of this embodiment will be described next with reference to FIGS. 27A to 27G.

Figure 27A:
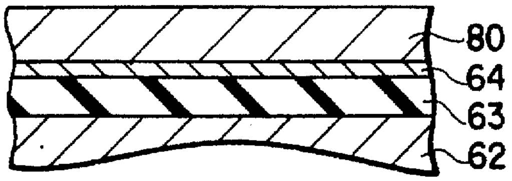
FIGS. 27A to 27G are sectional views showing a method of manufacturing the device of the eleventh embodiment.

As shown in FIG. 27A, a first insulating film 63 and a first conductive film 64 are stacked on the upper flat surface of a substrate 62. In forming these films 63 and 64, the substrate 62 is placed in a vacuum chamber maintained in a predetermined temperature atmosphere, and a film formation technique, e.g., sputtering, is performed. The first insulating film 63 and the first conductive film 64 are formed in the same temperature atmosphere (formation condition).

Figure 27B:
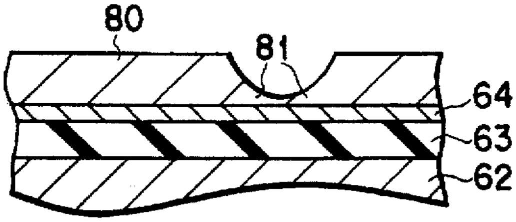

Subsequently, a first resist 80 is coated on the first conductive film 64, and is patterned by exposure, as shown in FIG. 27B. Note that this patterning is performed by the same method as in the second embodiment. That is, the focal point of an exposure laser beam is not on the resist 80 (i.e., an in-focus state is not set) but is shifted upward from the resist 80. For this reason, as shown in FIG. 27B, an unexposed portion 81 is produced in the resist 80, and the cross-sectional shape of the resist 80 is gradually narrowed toward the lower end.

Since the relationship between the focal point in an exposure operation and the side wall shape of the resist 80 has been described in the second embodiment with reference to FIGS. 9A to 9C, a description thereof will be omitted.

Figure 27C:
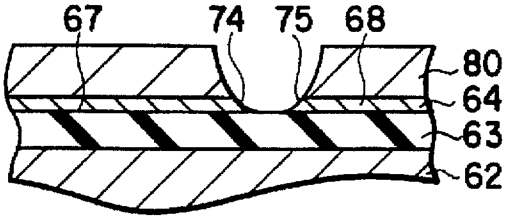

Subsequently, as shown in FIG. 27C, anisotropic etching (e.g., RIE) is performed by using the resist 80 as a mask.

With this process, the first conductive film 63 is divided into first and second emitter electrodes 67 and 68, and the edge portions 74 and 75 of the respective electrodes 67 and 68 are cut, from the upper surface side, in the form of an arch to be sharpened. As a result, the tips of the edge portions 74 and 75 of the first and second emitter electrodes 67 and 68 become needle-like electron-emitting portions 67*a* and 68*a* (only the electron-emitting portion 67*a* of the first emitter electrode 67 is shown in FIG. 27G).

Figure 27D:
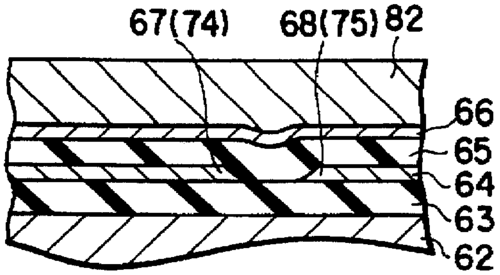

After the first resist 80 is removed, a second insulating film 65 and a second conductive film 66 are formed on the first and second emitter electrodes 67 and 68, as shown in FIG. 27D. Although these films are also formed by sputtering, this film formation may be performed in a temperature atmosphere different from that for the first insulating film 63 and the first conductive film 64.

A second resist 82 is then coated on the second conductive film 66. The second resist 82 is patterned, as shown in FIG.

27E. As shown in FIG. 27F, the second conductive film 66 and the second insulating film 65 are exposed by a stepper and the second resist 82 as a mask. This exposure operation is performed in an in-focus state.

With this process, the second conductive film 66 is divided into the first and second gate electrodes 69 and 70, and edge portions of the respective electrodes 69 and 70 are formed. The shape of the first and second gate electrodes 69 and 70 is the same as that of the tenth embodiment.

The gap between the edge portions of the first and second gate electrodes 69 and 70 is set to be larger than the gap between the edge portions 74 and 75 of the first and second emitter electrodes 67 and 68.

Subsequently, a wet etching process using, e.g., HF is performed. With this process, as shown in FIG. 27G, the first and second insulating films 63 and 65 are selectively etched to form a recess 72.

Note that as etching of the first and second insulating films 63 and 65 progresses, and the edge portion 74 electrons (emitting portion 67*a*) of the first emitter electrode 67 protrudes into the recess 72, the edge portion 74 of the first emitter electrode 67 is warped upward due to the following reason.

The first and second insulating films 63 and 65 are formed in different temperature atmospheres. If, therefore, the different temperature atmospheres are equalized, an internal stress is generated in the first conductive film 64 (first and second emitter electrodes 67 and 68) located at the boundary between the films 63 and 65 owing to the difference in expansion between the films 63 and 65.

Referring to FIG. 21A, the edge portion 74 of the first emitter electrode 67 located on the left side in the drawing sharpened as it protrudes, and the needle-like electron-emitting portion 67*a* is formed on the tip of the edge portion 74. Consequently, the edge portion 74 of the first emitter electrode 67 has low rigidity. Therefore, the curvature of the edge portion 74 of this first emitter electrode 67 increases as it protrudes, and the electron-emitting portion 67*a* faces upward in substantially the vertical direction.

As shown in FIG. 21A, the edge portion 75 of the second emitter electrode 68, which opposes the electron-emitting portion 67*a* of the first emitter electrode 67, is shaped into an arch surrounding the electron-emitting portion 67*a*. In addition, the amount of protrusion of the edge portion 75 of the second emitter electrode 68 into the recess 72, which opposes the electron-emitting portion 67*a*, is smaller than that of the first emitter electrode 67. Therefore, as shown in FIG. 26, the edge portion 75 of the second emitter electrode 68 is hardly bent.

The operation of this device for emitting electrons will be described next.

In this device for emitting electrons, as shown in FIG. 26, the electron-emitting portion 67*a* of the first emitter electrode 67 is located on substantially the same level as the edge portions of the first and second gate electrodes 69 and 70, and is sandwiched therebetween.

According to this arrangement, electric fields can be applied from both the first and second gate electrodes 69 and 70 to the electron-emitting portion 67*a* of the first emitter electrode 67, and the gaps between the electron-emitting portion 67*a* and the first and second gate electrodes 69 and 70 can be further reduced. Therefore, the electron emission efficiency improves. In addition, if this device for emitting electrons is used as a triode, since the tip of the electron-emitting portion 67*a* faces upward, electrons can be more efficiently emitted.

In the eleventh embodiment, the edge portions 74 and 75 (electron-emitting portion 67*a* and 68*a*) of the first and second emitter electrodes 67 and 68 are bent upward by setting different temperatures at which the first and second insulating films 63 and 65 are formed. However, the present invention is not limited to this.

For example, different compositions may be set for the first and second insulating film 63 and 65 to generate internal stresses in the emitter electrodes 67 and 68, thereby warping the edge portions 74 and 75 of the emitter electrodes 67 and 68.

The shapes of the edge portions of the first and second emitter electrodes 67 and 68 and the edge portions of the first and second gate electrodes 69 and 70 are not limited to those in the tenth and eleventh embodiments shown in the plan view of FIG. 21A. The shapes shown in FIGS. 30A to 30D may be employed.

With these shapes, since the edge portions of the first and second gate electrodes 69 and 70 can be brought close to the electron-emitting portions 67*a* and 68*a* of the first and second emitter electrodes 69 and 70, substantially the same effects as those of the tenth and eleventh embodiments can be obtained.

Figure 30A:
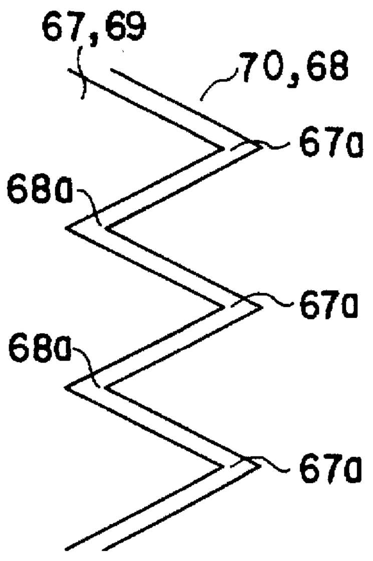
FIGS. 30A to 30D are plan views showing modifications of the tenth and eleventh embodiments.
Figure 30B:
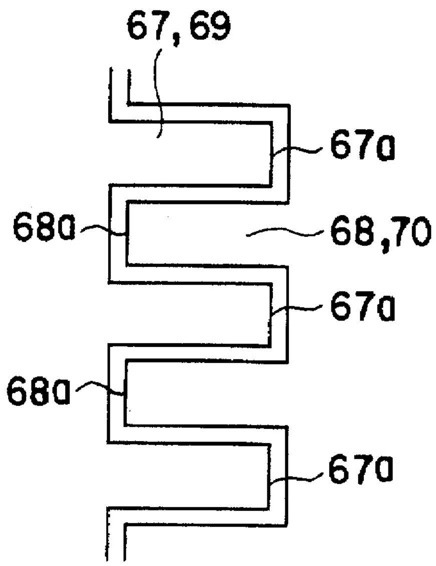
Figure 30C:
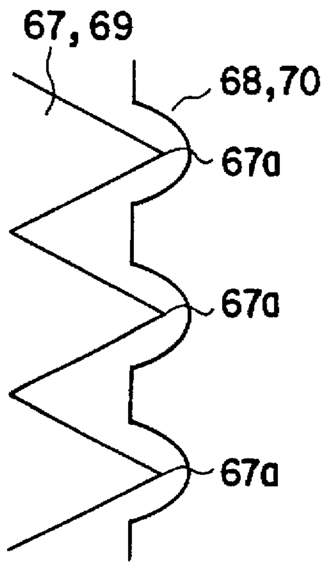
Figure 30D:
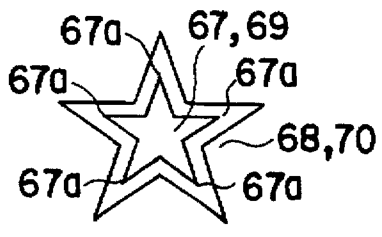

If the star-like shape shown in FIG. 30D is employed, many sharp edge portions (electron-emitting portions 67*a*) can be formed at a high density, the total current value can be increased.

Figure 28A:
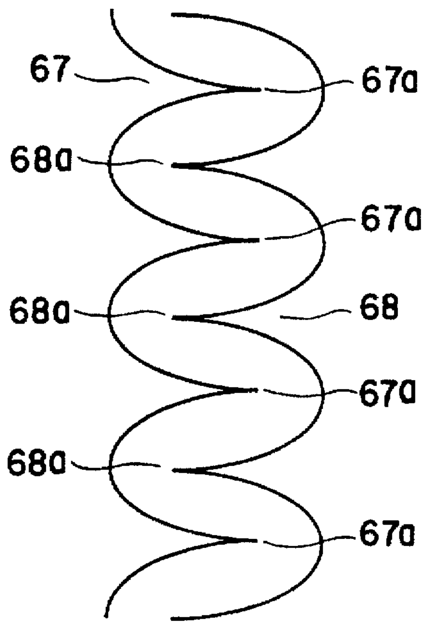
FIG. 28A is a plan view of emitter electrodes, showing a modification of the tenth and eleventh embodiments.
Figure 28B:
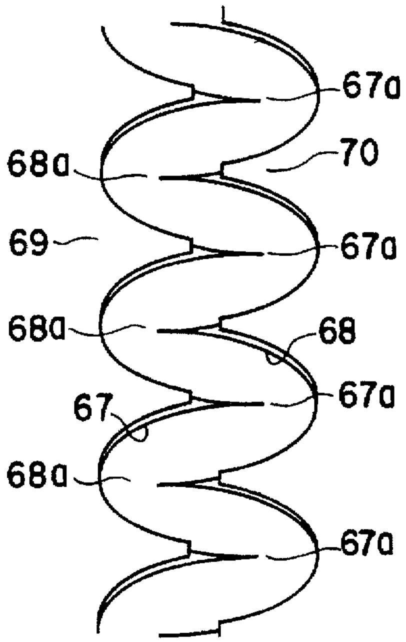
FIG. 28B is a plan view showing a device for emitting electrons as a modification of the tenth and eleventh embodiments.

The array of the devices for emitting electrons according to the eleventh embodiment may have a shape like the one shown in the plan view of the FIG. 28B.

As described above, the array of the devices for emitting electrons according to the eleventh embodiment has the shape shown in FIG. 21A. That is, the edge portions of the emitter electrodes 67 and 68 and the edge portions of the gate electrodes 69 and 70 have substantially the same shape, although they are spaced apart from each other in the vertical direction.

In the array shown in FIG. 28B, however, sharped portions of the edge portions of the gate electrodes 69 and 70 which oppose the electron-emitting portions 67*a* and 68*a* of the emitter electrodes 67 and 68 are cut by a predetermined size, so that the electron-emitting portions 67*a* and 68*a* are exposed.

Figure 27E:
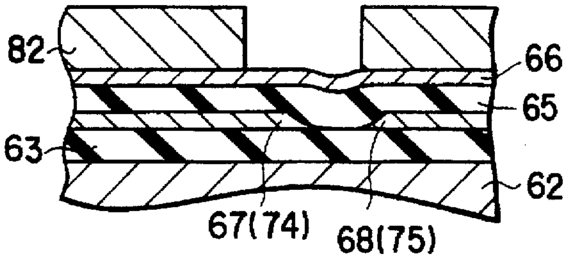
Figure 27F:
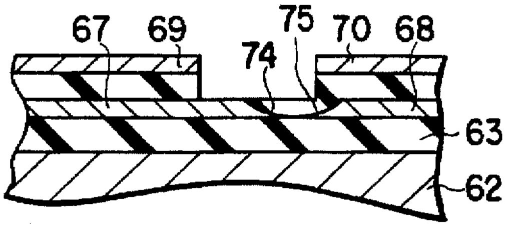

In manufacturing such a device for emitting electrons, first of all, emitter electrodes 67 and 68 having the shapes shown in FIG. 28A are formed. This step is equivalent to the step shown in FIG. 27C. As shown in FIG. 27D, a second insulating film 65 and a second conductive film 66 are formed on the emitter electrodes 67 and 68. After a resist 82 is coated on the second conductive film 66, the coated resist 82 is patterned into a shape identical to that of the gate electrodes 69 and 70 shown in FIG. 28B in the steps shown in FIGS. 27E and 27F.

The second conductive film 66 is etched by using the resist 82 as a mask. With this process, an array of devices for emitting electrons, which has the shape shown in FIG. 28B, can be obtained.

According to this arrangement, in bending the electron-emitting portions 67*a* and 68*a* upward, since the edge portions of the gate electrodes 69 and 70 are not present above the electron-emitting portions 67*a* and 68*a*, the gate electrodes 69 and 70 do not interfere with bending of the electron-emitting portions 67*a* and 68*a*.

Figure 27G:
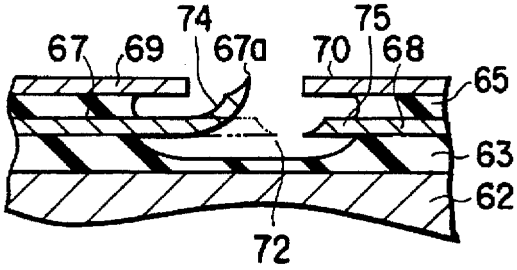

According to the eleventh embodiment, in order to obtain the same effects as those described above, the electron-emitting portion 67*a* of the edge portion 74 of the first emitter electrode 67 is formed to protrude farther than the edge portion of the gate electrode 68 which oppose the electron-emitting portion 67*a* of the first emitter electrode 67, as shown in FIGS. 27F and 27D, by shifting the radiating position of an exposure beam in the exposure step shown FIG. 27C from that of an exposure beam in the exposure step shown in FIG. 27E. In the device shown in FIG. 28B, however, bending of the edge portions 74 and 75 (electron-emitting portions 67*a* and 68*a*) of the emitter electrodes 67 and 68 can be reliably performed without shifting the exposure position in the above manner.

Figure 29A:
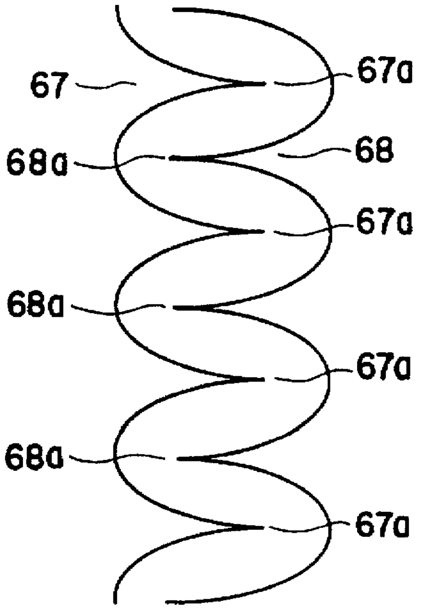
FIG. 29A is a plan view of emitter electrodes, showing a modification of the tenth and eleventh embodiments.
Figure 29B:
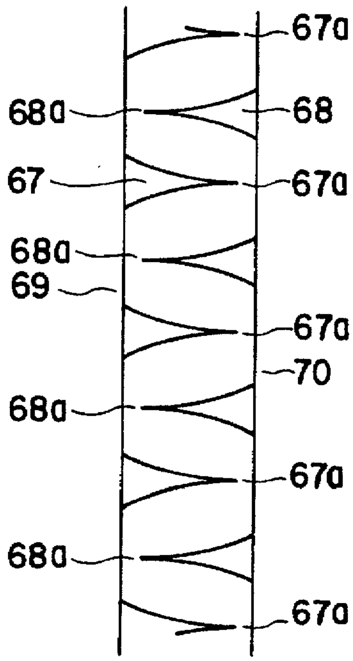
FIG. 29B is a plan view showing a device for emitting electrons as a modification of the tenth and eleventh embodiments.

An array of devices for emitting electrons, like the one shown in FIG. 29B, may be used.

The device shown in FIG. 29B includes emitter electrodes 67 and 68 having the same shapes as those of the devices shown in FIGS. 28A and 28B. That is, the emitter electrodes 67 and 68 have electron-emitting portions 67*a* and 68*a* sharpened in the form of a wedge, when viewed from above.

The edge portions of gate electrodes 69 and 70 formed above the emitter electrodes 67 and 68 are linear to be parallel to each other, as shown in FIG. 29B. The electron-emitting portions 67*a* and 68*a* of the emitter electrodes 67 and 68 protrude farther into the recess 72 than the edges of the gate electrodes 69 and 70.

According to this arrangement, since the gate electrodes 69 and 70 do not interfere with bending of the electron-emitting portions 67*a* and 68*a* of the emitter electrodes 67 and 68, substantially the same effects as those of the device shown in FIG. 28B can be obtained.

The twelfth embodiment of the present invention will be described next with reference to FIG. 31. The same reference numerals in the twelfth embodiment denote the same parts as in the tenth embodiment, and a description thereof will be omitted.

The twelfth embodiment is a triode (vacuum tube) using the device for emitting electrons according to the tenth embodiment as an electron-emitting source. A case wherein the arrangement of this triode is applied to a flat display apparatus will be described below.

Figure 31:
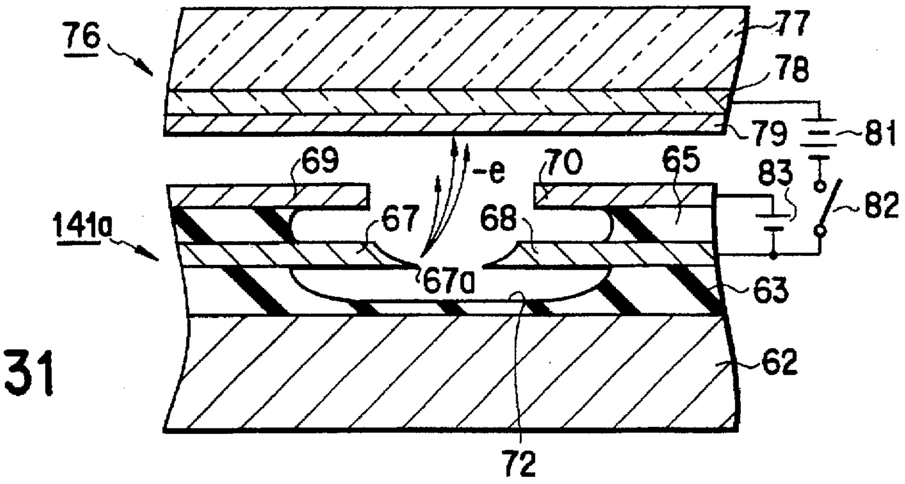
FIG. 31 is a longitudinal sectional view showing a device for emitting electrons according to the twelfth embodiment.

As shown in FIG. 31, this triode includes the electron-emitting source 75 and an anode electrode 76 (anode) arranged above the electron-emitting source 141*a* to oppose it. The anode electrode 76 is constituted by a transparent substrate 77 (quartz glass or the like) and a transparent conductive film 78 bonded to the lower surface of the transparent substrate 77 which opposes the electron-emitting source 141*a*.

In this case, for example, ITO (Indium Tin Oxide) film is used as the transparent conductive film 78. The ITO film is an indium oxide film doped with tin oxide, which has conductivity and transparency.

A phosphor 79 for low-accelerating electron beams is stacked on the lower surface of the transparent conductive film 78 of the anode electrode 76. As a material for the phosphor 79, ZnO:Zn or the like is used.

A substrate 62 of the electron-emitting source 75 and the transparent substrate 77 constituting the anode electrode 76 are bonded to each other at a position (not shown). As a bonding method, for example, electrostatic bonding is employed in the following manner.

For example, pyrex containing Na and K is used for the transparent substrate 77, and a metal such as Al is deposited on a peripheral portion of the upper surface of the transparent substrate 77 (on the opposite side to the surface on which the phosphor 79 is stacked). The transparent substrate 77 is then stacked on the substrate 62 on the electron-emitting source 75 side.

When an electric field is applied between the metal deposited on the transparent substrate 77 and the substrate 62 on the electron-emitting source 141*a* side, Na and K ions are moved to form a layer at the interface between the two substrates 77 and 62 owing to electrification. As a result, the substrates 62 and 77 tightly adhere to each other by an electrostatic force.

If this step is performed in a vacuum atmosphere, the space defined between the substrates 77 and 62 can be maintained in a vacuum even after this device for emitting electrons is taken out under atmospheric pressure. In addition, the space defined between the substrates 77 and 62 can be maintained in a vacuum even in a method of forming evacuation holes in the two substrates 77 and 62 in advance and evacuating the space between the substrates 77 and 62 after joining thereof.

As shown in FIG. 31, first and second emitter electrodes 67 and 68 are connected to the anode electrode 76 via a power supply 81 and a switch 82, and predetermined voltages are applied from another power supply 83 between the emitters 67 and 68 and the first and second gate electrodes 69 and 70.

In the triode having such an arrangement, by applying predetermined voltages to the electrodes 67 to 70 and 76, electrons are emitted from a electron-emitting portion 67*a* of the first emitter electrode 67.

As described in the tenth embodiment, 100% of the electrons emitted from the electron-emitting portion 67*a* propagate upward to be attracted to the anode electrode 76. The electrons are bombarded against the phosphor 79 immediately before they reach the transparent conductive film 78 of the anode electrode 76, thereby emitting luminescent radiation.

If, therefore, a large number of such triodes are arranged as pixels, a flat display apparatus can be obtained.

Assume that in a flat display apparatus of this type, the triodes constituting pixels can be brought close to each other. Even such an arrangement has no problem in operating the flat display apparatus if the distance between the respective trades is larger, even slightly, than the distance (gap) between electron-emitting portions 67*a* and 68*a* the emitter electrodes 67 and 68 and the edge portions of the gate electrodes 69 and 70.

For this reason, even if the pixels are arranged at small intervals, and a plurality of wiring patterns are formed on the transparent substrate 77 and the substrate 62 on the electron-emitting source 75 side to be perpendicular to each other, no problems such as crosstalk are posed. Therefore, a simply matrix scheme can be easily employed as a driving scheme.

In this embodiment, since the two substrates 62 and 77 are joined to each other by the above-described electrostatic joining, a vacuum in the device for emitting electrons can be easily maintained.

Figure 32:
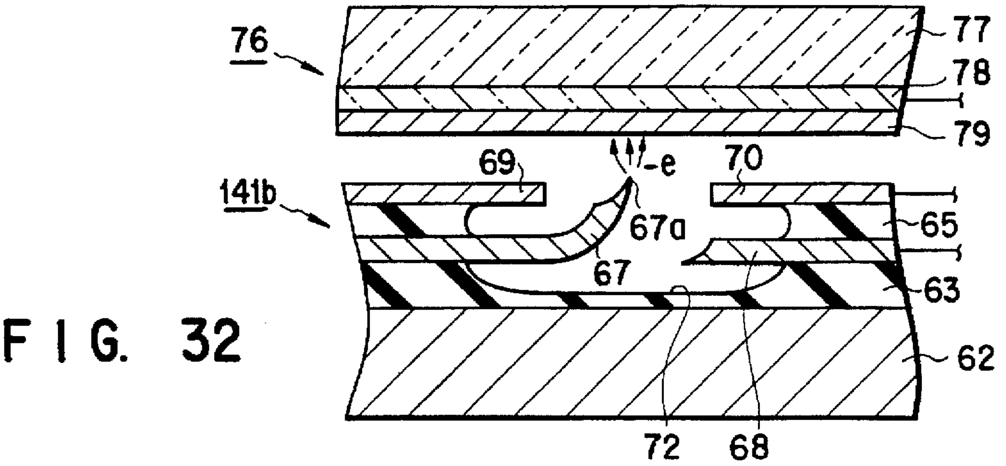
FIG. 32 is a longitudinal sectional view showing a device for emitting electrons according to the thirteenth embodiment.

As the thirteenth embodiment, a device may use the device of the eleventh embodiment as an electron-emitting source 141*b* of the twelfth embodiment, as shown in FIG. 32. Even with such effects equivalent or superior to those described above can be obtained.

Figure 33:
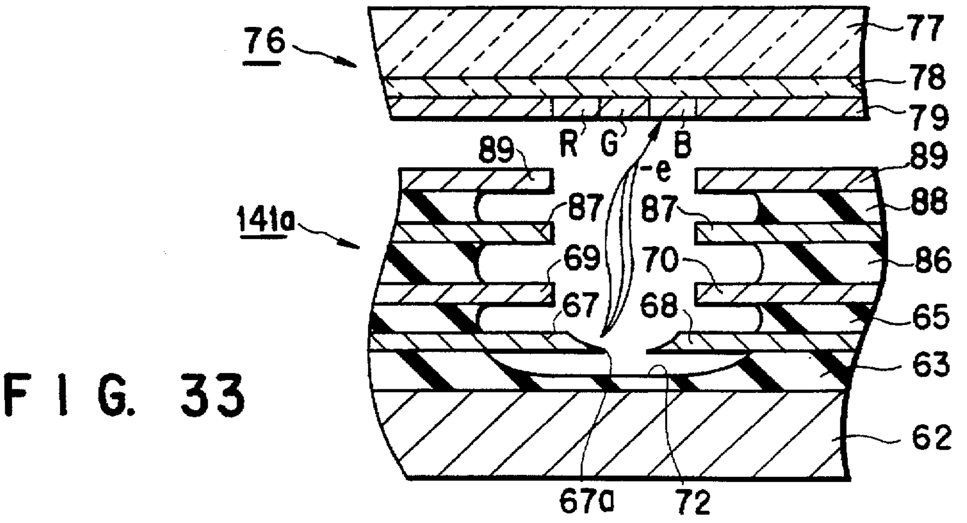
FIG. 33 is a longitudinal sectional view showing a device for emitting electrons according to the fourteenth embodiment.

The fourteenth embodiment of the present invention will be described next with reference to FIG. 33. The same reference numerals in the fourteenth embodiment denote the same parts as in the respective embodiments described above, and a description thereof will be omitted.

A device for emitting electrons according to this embodiment is a pentode. The pentode is constituted by an anode electrode 76 and an electron-emitting source 142*a* for emitting electrons to the anode electrode 76.

This electron-emitting source 142*a* has a nine-layered structure obtained by sequentially forming a third insulating film 86, an accelerating electrode 87, a fourth insulating film 88, and a deflecting electrode 89 on the first and second gate electrodes 69 and 70 of the electron-emitting source 141*a* in the twelfth embodiment.

Both the accelerating electrode 87 and the deflecting electrode 89 have edges protruding into a recess 72. These edges oppose the path of electrons (-e).

In this pentode, the accelerating electrode 87 serves to supply proper energy (a magnetic field) to electrons emitted from an electron-emitting portion 67*a* of the first emitter electrode 67 to accelerate the electrons so as to excite a phosphor 79. If, for example, the phosphor 79 is patterned into R (red), G (green), and B (blue) regions, one of the three color regions can be selectively caused to emit light by deflecting the electrons by using the deflecting electrode 89.

Even in this pentode having a plurality of electrodes, the electrodes 67 to 70, 87, and 89 and the insulating film 63, 65, 86, and 88 can be formed by a film formation technique such as sputtering. Therefore, these films can be formed to be very thin.

Figure 34:
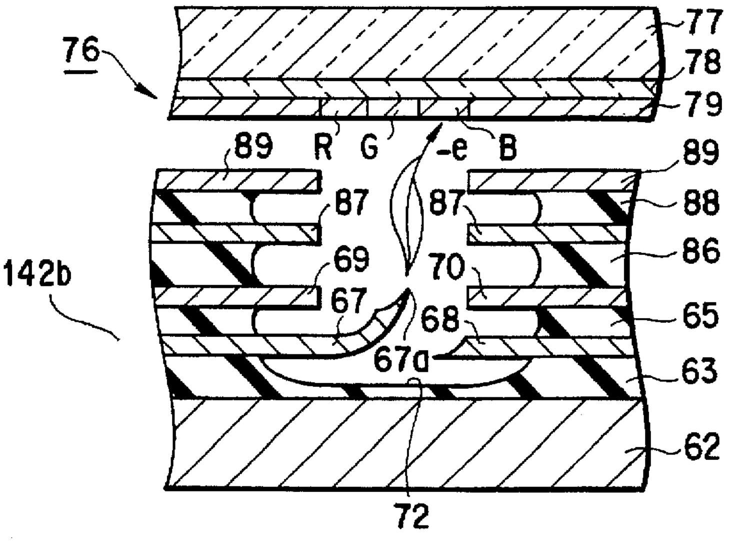
FIG. 34 is a longitudinal sectional view showing a device for emitting electrons according to the fifteenth embodiment.

As the fifteenth embodiment, the pentode shown in FIG. 34 may be formed. This pentode uses the device of the eleventh embodiment as an electron-emitting source 142*b*, and an accelerating electrode 87 and a deflecting electrode 89 are formed on this electron-emitting source 142*b*, similar to the fourteenth embodiment.

An electron-emitting portion 67*a* of the first emitter electrode 67 of this pentode is bent upward to efficiently emit electrons. Therefore, substantially the same effects as those of the fourteenth embodiment can be obtained. In addition, since the electron-emitting portion 67*a* of the first emitter electrode 67 is bent to efficiently emit electrons, the pentode can be operated at a low voltage.

Figure 35:
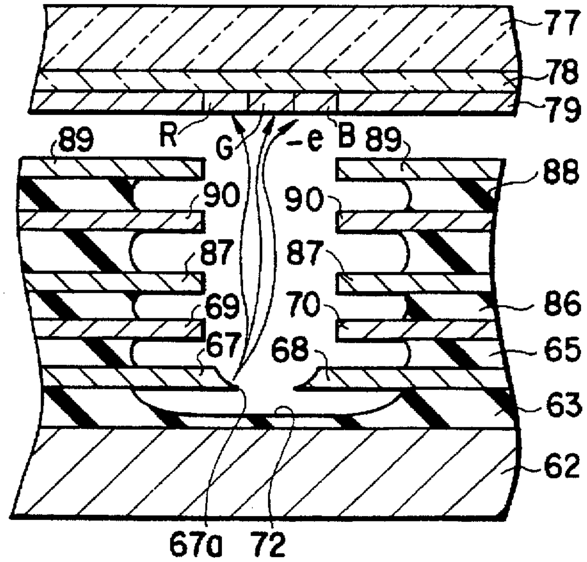
FIG. 35 is a longitudinal sectional view showing a device for emitting electrons according to the sixteenth embodiment.
Figure 36:
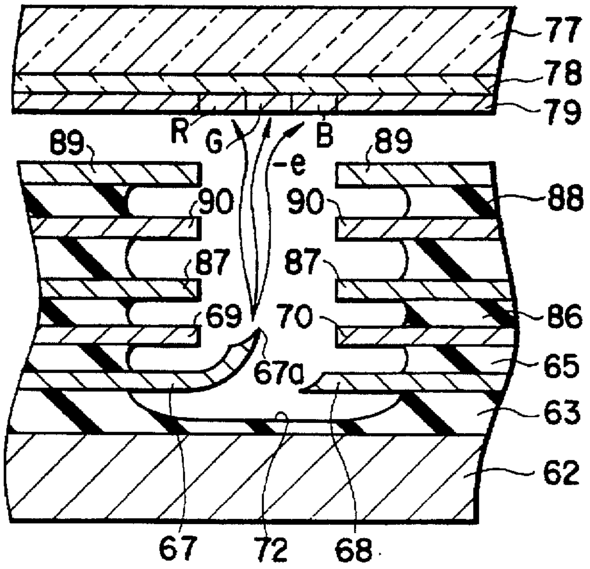
FIG. 36 is a longitudinal sectional view showing a device for emitting electrons according to the seventeenth embodiment.

As the sixteenth and seventeenth embodiments, the devices for emitting electrons, shown in FIGS. 35 and 36, may be considered.

The devices of the sixteenth and seventeenth embodiments are hexodes obtained by respectively inserting variable convergence electrodes 90 between the deflecting electrodes 89 and the accelerating electrodes 87 in the thirteenth and fourteenth embodiments. The variable convergence electrode 90 applies a magnetic field to an electron group emitted from the emitter electrode 67 and accelerated to control the degree of convergence of the electrons.

More specifically, the variable convergence electrode 90 changes the polarity or intensity of a magnetic field applied to an emitted electron group so as to cause the electron beam to converge or diverge. With this operation, in this device for emitting electrons, for example, the R, G, and B regions may be simultaneously cased to emit light or two of the three regions may be selectively caused to emit light, thereby allowing multicolor display.

In addition, since each electrode is formed by a film formation technique such as sputtering, a low-profile device can be easily obtained by film thickness control.

The devices for emitting electrons according to the twelfth to seventeenth embodiments can be manufactured by applying the manufacturing method of the tenth or eleventh embodiment. More specifically, the emitter electrodes 67 and 68, the gate electrodes 69 and 70, the accelerating electrode 87, the variable convergence electrode 90, and the deflecting electrode 89 may be manufactured all together by performing anisotropic etching after all the layers are stacked on the substrate. Alternatively, as in the eleventh embodiment, the gate electrodes 69 and 70, the accelerating electrode 87, the variable convergence electrode 90, and the deflecting electrode 89 may be formed after the edge portions 74, 75 (electron-emitting portions 67*a* and 68*a*) of the emitter electrodes 67 and 68 are formed by anisotropic etching.

The eighteenth and nineteenth embodiments of the present invention will be described next with reference to FIGS. 37 and 38.

The various devices for emitting electrons, which have been described so far, are of a transmission type. However, devices for emitting electrons according to the eighteenth and nineteenth embodiments are of a reflection type.

Most of the structures of these devices for emitting electrons are the same as those of the transmission type triodes of the twelfth and thirteen embodiments. The devices of these embodiments can be manufactured by manufacturing processes similar to those for the triodes of the twelfth and thirteenth embodiments. In the eighteenth embodiment shown in FIG. 37, the device of the tenth embodiment is applied to an electron-emitting source 92. In the nineteenth embodiment shown in FIG. 38, the device of the eleventh embodiment is applied to an electron-emitting source 93.

Of the constituent elements of the device of the eighteenth embodiment, only constituent elements different from those of a transmission type device for emitting electrons will be described below.

In this device for emitting electrons, a material having high transparency, e.g., quartz glass, is used for a substrate 94 on the electron-emitting source 92 side, and an opaque material such as Si is used for a substrate 95 on the anode electrode 76 side. In addition, an opaque material having high reflectivity, e.g., Au, is used for a conductive film 96 deposed on the Si substrate 95.

Figure 37:
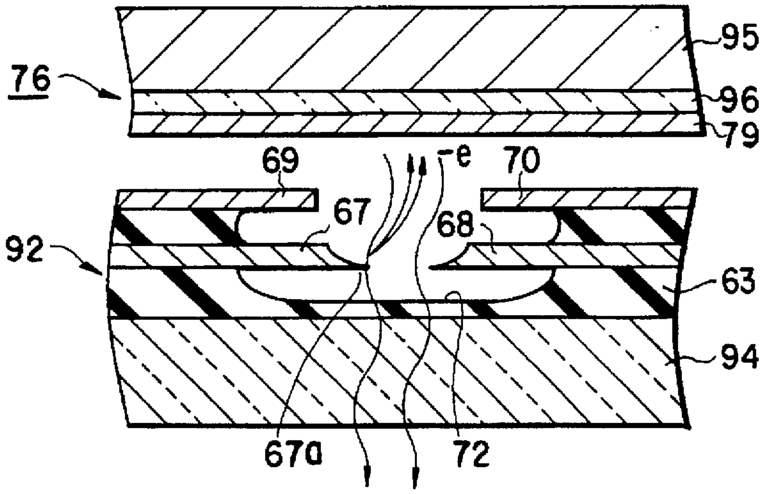
FIG. 37 is a longitudinal sectional view showing a device for emitting electrons according to the eighteenth embodiment.

Light emitted from a phosphor 79 which has received electrons from an electron-emitting portion 67*a* of an emitter electrode 67 directly propagates toward the transparent substrate 94 on the electron-emitting source 92 side, or is reflected by the conductive film 96 of an anode electrode 76 to propagate to the substrate 94, as indicated by the broken lines in FIG. 37. The light emitted from the phosphor 79 is transmitted through the transparent substrate 94 and guided in one direction.

If a transparent material such as ITO is used for the emitter electrodes 67 and 68 and the gate electrodes 69 and 70, a reduction in the amount of light can be suppressed.

According to such a device for emitting electrons, high brightness can be obtained because diffused reflection is suppressed as compared with a transmission type device for emitting electrons. If a transparent insulating material is used for the substrate 94 and a first insulating film 63 in the electron-emitting source 92, the substrate 94 and the first insulating film 63 can be integrated.

In a flat display using a reflection type device for emitting electrons, the delay time between transmitted light and reflected light can be reduced.

Figure 39:
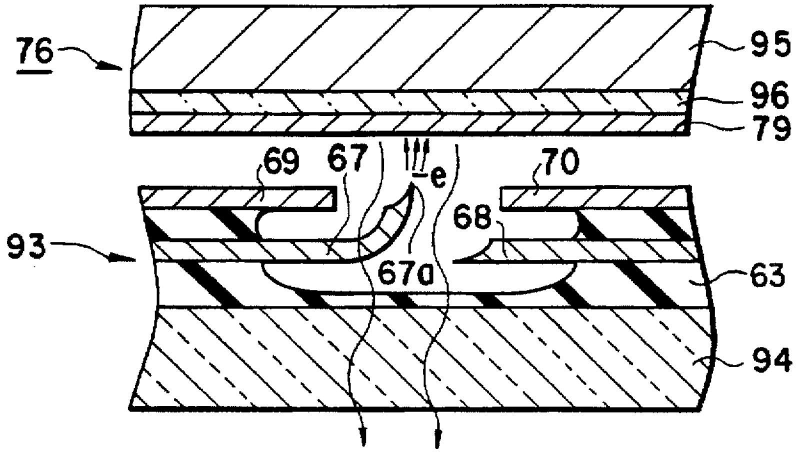
FIG. 39 is a longitudinal sectional view showing a device for emitting electrons according to the twentieth embodiment.

As described above, the nineteenth embodiment is the device shown in FIG. 39.

This device has substantially the same arrangement as that of the reflection type device of the eighteenth embodiment.

However, a sharpened edge portion 74 (electron-emitting portion 67*a*) of a first emitter electrode 67 formed on an electron-emitting source 93 is bent upward.

According to this arrangement, substantially the same effects as those of the eighteenth embodiment can be obtained. In this embodiment, however, the electron-emitting portion 67*a* of the first emitter electrode 67 is located in substantially the center of an electron-emitting groove 72. It is, therefore, required that the emitter electrode 67 be made of a transparent material so as not to shield light reflected by an anode electrode 76.

The twentieth and twenty-first embodiments of the present invention will be described next with reference to FIGS. 38 and 40.

Figure 38:
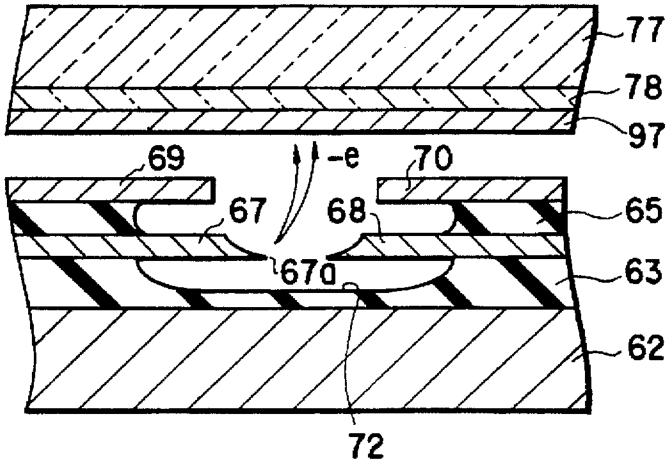
FIG. 38 is a longitudinal sectional view showing a device for emitting electrons according to the nineteenth embodiment.

As shown in FIG. 38, a device for emitting electrons according to the twentieth embodiment is a triode having substantially the same arrangement as that of the device of the twelfth embodiment. In this triode, however, an organic electroluminescent thin film is used as a phosphor denoted by reference numeral 97 in FIG. 38. When holes and electrons are supplied into the organic electroluminescent thin film 97, excitons are generated. When the excitons are restored to the ground level, light is emitted.

That is, in this device for emitting electrons, an electric field is applied to an electron-emitting portion 67*a* of an emitter electrode 67 to cause the electron-emitting portion 67*a* to emit electrons, and the electrons are attracted toward the anode electrode 76 to be supplied to the organic electroluminescent thin film 97. As a high electric field is applied between the emitter electrode 67 and the anode electrode 76, holes are supplied into the organic electroluminescent thin film 97.

In this case, if an organic electroluminescent thin film 97 having a hole transportation property, e.g., an 8-quinolinol Al complex ($Alq_3$) obtained by adding a coumarin derivative to an aluminum quinolinol complex, is selected, the luminous efficacy can be further improved.

The organic electroluminescent thin film 97 includes various thin films having colors required for color display, such as red, blue, and green. For example, a perinone derivative for red, TPD (triphenylamine derivative) for blue, and the like are available. In addition, as a material for green, 1,2-phthaloperinone is available.

If many devices, each having the same arrangement as that described above and serving as a pixel, are arranged, and organic electroluminescent thin films 97 having red, blue, and green are patterned in units of pixels, a display apparatus (flat color display apparatus) capable of performing color display can be obtained.

Although organic electroluminescent thin films are used in this embodiment, a flat color display apparatus can also be obtained by using inorganic electroluminescent thin films. Although an inorganic EL film is longer in service life than an organic electroluminescent thin film, the luminous efficacy of the inorganic electroluminescent thin film is low, and the number of colors of light emission is small.

Figure 40:
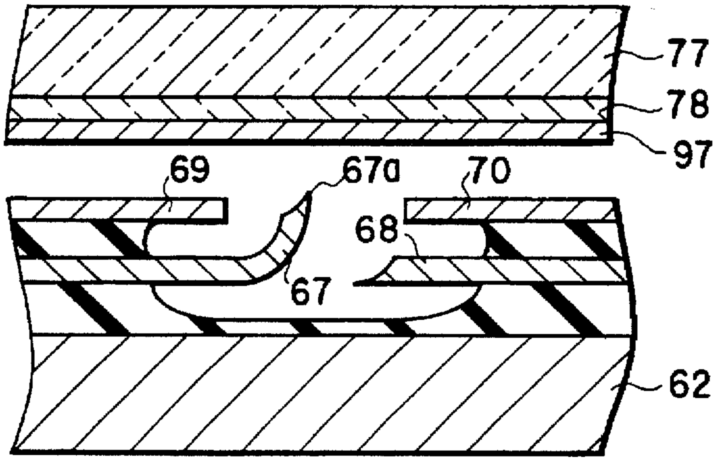
FIG. 40 is a longitudinal sectional view showing a device for emitting electrons according to the twenty-first embodiment.

Note that the twenty-first embodiment shown in FIG. 40 is a device for emitting electrons, which uses an emitter electrode 67 having an electron-emitting portion 67*a* bent upward.

This device also uses an organic electroluminescent thin film 97 as the phosphor. Therefore, substantially the same effects as those of the twentieth embodiment can be obtained.

Figure 41:
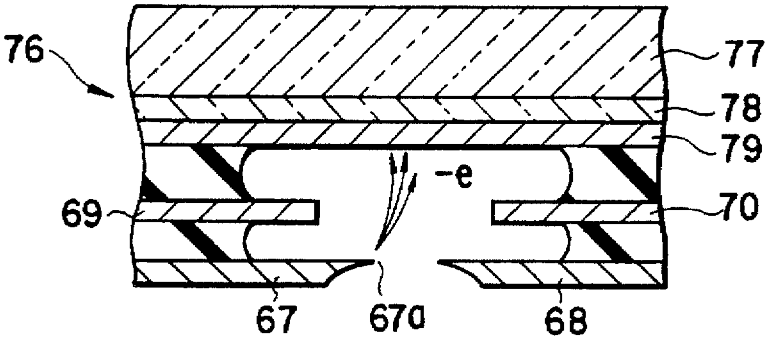
FIG. 41 is a longitudinal sectional view showing a device for emitting electrons according to the twenty-second embodiment.

The twenty-second embodiment will be described next with reference to FIG. 41.

A device for emitting electrons according to the twenty-second embodiment is a triode. The operation of this triode is substantially the same as that of the twelfth embodiment. More specifically, referring to FIG. 41, a predetermined potential difference is given between emitter electrodes 67 and 68 and gate electrodes 69 and 70 to cause an electron-emitting portion 67*a* of the first emitter electrode 67 to emit electrons, and the electrons are attracted to a transparent conductive film 78 of an anode electrode 76, thereby causing a phosphor 79 deposited on the upper surface of the transparent conductive film 78 to emit light.

This device, however, has no substrate on the electron-emitting source side, and the emitter electrodes 67 and 68 and the gate electrodes 69 and 70 are stacked on a transparent substrate 77 on the anode electrode 76 side together with the transparent conductive film 78 and the phosphor 79.

A method of manufacturing this device for emitting electrons will be described next with reference to FIGS. 43A to 43G.

Figure 43A:
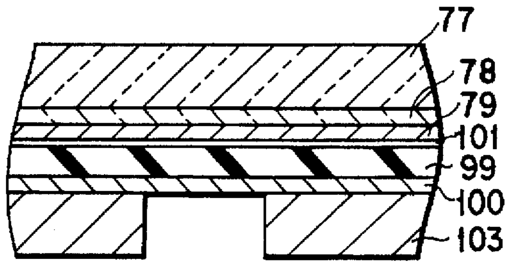
FIGS. 43A to 43G are sectional views showing a method of manufacturing the device of the twenty-second embodiment.

As shown in FIG. 43A, the transparent conductive film 78, the phosphor 79, a first insulating film 99, a first conductive film 100 constituting the gate electrodes 69 and 70 are sequentially deposited and stacked on the surface (lower surface) of the transparent substrate 77 by, for example, sputtering.

In this case, an insulating material 101 which is relatively hard to be etched is deposited between the phosphor 79 and the first insulating film 99 to protect the phosphor 79. Note that the insulating material 101 is preferably transparent.

Figure 43B:
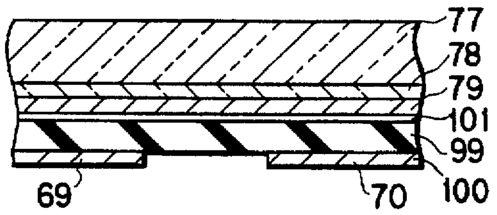

A first resist 103 is coated on the surface of the first conductive film 100. The first resist 103 is then patterned, as shown in FIG. 43A. The second conductive film is exposed by means of a stepper using the first resist 103 pattern as a mask to form the first and second gate electrodes 69 and 70, as shown in FIG. 43B.

Figure 43C:
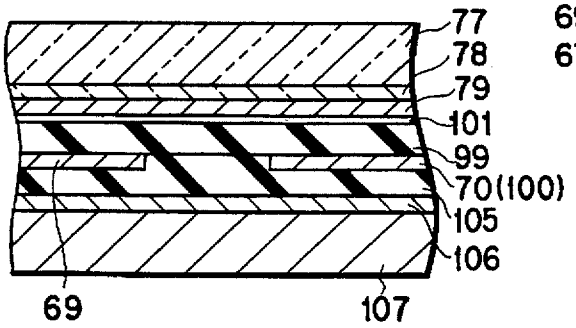

As shown in FIG. 43C, a second insulating film 105 and a second conductive film 106 are sequentially stacked on the surfaces of the first and second gate electrodes 69 and 70 (first conductive film 100). After the formation of the second insulating film 105 and the second conductive film 106, a second resist 107 is coated on the surface of the second conductive film 106. The second resist 107 is patterned by exposure by means of sputtering.

Figure 43D:
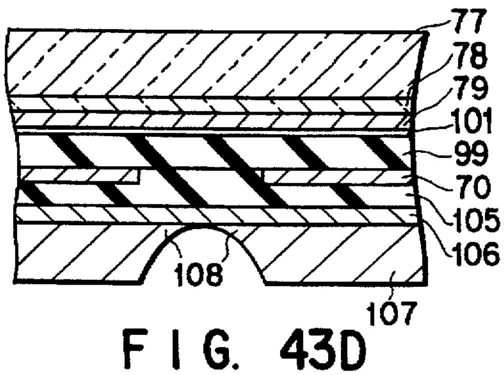
Figure 43E:
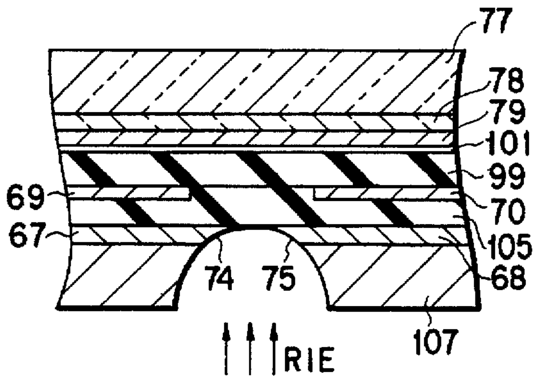

The focal point in this exposure operation is not on the resist 107 (an in-focus state is not set) but is shifted downward from the second resist 107. For this reason, as shown in FIG. 43D, an unexposed portion 108 is formed in the second resist 107, and the cross-sectional shape of the patterned portion of the resist 107 is gradually narrowed toward the upper end of the resist 107.

Note that since the relationship between the focal point in exposure and the shape of the resist 107 upon patterning has been described in the second embodiment with reference to FIGS. 9A to 9C, a description thereof will be omitted.

Subsequently, anisotropic etching is performed by using the second resist 107 as a mask. As a result, the second conductive film 106 is divided into the first and second emitter electrodes 67 and 68 to form their edge portions 74 and 75, and at the same time, the edge portions 74 and 75 are cut, from the lower surface side, in the form of an arch to be sharpened.

Figure 43F:
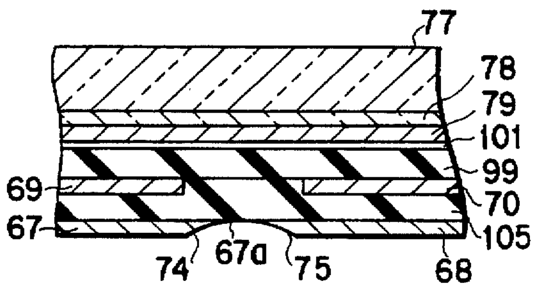

As shown in FIG. 21A, the first and second emitter electrodes 67 and 68 are also sharpened in a direction parallel to the lower surface of the substrate 77 as they protrude. Therefore, sharpened needle-like (line-like)

electron-emitting portions 67*a* and 68*a* are formed on the tips of the edge portions 74 and 75 of the first and second emitter electrodes 67 and 68. Note that FIGS. 43F and 41 show only the electron-emitting portion 67*a* of the first emitter electrode 67.

Figure 43G:
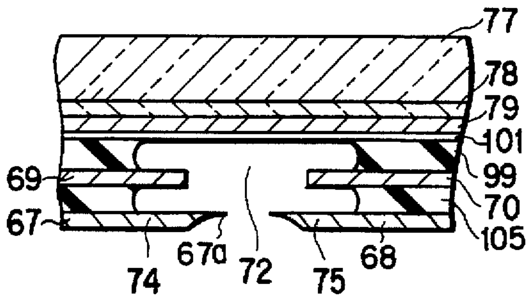

Subsequently, wet etching is performed by using, for example, HF to selectively etch only the first and second insulating films 99 and 105, as shown in FIG. 43G. With this process, the first insulating film 99 located between the phosphor 79 and the gate electrodes 69 and 70 and the second insulating film 105 located between the gate electrodes 69 and 70 and the emitter electrodes 67 and 68 are etched to form a recess 72.

Since the lower surface of the phosphor 79 is protected by the insulating material 101 which is hard to be etched, etching of the phosphor 79 in the wet etching process can be effectively prevented.

With these steps, the edge portions of the first and second gate electrodes 69 and 70 and the edge portions 74 (includes electron-emitting portion 67*a*) and 75 of the first and second emitter electrodes 68 and 69 are caused to protrude into the recess 72, thereby completing this device for emitting electrons.

According to this arrangement, substantially the same effects as those of the twelfth embodiment can be obtained. In addition, since no substrate is present on the electron-emitting source side, in spite of the fact that the triode of this embodiment is equivalent to that of the twelfth embodiment, the arrangement can be simplified to realize a low-profile device.

Figure 42:
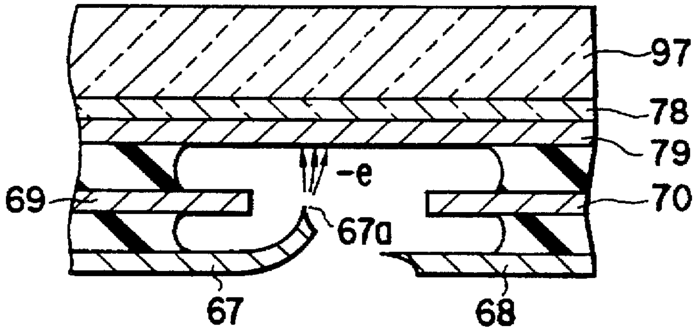
FIG. 42 is a longitudinal sectional view showing a device for emitting electrons according to the twenty-third embodiment.

The twenty-third embodiment will be described next with reference to FIG. 42. The same reference numerals in the twenty-third embodiment denote the same parts as in the twenty-second embodiment (FIG. 41), and a description thereof will be omitted.

A device for emitting electrons according to the twenty-third embodiment is a triode, and has substantially the same arrangement as the device of the twenty-second embodiment. However, the twenty-third embodiment is different from the twenty-second embodiment in that electron-emitting portions 67*a* and 68*a* (the electron-emitting portion 68*a* of the second emitter electrode 68 is not shown) formed on the edge portions 74 and 75 of first and second emitter electrodes 67 and 68 are bent upward.

In this device of the twenty-third embodiment, the electron-emitting portion 67*a* is bent upward to be brought close to an anode electrode 76, and the electron-emitting portion 67*a* can also be brought close to the edge portions of first and second gate electrodes 69 and 70. With this arrangement, the electron emission efficiency of the device is higher than that of the twenty-second embodiment.

A method of manufacturing this device for emitting electrons will be described next with reference to FIGS. 44A to 44G.

The method of manufacturing this device for emitting electrons is substantially the same as the method of manufacturing the device of the twenty-second embodiment shown in FIGS. 43A to 43G. Therefore, only different steps will be described below.

Figure 44A:
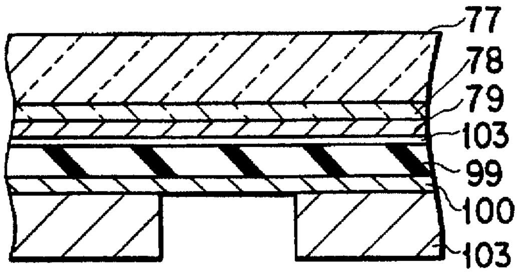
FIGS. 44A to 44G are sectional views showing a method of manufacturing the device of the twenty-third embodiment.
Figure 44B:
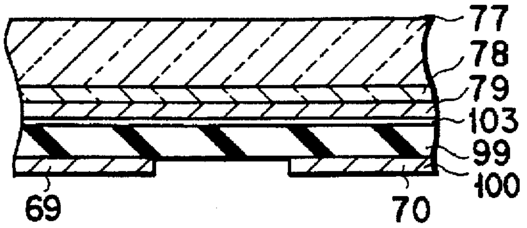
Figure 44C:
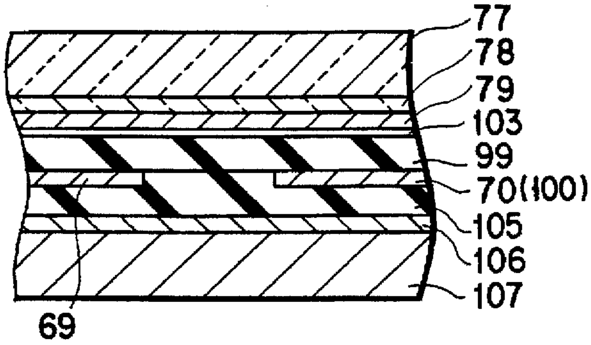
Figure 44D:
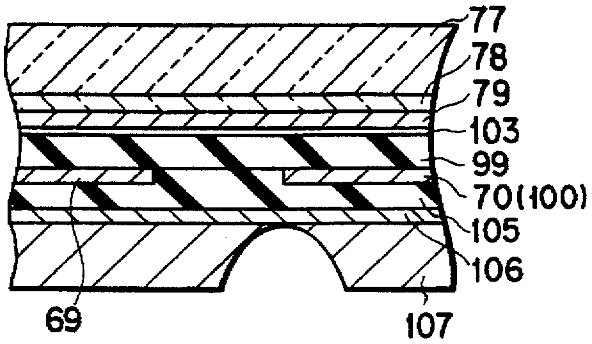
Figure 44E:
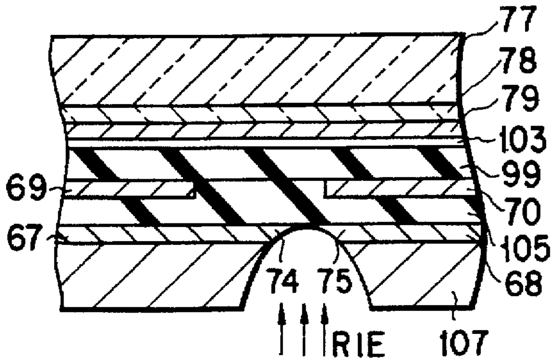

As shown in FIGS. 44A and 44C, in order to bend the electron-emitting portions 67*a* and 68*a* (edge portions 74 and 75) of the emitter electrodes 67 and 68, a first insulating film 99 and a second insulating film 105 are formed at a temperature (e.g., a high temperature) different from room temperature.

That is, the inside of a chamber for forming the first and second insulating films 99 and 105 is maintained at a temperature different from room temperature. Note that the first and second insulating films 99 and 105 are formed at the same temperature.

Figure 44F:
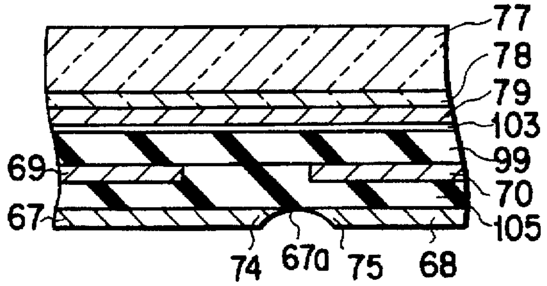
Figure 44G:
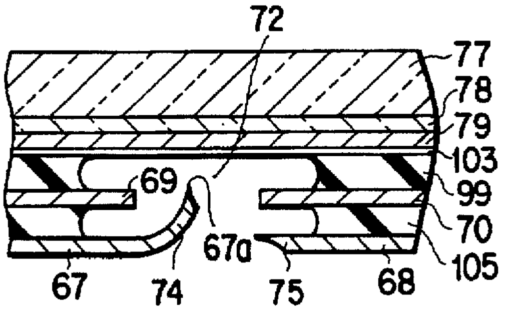

As shown in FIGS. 44F and 44G, when the temperature in the chamber is restored to room temperature after the first and second emitter electrodes 67 and 68 and a recess 72 are formed at a temperature different from that for the first and second insulating films 99 and 105, internal stresses are generated in the first and second emitter electrodes 67 and 68, because the degree of expansion (degree of shrinkage) of the second insulating film 105 is different from that of the first and second emitter electrodes 67 and 68. As a result, the edge portions 74 and 75 (electron-emitting portions 67*a* and 68*a*) of the emitter electrodes 67 and 68 are warped upward. Although FIG. 42 shows only the electron-emitting portion 67*a* of the first emitter electrode 67, the electron-emitting portion 68*a* of the second emitter electrode 68 is also bent in the same form as that of the electron-emitting portion 67*a*.

With this process, the device for emitting electrons according to the twenty-third embodiment is completed. According to this arrangement, substantially the same effects as those of the twenty-second embodiment can be obtained.

The twenty-fourth and twenty-fifth embodiments will be described next with reference to FIGS. 45 and 46.

Similar to the twelfth and thirteenth embodiments, devices for emitting electrons according to the twenty-fourth and twenty-fifth embodiments are triodes respectively using the devices of the tenth and eleventh embodiments as electron-emitting sources 75 (75'). The same reference numerals in these embodiments denote the same parts as in the twelfth and thirteenth embodiments, and a detailed description thereof will be omitted.

Figure 45:
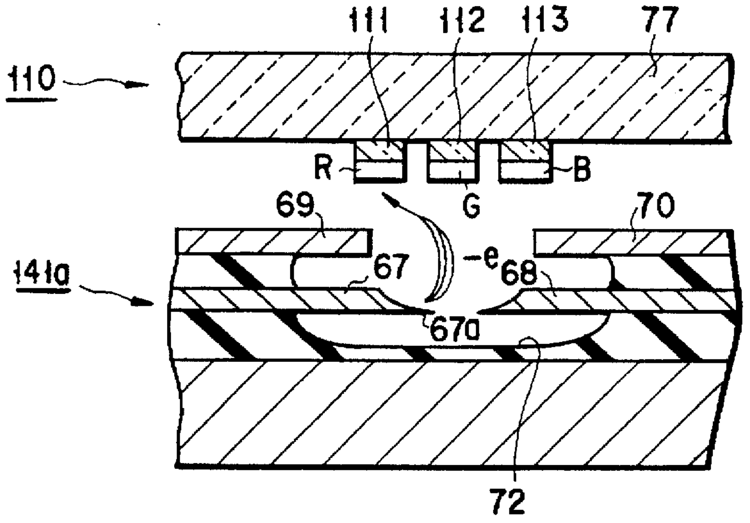
FIG. 45 is a longitudinal sectional view showing a device for emitting electrons according to the twenty-fourth embodiment.

As shown in FIG. 45, the device for emitting electrons according to the twenty-fourth embodiment is constituted by the electron-emitting source 75 having the same arrangement as that of the tenth embodiment, and an anode electrode 110 arranged to oppose the electron-emitting source 75. The anode electrode 110 is constituted by a transparent substrate 77 consisting of, e.g., quartz glass, and first to third transparent conductive film pieces (ITO) 111 to 113 formed on the surface of the transparent substrate 77. The first to third transparent conductive film pieces 111 to 113 are arranged at predetermined intervals, and R, G, and B phosphors are respectively deposited on the first to third transparent conductive film pieces 111 to 113. A predetermined voltage is selectively applied to the first to third transparent conductive film pieces 111 to 113.

The operation of this triode will be described below.

In this triode, when predetermined voltages are applied to electrodes 67 to 70 and 76, electrons are emitted from an electron-emitting portion 67*a* of the first emitter electrode 67. The electrons emitted from the electron-emitting portion 67*a* are attracted to the anode electrode 110 to propagate upward.

Of the first to third transparent conductive film pieces 111 to 113 of the anode electrode 110, a conductive film piece to which a voltage is to be applied is determined depending on the color of light emitted. If, for example, the phosphor (R) formed on the first transparent conductive film piece 111 is to be caused to emit light, a voltage is applied to only the first transparent conductive film piece 111.

The electrons emitted from the electron-emitting portion 67*a* of the emitter electrode 67 upon this operation are attracted to the first transparent conductive film piece 111. As a result, the phosphor (R) formed on the first transparent conductive film piece 111 can be caused to emit light.

If voltages are applied to both the first and second transparent conductive film pieces 111 and 112, the phosphor (R) and the phosphor (G) can be caused to emit light at once.

Figure 46:
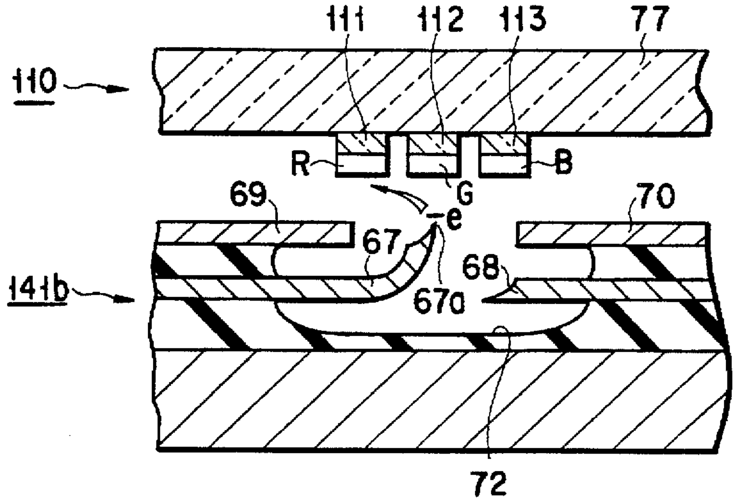
FIG. 46 is a longitudinal sectional view showing a device for emitting electrons according to the twenty-fifth embodiment.

The device of the twenty-fifth embodiment shown in FIG. 46 is a triode having substantially the same arrangement as the twenty-fourth embodiment, but uses the device of the eleventh embodiment as the electron-emitting source 75'.

Even with this arrangement, substantially the same effects as those of the twenty-fourth embodiment can be obtained. In addition, an electron-emitting portion 67*a* of this embodiment is bent upward, and the gap between first and second gates 69 and 70 can be reduced. For this reason, the electron emission efficiency can be improved. Therefore, a triode operated on a lower operating voltage can be obtained.

The twenty-sixth and twenty-seventh embodiments will be described next with reference to FIGS. 47A, 47B, 48A, and 48B.

Figure 47A:
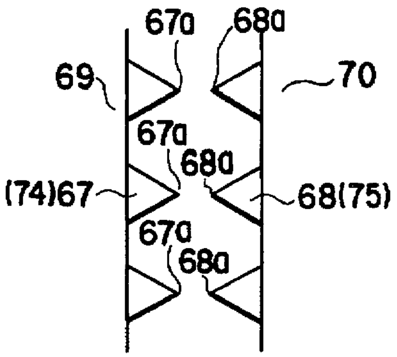
FIG. 47A is a plan view showing a device for emitting electrons according to the twenty-sixth embodiment.
Figure 48A:
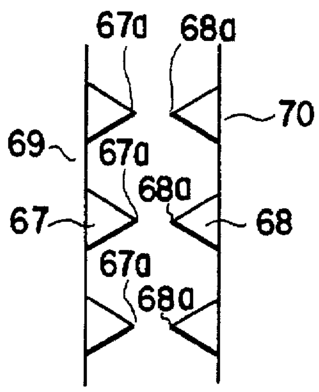
FIG. 48A is a plan view showing a device for emitting electrons according to the twenty-seventh embodiment.

In each of the eleventh to twenty-fifth embodiments, as shown in FIG. 21A, the electron-emitting portions 67*a* and 68*a* of the first and second emitter electrodes 67 and 68 are formed to be alternately shifted from each other. In each of these embodiments, as shown in FIGS. 47A and 48A, electron-emitting portions 67*a* and 68*a* of first and second emitter electrodes 67 and 68 are formed to oppose each other.

Figure 47B:
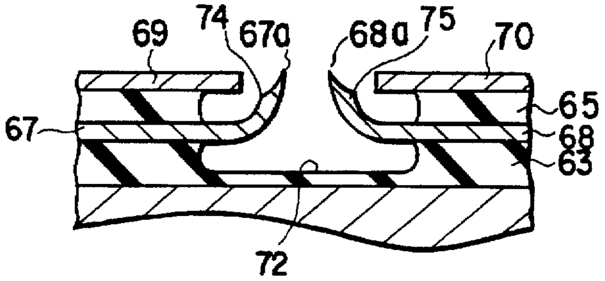
FIG. 47B is a longitudinal sectional view showing the device of the twenty-sixth embodiment.

The edge portions 74 and 75 of the first and second emitter electrodes 67 and 68 of the device of the twenty-sixth embodiment shown in FIG. 47B have electron-emitting portions 67*a* and 68*a* cut, from above, in the form of an arch. In addition, the edge portions 74 and 75 (electron-emitting portions 67*a* and 68*a*) are bent upward.

This device for emitting electrons also has first and second gate electrodes 69 and 70 stacked on the first and second emitter electrodes 67 and 68 via a second insulating film 65 and having edges formed to be parallel to each other.

Even with this arrangement, when electric fields are applied from the edges of the first and second gate electrodes 69 and 70, the electron-emitting portions 67*a* and 68*a* of the first and second emitter electrodes 67 and 68 can emit electrons upward.

In the twenty-sixth embodiment, although the number of electrons emitted from each of the electron-emitting portions 67*a* and 68*a* is smaller than that in the eleventh embodiment, electrons can be emitted from the first and second emitter electrodes 67 and 68 at substantially the same position.

Figure 48B:
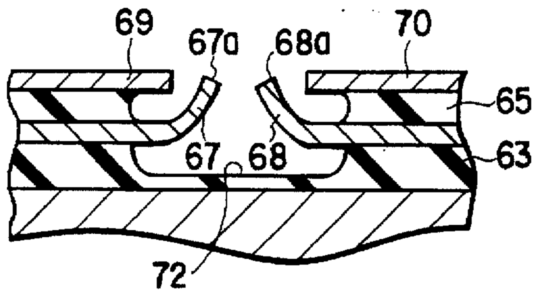
FIG. 48B is a longitudinal sectional view showing the device of the twenty-seventh embodiment.

Unlike in the twenty-sixth embodiment, the electron-emitting portions 67*a* and 68*a* of the first and second emitter electrode 67 and 68 of the twenty-seventh embodiment shown in FIG. 48B are not cut in the form of an arch. Even with this arrangement, since the first and second gate electrodes 69 and 70 can be brought close to the electron-emitting portions 67*a* and 68*a* of the emitter electrodes 67 and 68, electron emission can be efficiently performed.

Note that these devices of the twenty-sixth and twenty-seventh embodiments can be manufactured by using the same manufacturing methods as those of the tenth and eleventh embodiments.

The twenty-eight to thirty-seventh embodiments will be described next.

Figure 49A:
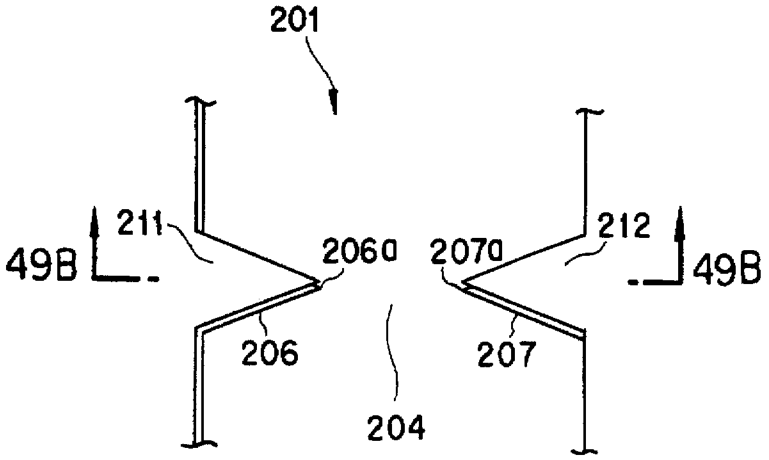
FIG. 49A is a plan view showing a device for emitting electrons according to the twenty-eighth embodiment.
Figure 49B:
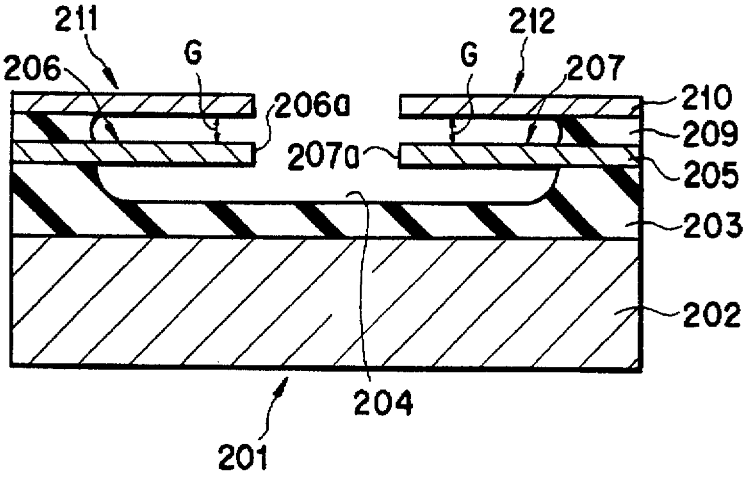
FIG. 49B is a longitudinal sectional view showing the device of the twenty-eighth embodiment.

FIGS. 49A and 49B show a device 201 for emitting electrons according to the twenty-eighth embodiment. The device 201 has a four-layered structure, which is obtained by alternately depositing insulating materials and conductive materials on the upper surface of a substrate 202.

As shown in FIG. 49B, the device 201 has the substrate 202 consisting of Si or the like. A first insulating film 203 for insulating the substrate 202 is formed on the substrate 202. A recess 204 is formed in the first insulating film 203.

First and second emitter electrodes 206 and 207 constituted by a first conductive film 205 are formed on the first insulating film 203 while the edges portions of the emitter electrodes 206 and 207 protrude into the recess 204.

A second insulating film 209 is stacked on the first and second emitter electrodes 206 and 207. First and second gate electrodes 211 and 212 constituted by a second conductive film 210 are stacked on the second insulating film 209 while the edge portions of the gate electrodes 211 and 212 protrude into the recess 204.

Note that a portion of the second insulating film 209 which corresponds to the recess 204 formed in the first conductive film 205 is removed.

As shown in FIG. 49A, the edge portions of the first and second emitter electrodes 206 and 207 and the edge portions of the gate electrodes 211 and 212 are sharpened in the form of a wedge within a plane parallel to the upper surface of the substrate 202 as they protrude.

The tips of the edge portions of the emitter electrodes 206 and 207 serve as electron-emitting portions 206*a* and 207*a* for emitting electrons.

A method of manufacturing the device 201 will be described next with reference to FIGS. 50A to 50D.

The manufacturing process for the device 201 is roughly constituted by film formation, patterning, and etching.

Figure 50A:
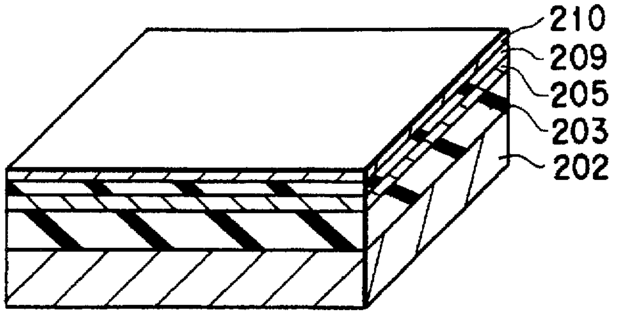
FIGS. 50A to 50D are perspective views showing a method of manufacturing the device of the twenty-eighth embodiment.

As shown in FIG. 50A, the first insulating film 203, the first conductive film 205, the second insulating film 209, and the second conductive film 210 are sequentially formed on the upper flat surface of the substrate 202. These films are formed by using a film formation technique such as sputtering.

Figure 50B:
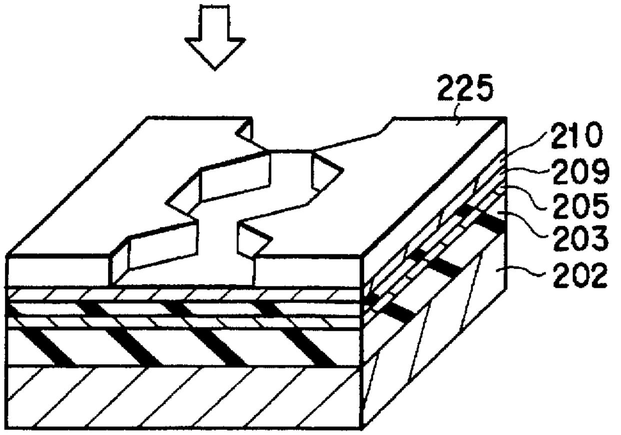
Figure 50C:
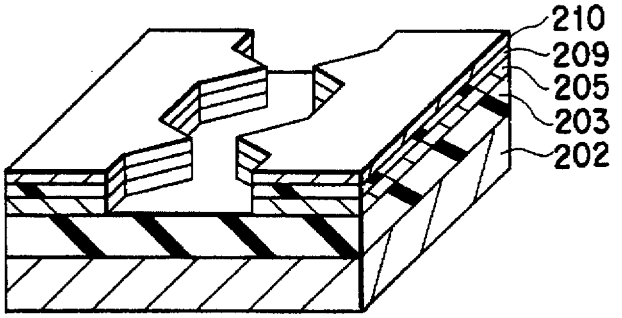

Subsequently, a resist 215 is coated on the second conductive film 210. As shown in FIG. 50B, the resist 215 is patterned (exposed/developed) into the same shape as that shown in FIG. 49A. As shown in FIG. 50C, RIE (reactive ion etching) is performed by using the resist 215 pattern as a mask to process the above films except for the first insulating film 203 into the same shape as that of the resist 215 pattern.

With this process, the first insulating film 203 is divided into the first and second emitter electrodes 206 and 207, and edge portions are formed on the first and second emitter electrodes 206 and 207. In addition, the second conductive film 210 is divided into the first and second gate electrodes 211 and 212, and edge portions are formed on the first and second gate electrodes 211 and 212.

If $SiO_2$ is used as a material for the second insulating film, and WSi is used as a material for the first and second conductive films, $CF_4$ and $O_2$ may be used as RIE gases to perform the above etching.

Figure 50D:
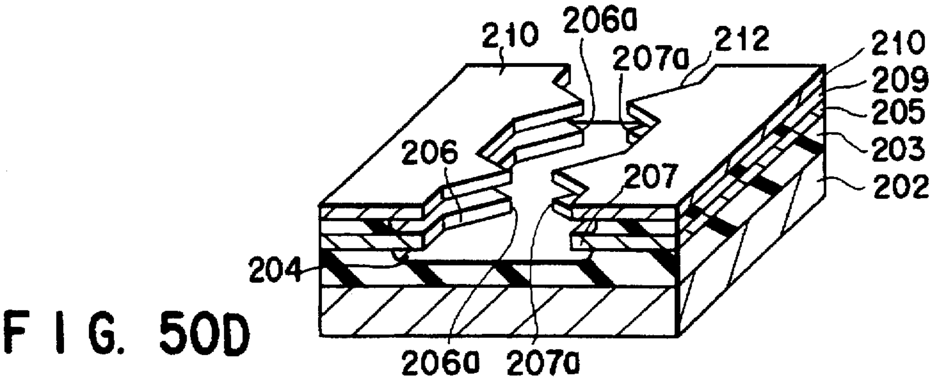

Wet etching is then performed by using, for example, HF to selectively etch only the $SiO_2$ films (first and second insulating films 203 and 209), as shown in FIG. 50D. With this process, the edge portions (electron-emitting portions 206*a* and 207*a*) of the first and second emitter electrodes 206 and 207 and the edge portions of the first and second gate electrodes 211 and 212 are caused to protrude into the recess 204.

With this process, sufficient protruding amounts of the edge portions of the emitter electrodes 206 and 207 and the edge portions of the gate electrodes 211 and 212 can be ensured. This process, therefore, is required to efficiently cause emission currents to flow between the electron-emitting portions of the emitter electrodes 206 and 207 and the edge portions of the gate electrodes 211 and 212.

In the above process, the sharpened electron-emitting portions 206*a* and 207*a* are formed on the tips of the edge portions of the first and second emitter electrodes 206 and 207. After this process, CDE (Chemical Dry Etching) using F radicals may be performed to further sharpen the electron-emitting portions of the first and second emitter electrodes.

The operation of the device 201 will be described next.

In operating this device 201, a potential difference is caused between the first conductive film 205 and the second conductive film 210. As a result, an electric field is applied from the edge portion of the first gate electrode 211 to the electron-emitting portion 206*a* (edge portion) of the first emitter electrode 206. In addition, an electric field is applied from the second gate electrode 212 to the electron-emitting portion 207*a* of the second emitter electrode 207.

With this operation, electrons are emitted from the electron-emitting portion 206*a* of the first emitter electrode 206, and the emitted electrons propagate to the edge portion of the first gate electrode 211.

In addition, electrons are emitted from the electron-emitting portion 207*a* of the second emitter electrode 207, and the emitted electrons propagate to the edge portion of the second gate electrode 212.

As a result, emitter currents flow between the first emitter electrode 206 and the first gate electrode 211 and between the second emitter electrode 207 and the second gate electrode 212.

According to this arrangement, the following effects can be obtained.

In the above device 201, the emitter electrode 206 (207) is spaced apart from the gate electrode 211 (212) via a predetermined gap G (shown in FIG. 49B) in a direction perpendicular to the substrate 202.

The size of the gap G between the electron-emitting portion 206*a* of the emitter electrode 206 and the edge portion of the first gate electrode 211 is determined by the thickness of the second insulating film 209. Since this insulating film 209 is manufactured by a film formation technique instead of a patterning technique, the manufacturing process is easy to perform, and the thickness of the film can be easily reduced and adjusted.

For example, the second insulating film 209 is formed by a thermal oxide film formation technique using a diffusion furnace, a CVD technique, a sputtering technique, or the like. In any technique, the thickness of the film can be easily controlled and can be reduced to, e.g., 100 Å or less depending on a film forming apparatus to be used.

Consequently, the gap between the electron-emitting portion 206*a* (207*a*) of the emitter electrode 206 (207) and the edge portion of the gate electrode 211 (212) can be easily reduced.

Furthermore, in this embodiment, the electron-emitting portions 206*a* and 207*a* of the first and second emitter electrodes 206 and 207 can be further sharpened by CDE using F radicals. That is, the electric field concentration coefficients with respect to the electron-emitting portions 206*a* and 207*a* can be increased in addition to easy reduction of the gap G. Therefore, a larger emission current can be obtained at a lower operating voltage. More specifically, the emission current can be increased to twice that obtained in a conventional device for emitting electrons.

In this embodiment, the edges of the emitter electrodes 206 and 207 are formed into wedge-like portions, when viewed from above, as shown in FIG. 21A. However, the present invention is not limited to this, and various shapes can be employed, as shown in, e.g., FIGS. 51A to 51C.

Figure 51A:
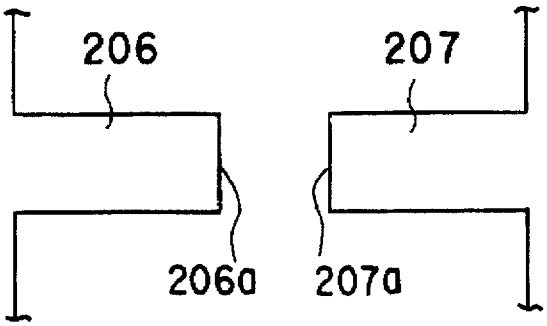
FIGS. 51A to 51C are plan views showing modifications of the twenty-eighth embodiment.
Figure 51B:
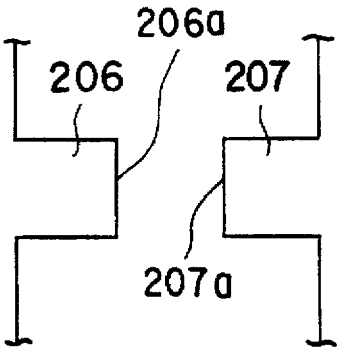
Figure 51C:
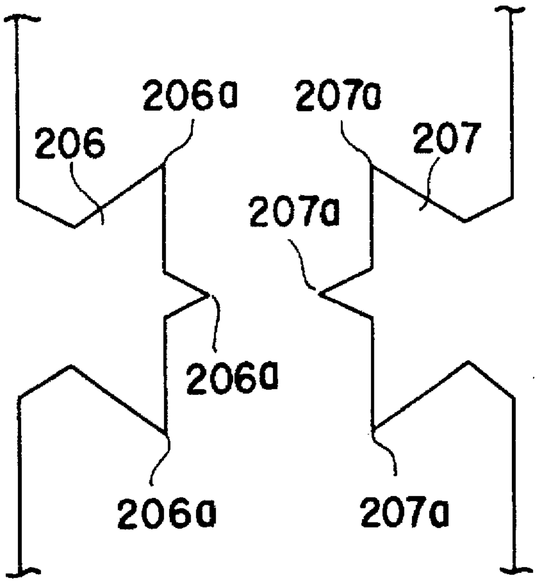

Referring to FIG. 51A, the edge portions (electron-emitting portions 206*a* and 207*a*) of the emitter electrodes 206 and 207 are processed into rectangular portions. Referring to FIG. 51B, the edge portions are processed into square portions. Referring to FIG. 51C, the electron-emitting portions 206*a* and 207*a* of the emitter electrodes 206 and 207 are processed into star-like portions.

That is, the presence of sharp portions allows emission currents to efficiently flow. Especially, if the star-like shape shown in FIG. 51C is employed, since many sharp electron-emitting portions 206*a* and 207*a* are formed, a total current value becomes large.

Figure 52:
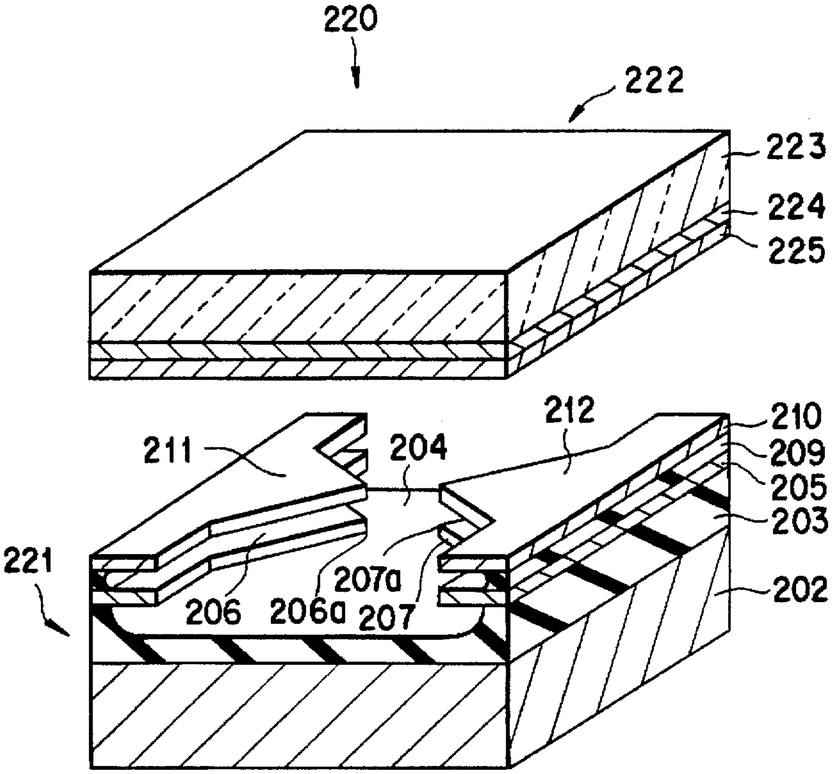
FIG. 52 is a perspective view showing a device for emitting electrons according to the twenty-ninth embodiment.

The twenty-ninth embodiment of the present invention will be described next with reference to FIGS. 52 and 53. The same reference numerals in the twenty-ninth embodiment denote the same parts as in the twenty-eighth embodiment, and a description thereof will be omitted.

A device 220 for emitting electrons according to this embodiment is a triode using the device of the twenty-eighth embodiment as an electron-emitting source 221. This triode has the electron-emitting source 221 and an anode electrode 222 arranged to oppose the electron-emitting source 221.

The anode electrode 222 has a transparent substrate 223 and a conductive thin film 224 stacked on the lower surface of the transparent substrate 223. Quartz glass or the like is used as a material for the transparent substrate 223, and a transparent conductive film material such as ITO is used for the conductive thin film 224.

A phosphor 225 for low-accelerating electron beams is stacked on the conductive thin film 224. As a material for the phosphor 225, ZnO:Zn or the like is used.

The anode electrode 222 is spaced apart from the electron-emitting source 221 by a proper distance. The transparent substrate 223 of the anode electrode 222 is joined to a substrate 202 of the electron-emitting source 221. As a joining method, for example, an electrostatic joining method is employed. Electrostatic joining is performed as follows.

First of all, the transparent substrate 223 is made of, e.g., pyrex containing Na and K, and a metal such as Al is deposited on the periphery of the upper surface (opposite to the surface on which the phosphor 225 is stacked) of the transparent substrate 223. The transparent substrate 223 is then stacked on the substrate 202 of the electron-emitting source 221 at a position (not shown).

When an electric field is applied between the metal deposited on the transparent substrate 223 and the substrate 202, Na and K ions move to produce an electrified depletion layer at the interface between the substrates 223 and 202. As a result, the two substrates 223 and 202 are tightly joined to each other by an electrostatic force.

If this process is performed in a vacuum atmosphere, the vacuum between the two substrates 223 and 202 can be maintained even after the device 220 is taken out under atmospheric pressure. In addition, the vacuum between the substrates 223 and 202 can be maintained in a method of forming evacuation holes in the two substrates 223 and 202 in advance, evacuating the space between the substrates 223 and 202 upon joining thereof, and sealing the space.

Figure 53:
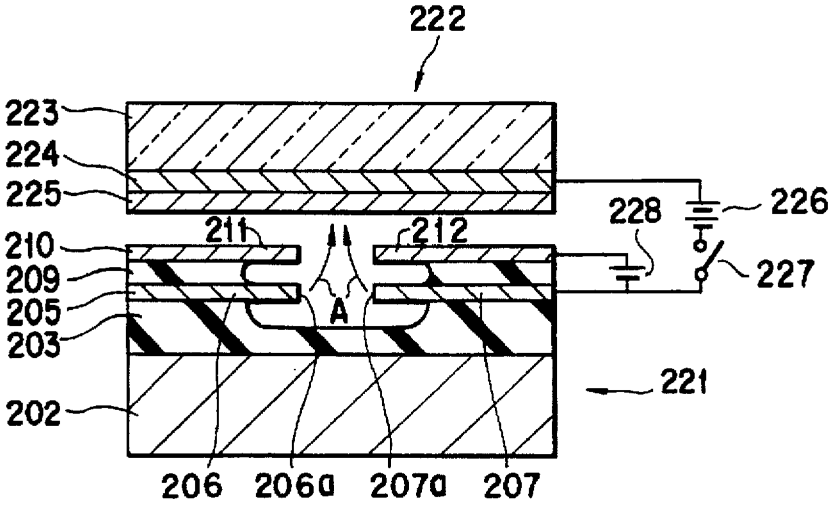
FIG. 53 is a longitudinal sectional view showing the device of the twenty-ninth embodiment.

As shown in FIG. 53, a first conductive film 205 (first and second emitter electrodes 206 and 207), a second conductive film 210 (first and second gate electrodes 211 and 212), and the conductive thin film 224 of the anode electrode 222 are connected to each other via a power supply 226 and a switch 227. Voltages are applied from a power supply 228 to the first conductive film 205 (first and second emitter electrodes 206 and 207) and the second conductive film 210 (first and second gate electrodes 211 and 212).

The operation of this triode will be described next.

When a potential different is given between the first emitter electrode 206 and the first gate electrode 211, electrons are emitted from a electron-emitting portion 206*a* of the emitter electrode 206 to the first gate electrode 211. In addition, electrons are emitted from electron-emitting portion 207*a* of the second emitter electrode 207 to the second gate electrode 212.

Meanwhile, a higher voltage is applied between the first and second emitter electrodes 206 and 207 and the anode electrode 222. As a result, the electrons propagating toward the first and second gate electrodes 211 and 212 are attracted to the anode electrode 222, as shown in FIG. 53. These electrons are bombarded against the phosphor 225 immediately before they reach the conductive thin film 224 of the anode electrode 222, thereby causing the phosphor 225 to emit light.

If a large number of such triodes, each serving as a pixel, are arranged, a flat display apparatus can be obtained. In a flat display apparatus of this type, even if electron-emitting sources 221, each constituting a pixel, are brought close to each other, no current flows between the adjacent electron-emitting sources 221 as long as the distance therebetween is larger, even slightly, than the gap G between the emitter electrode 206 (207) and the gate electrode 211 (212).

For this reason, even if the pixels are arranged at small intervals, and a plurality of wiring patterns are formed on the transparent substrate 223 and substrate 202 on the other side to be perpendicular to each other, no problems such as crosstalk are posed. Therefore, a simply matrix scheme can be easily employed as a driving scheme.

In this embodiment, since the two substrates 223 and 202 are joined to each other by electrostatic joining, a vacuum in the device for emitting electrons can be easily maintained.

Figure 54:
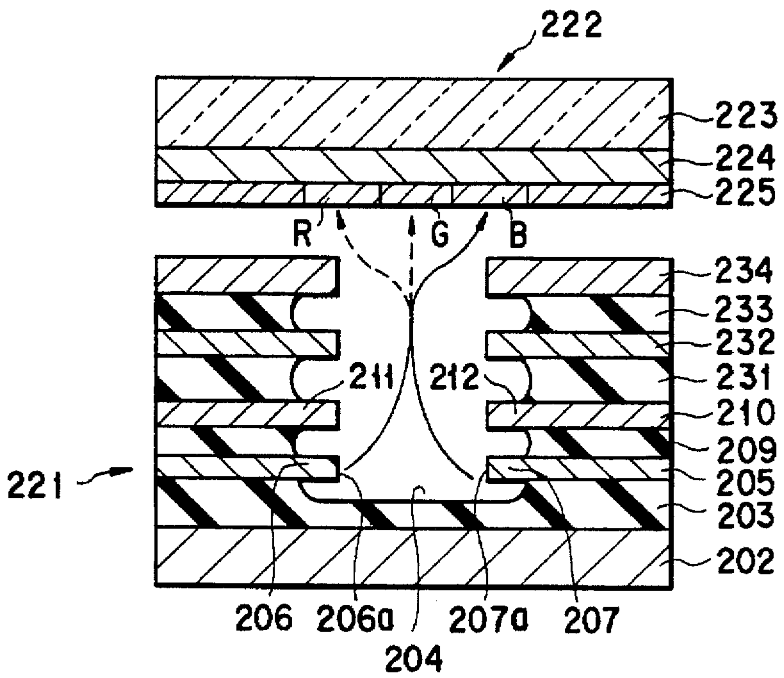
FIG. 54 is a longitudinal sectional view showing a device for emitting electrons according to the thirtieth embodiment.

The thirtieth embodiment of the present invention will be described next with reference to FIG. 54. The same reference numerals in this embodiment denote the same parts as in each embodiment described above, and a description thereof will be omitted.

In this embodiment, as an electron-emitting source 230, a device having nine-layered structure is employed. More specifically, this device is obtained by sequentially forming a third insulating film 231, an accelerating electrode 232, a fourth insulating film 233, and deflecting electrode 234 on first and second emitter electrodes 206 and 207 and first and second gate electrodes 211 and 212.

Note that the accelerating electrode 232 and the deflecting electrode 234 are arranged to oppose each other via a recess 204 while the edges of the electrodes protrude into the recess 204 by a predetermined length.

In this device for emitting electrons, the accelerating electrode 232 serves to supply proper energy (magnetic field) to electrons emitted from the electron-emitting portions 206*a* and 207*a* (edge portions) of the first and second emitter electrode 206 and 207 so as to excite a phosphor 225 of an anode electrode 222. The deflecting electrode 234 can deflect this group of electrons in an arbitrary direction. If, for example, the phosphor 225 is patterned into R (red), G (green), and B (blue) regions, one of the three color regions can be selectively caused to emit light (the B region in FIG. 54).

The thirty-first embodiment of the present invention will be described next with reference to FIG. 55. The same reference numerals in this embodiment denote the same parts as in the thirtieth embodiment, and a description thereof will be omitted.

A device for emitting electrons according to this embodiment has a variable convergence electrode 236 added to an electron-emitting source to constitute a hexode.

Figure 55:
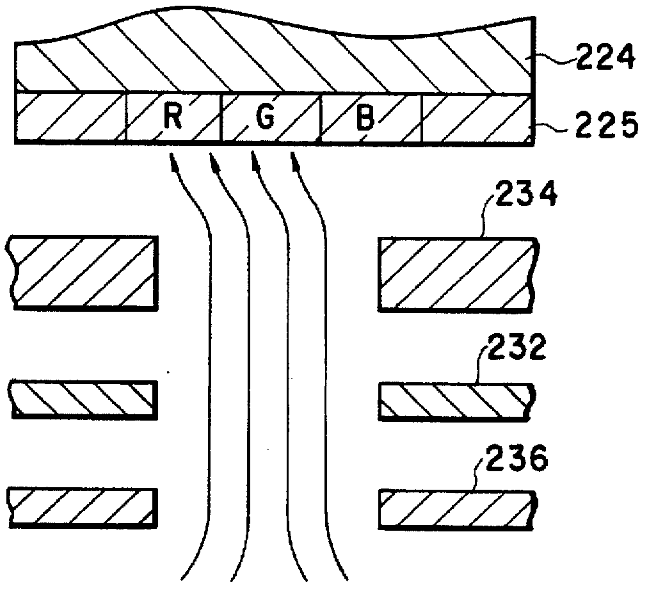
FIG. 55 is a longitudinal sectional view showing a device for emitting electrons according to the thirty-first embodiment.

The variable convergence electrode 236 applies an electric field to a group of electrons to control the degree of convergence of the group of electrons, as indicated by the arrows in FIG. 55. With changes in the polarity or intensity of an electric field, the group of electrons converge and diverge. In this device for emitting electrons, for example, three color regions may be simultaneously cased to emit light or two of the three regions may be selectively caused to emit light, thereby allowing multicolor display.

In addition, since each electrode is formed by a film formation technique such as sputtering, a low-profile device can be easily obtained by film-thickness control.

The thirty-second embodiment of the present invention will be described next with reference to FIG. 56.

The various devices for emitting electrons, which have been described so far, are of a transmission type. However, reflection type devices for emitting electrons can also be manufactured by manufacturing processes similar to those for the transmission type devices. Most of the structures of these devices for emitting electrons are the same as those of the transmission type devices. For this reason, the same reference numerals in this embodiment denote the same parts as in the previous embodiments, and a description thereof will be omitted.

In this device for emitting electrons, a material having high transparency, e.g., quartz glass, is used for a substrate 237 on the electron-emitting source 221 side, and an opaque material such as Si is used for a substrate 238 on the anode electrode 222 side. In addition, an opaque material having high reflectivity, e.g., Au, is used for a conductive film 239 deposed on the Si substrate 238.

Figure 56:
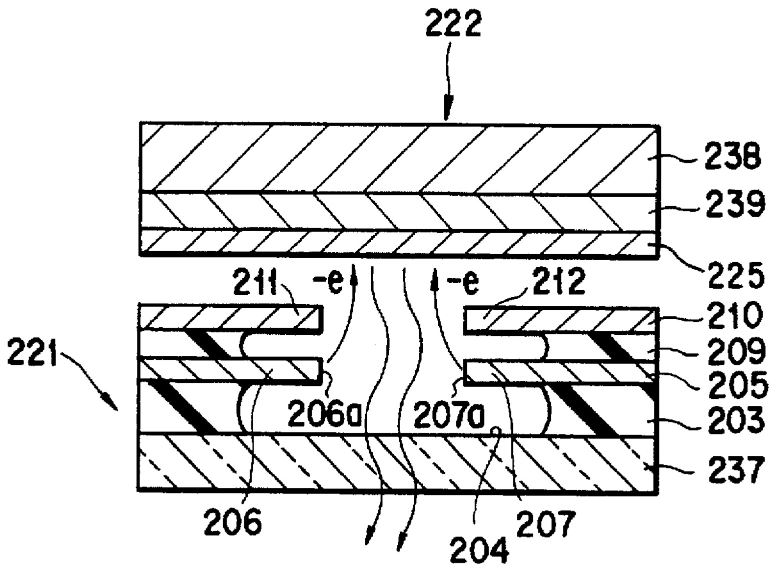
FIG. 56 is a longitudinal sectional view showing a device for emitting electrons according to the thirty-second embodiment.

Light emitted from a phosphor 225 which has received electrons from electron-emitting portions 206*a* and 207*a* (edge portions) of first and second emitter electrodes 206 and 207 directly propagates toward a transparent substrate 236 on the electron-emitting source 221 side, or is reflected by the conductive film 239 of the anode electrode 222 to propagate to the substrate 236, as indicated by the wavy lines in FIG. 56. The light emitted from the phosphor 225 is transmitted through the transparent substrate 236 and guided in one direction.

If a transparent material such as ITO is used for the emitter electrodes 206 and 207 and the gate electrodes 211 and 212, a reduction in the amount of light can be suppressed.

According to such a device for emitting electrons, high brightness can be obtained because diffused reflection is suppressed as compared with a transmission type device for emitting electrons. If a transparent insulating material is used for the substrate 236 and a first insulating film 203 in the electron-emitting source 221, the substrate 236 and the first insulating film 202 can be integrated.

In a flat display using a reflection type device for emitting electrons, the delay time between transmitted light and reflected light can be reduced.

The thirty-third embodiment of the present invention will be described next with reference to FIG. 57.

Figure 57:
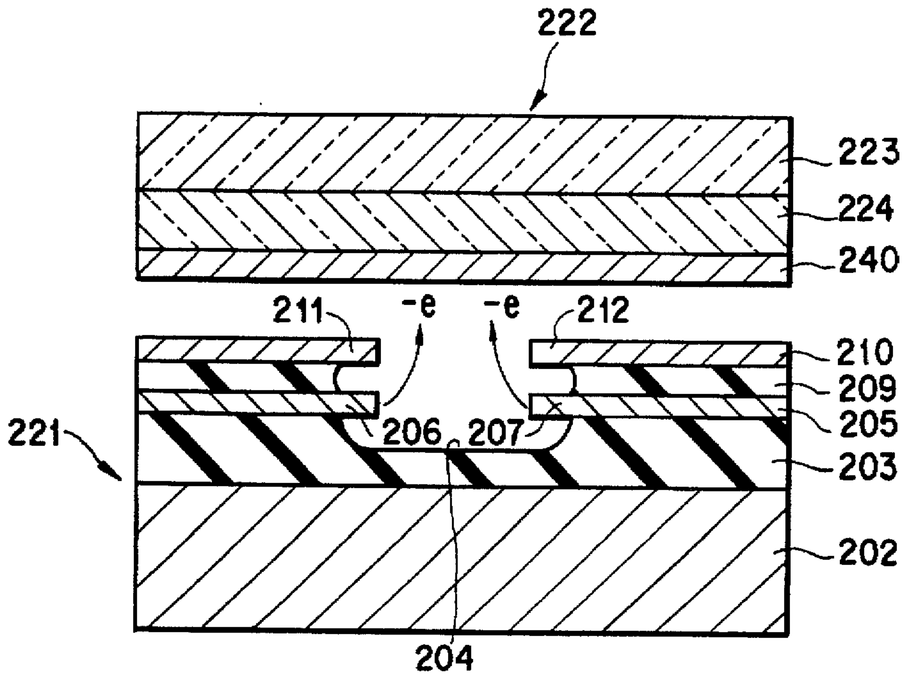
FIG. 57 is a longitudinal sectional view showing a device for emitting electrons according to the thirty-third embodiment.

As shown in FIG. 57, a device for emitting electrons according to the thirty-third embodiment is a triode having substantially the same arrangement as that of the device of the twenty-ninth embodiment. In this embodiment, however, an organic-electroluminescent thin film is used as a phosphor 240. When holes and electrons are supplied into the organic electroluminescent thin film 240, excitons are generated. When the excitons are restored to the ground level, light is emitted.

That is, in this device for emitting electrons, electric fields are applied to electron-emitting portion 206*a* and 207*a* of emitter electrodes 206 and 207 to cause the electron-emitting portions 206*a* and 207*a* to emit electrons, and the electrons are attracted toward an anode electrode 222 to be supplied to the organic electroluminescent thin film 240. As high electric fields are applied between the emitter electrodes 206 and 207 and the anode electrode 222, holes are supplied into the organic electroluminescent thin film 240.

In this case, if an organic electroluminescent thin film 240 having a hole transportation property, e.g., an 8-quinolinol Al complex ($Alq_3$) obtained by adding a coumarin derivative to an aluminum quinolinol complex, is selected, the luminous efficacy can be further improved.

The organic electroluminescent thin film 240 includes various thin films having colors required for color display, such as red, blue, and green. For example, a perinone derivative for red, TPD (triphenylamine derivative) for blue, and the like are available. In addition, as a material for green, 1,2-phthaloperinone is available.

If many devices, each having the same arrangement as that described above and serving as a pixel, are arranged, and organic electroluminescent thin films 240 having red, blue, and green are patterned in units of pixels, a flat display apparatus (flat color display apparatus) capable of performing color display can be obtained.

Although the organic electroluminescent thin film 240 is used in this embodiment, a flat color display apparatus can also be obtained by using an inorganic electroluminescent thin film. Although an inorganic electroluminescent film is longer in service life than the organic electroluminescent thin film 240, the luminous efficacy of the inorganic electroluminescent thin film is low, and the number of colors of light emission is small.

Additional advantages and modifications will readily occur to those skilled in the art. Therefore, the invention in its broader aspects is not limited to the specific details, representative devices, and illustrated examples shown and described herein. Accordingly, various modifications may be made without departing from the spirit or scope of the general inventive concept as defined by the appended claims and their equivalents.

What is claimed is:

1. A compact display device, comprising:

a transparent substrate;

at least one transparent anode electrode carried on a surface of said transparent substrate;

a phosphor layer on at least a portion of said at least one transparent anode electrode forming a light generation region;

an insulating structure overlying at least a portion of said surface of said transparent substrate;

at least one emitter electrode having a fixed end supported by said insulating structure and insulated from other conductive elements thereby and an opposite free end having an electron emitting projection which is greatly reduced in size as compared to the size of said fixed end; and at least one gate electrode having a fixed end supported by said insulating structure and insulated from other conductive elements thereby and an opposite free end located near said electron emitting projection and closely adjacent to said light generating region to establish an electric field to facilitate electron emissions by said electron emitting projection.

2. A compact display device as claimed in claim 1, further comprising:

power supply; and wherein said power supply is connected to each of said electrodes so as to provide relative potential differences therebetween to cause the formation of said electric field by the opposite free end of said at least one gate electrode that facilitates electrons being emitted by said electron emitting projection and an attraction of said emitted electrons by the transparent anode electrode so that the said light generating region is bombarded by attracted electrons.

3. A compact display device as claimed in claim 1, wherein said electron emitting projection is provided with at least one thin edge to further facilitate electrons being emitted from the at least one thin edge.

4. A compact display device as claimed in claim 3, wherein said at least one thin edge is an edge formed by a cylindrical concave surface in the opposite free end of the at least one emitter electrode.

5. A compact display device as claimed in claim 4, wherein said cylindrical concave surface is formed symmetrically in said opposite free end of said at least one emitter electrode.

6. A compact display device as claimed in claim 1, wherein said at least one emitter electrode is bent to bring said electron emitting projection thereof into a close relationship to said opposite free end of said at least one gate electrode.

7. A compact display device as claimed in claim 1, wherein at least two gate electrodes are provided with the electric field establishing opposite free ends thereof lying in the same plane and being opposed to each other with a gap therebetween lying in close proximity to said light generating region.

8. A compact display device as claimed in claim 5, wherein at least two gate electrodes are provided with the electric field establishing opposite free ends thereof lying in the same plane and being opposed to each other with the gap therebetween lying in close proximity to said light generating region.

9. A compact display device as claimed in claim 8, wherein said at least one emitter electrode is bent to bring said electron emitting projection thereof into a close relationship to said gap.

10. A compact display device as claimed in claim 7, wherein at least two emitter electrodes are provided with the electron emitting projections thereof being in the same plane and opposed to each other.

11. A compact display device as claimed in claim 10, wherein said two emitter electrodes both have the electron emitting projections thereof formed as at least one thin edge of a cylindrical concave surface formed in each of the opposite face ends of the least two emitter electrodes.

12. A compact display device as claimed in claim 1, wherein a plurality of said emitter electrodes and said gate electrodes are provided in a display array.

13. A compact display device as claimed in claim 12, wherein alternative ones of said emitter electrodes have their electron emitting projections formed as a sharp thin edge of a cylindrical concave surface formed in the opposite free ends of the alternate emitter electrodes.

14. A compact display device as claimed in claim 1, wherein said phosphor layer includes an organic electroluminescent phosphor.

15. A compact display device as claimed in claim 1, wherein said electron emitting projection has two cylindrical concave surface areas that form sidewalls of the electron emitting projection which taper to a narrow thin edge having an arcuate shape bounded by two end points.

16. A compact display device as claimed in claim 15, further comprising:

a power supply; and wherein said power supply is connected to each of said electrodes so as to provide relative potential differences between said electrodes to cause the electrons to be emitted by the narrow thin edge having an accurate shape and attracted toward the phosphor layer by the transparent anode electrodes.

17. A compact display device as claimed in claim 16, wherein said phosphor layer includes an organic electroluminescent phosphor.

18. A compact display device as claimed in claim 4, wherein the cylindrical concave surface is bounded by two end points, one of which projects much further than the other from the at least one emitter electrode in a direction away from that of the fixed end of said at least one emitter electrode to form a sloping thin projecting edge.

19. A compact display device as claimed in claim 18, further comprising:

a power supply, and wherein said power supply is connected to each of said electrodes so as to provide relative potential differences between said electrodes to cause the electrons to be emitted by the thin projecting edge and attracted towards the phosphor layer by the transparent anode electrode.

20. A compact display device as claimed in claim 18, wherein said phosphor layer includes an organic electroluminescent phosphor.

21. A compact display device as claimed in claim 18, wherein a plurality of said emitter electrodes and said gate electrodes are provided in a display array.

22. A compact display device as claimed in claim 15, wherein a first said end point extends much further than the other end point from the at least one emitter electrode in a direction away from that of the fixed end of said at least one emitter electrode to form a sloping structure terminating at said first end point.

23. A compact display device as claimed in claim 22, further comprising:

a power supply;

wherein said power supply is connected to each of said electrodes so as to provide relative potential differences between said electrodes to cause the electrons to be emitted by said sloping structure and attracted towards the phosphor layer by the transparent anode electrode.

24. A compact display device as claimed in claim 22, wherein said phosphor layer includes an organic electroluminescent phosphor.

25. A compact display device as claimed in claim 22, wherein a plurality of said emitter electrodes and said gate electrodes are provided in a display array.

26. A compact display device as claimed in claim 22, wherein the electric field establishing portion of the at least one gate electrode has a thin edge in a plane parallel to the surface of the transparent substrate, said thin edge at least partly surrounding the sloping structure.

27. A compact display device as claimed in claim 26, further comprising:

a power supply; and wherein said power supply is connected to each of said electrodes so as to provide relative potential differences between said electrodes to cause the electrons to be emitted by said sloping structure and attracted towards the phosphor layer by said transparent anode electrode.

28. A compact display device as claimed in claim 26, wherein said phosphor layer includes an organic electroluminescent phosphor.

29. A compact display device as claimed in claim 26, wherein said thin edge in a plane parallel to the surface of the transparent substrate is an extreme thin edge of a sloping cylindrical concave surface in said opposite free end of said at least one gate electrode.

30. A compact display device as claimed in claim 29, further comprising:

a power supply; and wherein said power supply is connected to each of said electrodes so as to provide relative potential differences between said electrodes to cause the formation of an electric field by said extreme thin edge to facilitate electrons being emitted by said sloping structure and attracted towards the phosphor layer by said transparent anode electrode.

31. A compact display device as claimed in claim 29, wherein said phosphor layer includes an organic electroluminescent phosphor.

32. A compact display device as claimed in claim 29, wherein a plurality of said emitter electrodes and said gate electrodes are provided in a display array.

* * * * *